United States Patent [19]
Hasunuma et al.

[11] Patent Number: 6,090,701
[45] Date of Patent: *Jul. 18, 2000

[54] METHOD FOR PRODUCTION OF SEMICONDUCTOR DEVICE

[75] Inventors: Masahiko Hasunuma; Sachiyo Ito, both of Yokohama; Keizo Shimamura, Kawasaki; Hisashi Kaneko, Fujisawa; Nobuo Hayasaka, Yokosuka; Junsei Tsutsumi, Kawasaki; Akihiro Kajita; Junichi Wada, both of Yokohama; Haruo Okano, Chiba-ken, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/521,088

[22] Filed: Jun. 20, 1995

[30] Foreign Application Priority Data

Jun. 21, 1994 [JP] Japan .................................. 6-162801
Mar. 10, 1995 [JP] Japan .................................. 7-079749

[51] Int. Cl.⁷ .............................................. H01L 21/4763
[52] U.S. Cl. ...................... 438/632; 438/633; 438/646; 438/650; 438/687
[58] Field of Search .................................. 437/187, 188, 437/189, 190, 192, 201, 173, 174; 438/632, 646, 650, 627, 686, 687, 626, 629, 633, 631

[56] References Cited

U.S. PATENT DOCUMENTS

| | | |
|---|---|---|
| 4,502,210 | 3/1985 | Okumura et al. . |
| 4,761,345 | 8/1988 | Sato et al. ................................. 428/552 |
| 5,124,780 | 6/1992 | Sandhu et al. ............................ 437/194 |
| 5,250,120 | 10/1993 | Takada et al. ............................ 136/256 |
| 5,529,954 | 6/1996 | Iijima et al. .............................. 437/189 |
| 5,953,634 | 9/1999 | Kajita et al. .............................. 438/687 |

OTHER PUBLICATIONS

Brady, G., et al., Materials Handbook, 1986, McGraw Hill, pp. 661–664.
Davis, J. R., ASM Materials Engineering Dictionary, 1992, ASM International, pp. 358–359.
Hu, C., et al., "D. Fusion Barriers for Studies . . . " Jun. 9–10, 1986, IEEE VMIC Conf. pp. 181–187.
G. A. Dixit, et al.; A Novel High Pressure Low Temperature Aluminum Plug Technology for Sub–0.5 μm Contact/Via Geometries, Tech. Digest IEDM, pp. 105–108 (1994).

*Primary Examiner*—T. N. Quach
*Attorney, Agent, or Firm*—Finnegan, Henderson, Farabow, Garrett & Dunner, L.L.P.

[57] ABSTRACT

A method for the production of a semiconductor device having an electrode line formed in a semiconducting substrate is disclosed which comprises preparing a semiconducting substrate having trenches and/or contact holes formed preparatorily in a region destined to form the electrode line, forming a conductive film formed mainly of at least one member selected from among Cu, Ag, and Au on the surface of the semiconducting substrate, heat-treating the superposed Cu film while supplying at least an oxidizing gas thereto thereby flowing the Cu film to fill the trenches and/or contact holes, and removing by polishing the part of the conductive film which falls outside the region of the electrode line and completing the electrode lines consequently. During the heat treatment, a reducing gas is supplied in addition to the oxidizing gas to induce a local oxidation-reduction reaction and fluidify and/or flow the conductive film and consequently accomplish the embodiment of the conductive film in the trenches.

11 Claims, 21 Drawing Sheets

617n

METHOD FOR PRODUCTION OF SEMICONDUCTOR DEVICE

BACKGROUND OF THE INVENTION

1. Field of the Invention

This invention relates to a method for the production of a semiconductor device having electrode lines formed on a semiconductor substrate and more particularly to a method for the production of a semiconductor device provided with highly reliable interconnections and adapted for a Si semiconductor device or a compound semiconductor device.

2. Description of the Related Art

In recent years, the semiconductor devices such as, for example, integrated circuit devices (integrated circuit elements) represented by logic devices have been showing a conspicuous growth in the degree of integration. In consequence of this growing degree of integration, the lines to be used for electrically connecting active elements in such semiconductor devices are naturally expected to have line width decreased to the fullest possible extent. Since these fine lines are required to have high current density and high operating temperature as well, the practice of endowing the semiconductor devices with exalted reliability by forming these lines with a material of highly endurance against electromigration is in vogue.

While the semiconductor devices of this class are required to attain growth also in operating speed, the RC delay poses a serious problem on the way to the growth of operating speed. For the solution of this problem of the RC delay, it is essential that the passivation films be allowed a decrease in dielectric constant and the line materials be given a decrease in electrical resistance. As line materials which meet these requirements, Al or Al alloys, and Cu and Ag which have lower electric resistance than Al and higher activation energy for diffusion than Al have been known to the art.

As means of fabrication for producing fine electrode lines, generally the reactive ion etching (RIE) method and the ion milling method have been known. The Al lines, for example, is at a disadvantage in entraining the problem of suffering the lithography used in the process of fabrication to induce the phenomenon of exudation due to the reflection of light and the problem of disrupting the uniformity of fabrication owing to the precipitation and the presence of grain boundaries in the RIE process. These problems give rise to such inconveniences as impairing the shape of lines and degrading the reliability of interconnections.

Then, in the case of the Cu interconnections, the fabrication thereof as by the RIE method, for example, cannot be easily implemented because the chloride or fluoride of Cu has low vapor pressure. Specifically, an effort to increase the temperature of the semiconducting substrate as a subject matter of fabrication and increase the vapor pressure of the chloride or fluoride results in promoting the reaction of forming a chloride or fluoride to a point where this reaction affects the interior of the lines. Since no existing resist material is capable of withstanding high temperature, the electrode line still defies this fabrication for a decrease line width.

The method of physical fabrication by ion milling entrains the problem of encountering difficulty in the separation and removal of the masking material after fabrication due to ion damage and the problem of readily inducing a short circuit in the electrode line due to re-adhering of atoms removed by iron milling.

In recent years, for the fabrication of wiring in the process for production of the semiconductor devices mentioned above, the interconnect method resorting to the damascene process has been attracting attention and has been forming a mainstream in the fabrication under discussion. Specifically, the chemical mechanical polishing (CMP) technique has advanced to a point where electrode lines can be formed as required in an embedded pattern. Thus, the practice of forming the electrode lines with Al and Cu as the material is now prevailing. According to this method, an insulating film (interlayer film) is formed on a semiconducting substrate provided with an active region such as, for example, the active region-forming surface of a Si substrate prior to the deposition of metal film and then trenches are preparatorily formed in the region of the insulating film expected to form the electrode lines.

Then, on the surface which has been fabricated to contain the trenches therein, a metal as the material for electrode line is deposited by the ordinary technique of sputtering, collimation sputtering (anisotropic sputtering), or CVD. Thereafter, by a heat treatment, the metal film deposited as described above is caused to flow and fill the trenches and metal film on the space is removed by CMP to complete the formation of electrode lines as required.

In this case, the connections to the active parts or to the electrodes in the lower layers are attained with metallic pieces which are either passed through contact holes formed in the insulating film or embedded in the insulating film during the formation of interconnections. Further, prior to the formation of a metal film for electrode lines, a barrier metal layer is generally formed.

Incidentally, the heat treatment which is intended for flowing the matal film and filling the trenches is carried out (1) subsequently to the formation of the metallic film with the relevant site kept under a high degree of vacuum, (2) under a degree of vacuum below the equilibrium dissociation pressure of an oxide where the site of formation of a Cu or Al film has been exposed once to the atmospheric exposure after the film deposition or in a stream of hydrogen gas after the chamber for the heat-treatment has been evacuated to a high degree of vacuum, or (3) in a forming gas (mixed gas of $N_2$ and $H_2$ generally having a $H_2$ concentration in the range of from 10 to 20%) of high purity where the heat treatment is to be carried out under an atmospheric pressure.

In any case, the heat treatment is carried out in an atmosphere deprived of an oxidizing gas to the fullest possible extent or in an atmosphere of reducing gas.

The heat treatment for the flow is confronted by two problems.

Firstly, as shown schematically in FIG. 25A, generally a metal film is deposited in a thickness amount 1.5 to 2.0 times the depth of trenches 1 for the purpose of increasing the initial amount of accumulation in the trenches 1, for example. buring the process of a heat treatment for flow, therefore, the surfaces of the opposed portions of the deposited film (metal film) 3b on the wall defiing a space 2a of the trench 1 contact each other and produce a bridge 3a and, as schematically shown in FIG. 25B, give rise to a void 4 within the trench 1, with the result that the void 4 will persist and obstruct the flow. In the diagram, 2 and 5 each stand for an insulating film made of such a substance as $SiO_2$ or SiN, for example.

To be more specific about this point, when the metal intended for the interconnect is deposited by a physical vapor deposition, such as sputtering or vapor deposition, since the directions in which the hurled particles impinge on a substrate constitute a cosine distribution, the accumulation of deposited particles on the space 2a between the adjacent trenches 1 grows in the directions of the trenches 1 with the obliquely impinging particles and induce the occurrence of a overhung portion 3b which will obstruct the accumulation of particles inside the trench 1. When the heat treatment is carried out in the presence of the overhung portion 3b which has grown as described above, the adjacent overhung portions 3b are suffered to contact each other in consequence of thermal expansion and the portions of this contact continuously grow (necking) to induce formation of a bridge 3a between the opposed walls of the space 2a. In consequence of the advance of the linkage between the opposed walls of the spaces 2a, the initial empty space remains beneath the region. Since this void 4 cannot be filled by an ordinary heat treatment, the interconnection which is subsequently formed by the CMP is destined to suffer voids to remain therein.

Secondly, even when the bridge 3a mentioned above is not suffered to occur as schematically shown in FIG. 26A, the problem arises that the accumulation in the trench 1 while undergoing the heat treatment for flow is lifted up onto the space 2a between the adjacent trenches 1 and suffered to leave a void 4 behind within the trench 1 as schematically shown in FIG. 26B, with the result that the produced interconnection will suffer from degraded reliability or even sustain disconnection. To be more specific, in this case, the heat treatment causes the metal once accumulated in the trench 1 to move gradually owing to the surface diffusion which originates in the difference in the radius of curvature of surface as shown schematically in FIG. 26A. Since the accumulated film 3 is still in an energetically metastable state at this stage, however, the movement of the accumulated film 3 is further advanced with the decrease in the surface energy and the interfacial energy as the driving force. The direction in which the accumulated film 3 moves in this case is determined by the relation between the amount of accumulation on the space 2a and the amount of accumulation in the trench 1. On the assumption that the particles involved in the accumulation are simple spheres, the reaction proceeds in reverse proportion to the fourth to the third power of the particle diameter. In other words, the movement of the metal film proceeds in the direction from the side of a small amount of accumulation to the side of a large amount of accumulation as schematically shown in FIG. 26B. Further, when the metal is deposited by an ordinary sputtering technique, the possibility arises in an extreme case even before the heat treatment for flow that accumulated films will be bridged between adjacent spaces 2a and void 4 will be formed in the trench 1.

FIGS. 27A, 27B, and 27C schematically show the state in which Cu as the metal for interconnection is embedded in the trench 1 when the Cu is deposited by the conventional heat sputtering technique. Generally, the sputtering of the metal is carried out in the ambience of an inert gas such as Ar gas for the purpose of preventing the magnitude of the resistance of the produced interconnections from being increased by the oxidation of the metal. In the sputtering which is performed on a Si substrate containing the trench 1, the speed of accumulation of the metal is lower inside the trench than on the flat part of the surface. This is because the range of angle permitting incidence of sputtered particles (angle of anticipation) is small in the bottom part of the trench 1 as compared with the flat part of the surface because of the difference in height.

When the formation of the metal film is carried out in this case by the sputtering technique on the Si substrate which is kept in a heated state, the metal during the initial stage of the film formation undergoes aggregation in the form of islands so as to decrease the surface energy as shown in FIG. 27A. The aggregation mentioned above is liable to occur conspicuously on the inner wall of the trench 1 particularly because of a low deposition rate. When the aggregation occurs on the lateral wall part in the trench 1, the islands of metal formed in the opening part of the trench 1 are exclusively allowed to grow preferentially as shown in FIG. 27B because these islands of metal in the opening part decrease the angle of anticipation and obstruct the advance of sputtered particles into the trench 1. As a result, the islands of metal which have preferentially grown from the opposed lateral walls of the opening part come into tight contact with each other and the voids 4 are suffered to persist inside the trench 1 and consequently the trench 1 is no longer enabled to be filled with the deposited film 3 as shown in FIG. 27C.

When the film is formed by the ordinary physical deposition as described above, the two problems mentioned above cannot be solved because the accumulated film on the space 2a has a large thickness as compared with that on the inside of the trench 1 owing to the presence of the overhung parts 3b of the accumulated film on the space 2a. Though the anisotropic film deposition is one method available for increasing the amount of accumulation of film on the inside of the trench 1, it is at a disadvantage in not only attaining the formation of a film only with inferior efficiency but also encountering obstruction in effecting the movement of the accumulated metal from above the space 2a into the trench 1 because the film on the lateral wall of the trench is so thin as to sustain agglomeration and consequent disconnection when subjected to a heat treatment.

Then, in the formation of a buried line by the use of the CMP technique mentioned above, the trenches ought to be accurately formed in conformity with the pattern of the lines. In the photoetching process, therefore, it is necessary that the exposure of the resist to light be prevented from being disturbed by the random reflection of light from the material of the lower layer. In order to preclude the random reflection mentioned above, a TiN layer having low reflectance is formed as an antireflection film prior to the formation of the metal film for electrode line. Further, this TiN layer is concurrently used as a diffusion barrier for such an interconnection metal as Cu which is liable to diffuse in an insulating material. Incidentally, since the compound TiN is a conductor, the unnecessary part of TiN must be removed after the wiring of Cu, for example, has been formed. This removal cannot be readily attained by etching with an acidic solution because the Cu as the interconnection metal has poor resistance to acids. Thus, the removal of the unnecessary part of TiN ought to be effected concurrently by the CMP technique mentioned above.

In the formation of a wiring by the damascene process mentioned above, the removal of the unnecessary part of the metallic film to be effected by polishing at the CMP step ought to proceed so that the material of the lower layer will not be excessively polished. Since the TiN film is so hard, the lower layer ought to be formed of an insulating material having a lower polishing speed than the TiN film in order that the removal may be attained without entraining any excessive polishing of the material of the lower layer. The selection of this material poses numerous difficulties and entails an increase in the number of steps of the process.

To cope with these problems, the feasibility of using a C (carbon) film which has a lower reflectance and a lower polishing speed than the TiN film is now being studied. This is because the C film, when used as an antireflection film, not only represses the degradation of the accuracy of a resist pattern due to the random reflection of light but also fulfills the function of a film for stopping the work of polishing from advancing into the TiN film. Though the C film thus used indeed realizes the removal of the TiN film while avoiding excessive polishing of the material of the lower layer, it must be eventually removed. This removal of the C film can be attained in an oxygen plasma, for example. On exposure to the oxygen plasma, however, the Cu line tends to be oxidized in consequence of the elevation of the temperature of the substrate and then caused to sustain deformation and gain in the magnitude of electrical resistance.

The method for forming an electrode line by the use of the CMP technique mentioned above has been attracting the attention of many scientists engaging in the manufacture of semiconductor devices. It nevertheless has some problems standing on the way to the reduction to practice. In the formation of an electrode line using Cu as the raw material, for example, there arises the problem that the Cu, in the process of heat treatment for flow, will possibly pass through an underlying insulating film, reach a Si substrate, for example, and cause deterioration of semiconductor characteristics. To avoid this problem, the method of utilizing a barrier metal or an interlayer film for preventing the Cu from being diffused in the Si substrate has been adopted. Since no fully satisfactory barrier in this respect exists at present, this method is fated to impose a restriction on the temperature of flowing and fail to acquire a fully sufficient flowing temperature. Particularly when a metallic film which has been formed by an ordinary sputtering technique requires flowing, the aforementioned deterioration of the semiconductor characteristics owing to the diffusion of the metal for an electrode line constitutes a serious problem because the metal film must be heat-treated in a high degree of vacuum at 750° C. for not less than 10 minutes.

As one measure of relief, the feasibility of the collimation sputtering which is capable of exalting the efficiency of the embedment of sputtered particles in the trenches during the stage of film formation by utilizing the straightly advancing part of sputtered particles and eliminating the part of sputtered particles advancing at a large angle of impingement relative to the semiconducting substrate has been tried. This method of collimation sputtering, however, is not fully satisfactory in terms of productivity or mass-producibility because it consists in utilizing the straightly advancing part of sputtered particles and consequently suffers from decisively low efficiency of film formation as compared with the film formation by the ordinary sputtering technique.

As another method for the formation of an electrode line, the means of embedding the metal for the electrode line in the trench by the selective CVD (chemical vapor deposition) is available. This method, however, is at a disadvantage in being expensive in addition to encountering technical problems yet to be solved.

SUMMARY OF THE INVENTION

This invention, produced for the purpose of coping with the state of described above, has for an object thereof the provision of a method for the production of a semiconductor device which comprises causing a conductive film formed by an ordinary method of film formation to flow at a relatively low temperature and enabling the molten metal to be embedded thoroughly in a trench constituting a region for the formation of electrode lines and contact holes thereby permitting easy formation of an electrode lines without entailing deterioration of semiconductor characteristics.

Another object of this invention is to provide a method for the production of a semiconductor device which, in the formation of a wiring by causing a conductive film to flow and enabling the metal to be embedded in a trench constituting a region for the formation of electrode lines and contact holes, allows formation of an embedded line having high density of texture and high reliability of performance.

Still another object of this invention is to provide a method for the production of a semiconductor device which allows formation of an embedded line having high density of texture and high reliability of performance in a trench of a high aspect ratio constituting a region for the formation of an electrode line and contact holes.

The first aspect of this invention concerns a method for manufacturing a semiconductor device having an electrode line formed on a semiconducting substrate, characterized by the steps of forming at least either of a trench and a contact hole in a region destined to form the electrode line on the semiconducting substrate, forming a conductive film consisting mainly of at least one member selected from among Cu, Ag, and Au on the semiconducting substrate having at least either of the trench and the contact hole formed thereon, heat-treating the conductive film and supplying at least an oxidizing gas thereto thereby causing the conductive film to flow and fill the trench and/or the contact hole, and removing by polishing the part of the conductive film falling outside the regions destined to form the electrode line thereby completing the electrode line.

In the method according to the first aspect of this invention, the method is further characterized in that the oxidizing gas is supplied with a reducing gas in the process of the heat treatment for flowing the conductive film. This method is one of features in the method of the present invention.

The method according to the first aspect of this invention is further characterized in that the partial pressure of the oxidizing gas is smaller than the equilibrium partial pressure for oxidation of the conductive film in the process of the heat treatment. This method is further characterized in that the partial pressure of the oxidizing gas is in the range of from $1\times10^{-7}$ to $5\times10^{-5}$ Torr.

More specifically, in the method according to the first aspect of this invention, it is effective that a first conductive film of a substance whose oxide manifests electrical conductivity is formed as an undercoating layer of the conductive film consisting mainly of at least one member selected form among Cu, Ag and Au.

In the above method, the first conductive film is preferably formed through the medium of a barrier layer on the substrate. As the substance forming the first conductive film, a metal whose amount of change in the Gibbs free energy in the oxidation reaction by oxidation gas has a negative magnitude and whose absolute value is greater than the absolute value of the amount of change in the Gibbs free energy in the oxidation reaction of the barrier layer is selected. Concretely, the metal is at least one selected from the group consisting of Nd, Ti, Nb, La, Sm, Re, V, Ru, Rh, Os, Ir and Pt. Particularly, Nd, La or Sm is desirable, because the absolute value of the change in the Gibbs free energy in the oxidation reaction thereof is greater than that of the change in the Gibbs free energy in the oxidation reaction of TiN which is typically used as a barrier layer, thereby the oxidation of the barrier layer being significantly repressed.

The second aspect of this invention concerns a method for the production of a semiconductor device having an electrode line formed on a semiconducting substrate, characterized by the steps of forming at least either of a trench and a contact hole in a region destined to form the electrode line on the semiconducting substrate, forming the electrode line on the semiconducting substrate having at least either of the trench and the contact hole formed thereon, imparting uniaxial stress to the conductive film from above the surface of the semiconducting substrate possessing the conductive film, heat-treating the conductive film to flow and fill the trench and/or the contact holes, and removing by polishing the part of the conductive film falling outside the region destined to form the electrode line thereby completing the electrode line.

The third aspect of this invention concerns a method for the production of a semiconductor device having an electrode line formed on a semiconducting substrate, characterized by the steps of forming at least either of a trench and a contact hole in a region destined to form the electrode line on the semiconducting substrate, superposing a conductive film consisting mainly of Cu and a conductive film consisting mainly of Ag on the semiconducting substrate having at least either of the trench and the contact hole formed thereon, heat-treating the conductive film thereby causing the conductive film to flow and fill the trench and/or the contact hole, and removing by polishing the part of the superposed conductive film falling outside the region destined to form the electrode line thereby completing the electrode line.

The fourth aspect of this invention concerns a method for the production of a semiconductor device having an electrode line formed on a semiconducting substrate, characterized by the steps of forming at least either of trench and a contact hole in a region destined to form the electrode line on the semiconducting substrate, forming the conductive film on the semiconducting substrate having at least either of the trench and the contact hole formed thereon, removing part of the conductive film positioned in the proximity of the trench and/or the contact hole from the surface of the film, heat-treating the remaining conductive film thereby causing the conductive film to flow and fill the trench and/or the contact hole, and removing by polishing the part of the conductive film falling outside the regions destined to form the electrode line thereby completing the electrode line.

The method according to the fourth aspect of this invention is further characterized in that the heat treatment is carried out while an oxidizing gas and a reducing gas are supplied to the site of said heat treatment in the process of heat treating.

The fifth aspect of this invention concerns a method for the production of a semiconductor device having an electrode line formed on a semiconducting substrate, characterized by the steps of forming at least either of a trench and a contact hole in a region destined to form the electrode line on the semiconducting substrate, heating the semiconducting substrate having at least either of the trench and the contact hole formed thereon and supplying at least an oxidizing gas and, at the same time, causing at least one member selected from the group consisting of Cu, Ag, and Au to flow into the trench and/or the contact hole thereby forming a conductive film consisting mainly of at least one member selected from the group consisting of Cu, Ag, and Au, and removing by polishing the part of the conductive film falling outside the region destined to form the electrode line thereby completing the electrode line.

The method according to the fifth aspect of this invention is further characterized in that an oxidizing gas and a reducing gas are supplied at the step of film formation (deposition) under heating.

The method according to the fifth aspect of this invention is furthermore characterized in that the amounts of the reducing gas and the oxidizing gas to be supplied are so controlled that the partial pressure of the oxidizing gas is greater than the equilibrium between the partial pressure of the oxidizing gas and the partial pressure of the reducing gas on the surface of the semiconducting substrate in the former of the step of film formation and the partial pressure of the reducing gas is greater than the equilibrium between the partial pressure of the oxidizing gas and the partial pressure of the reducing gas on the surface of the semiconducting substrate in the latter of the step of film formation (deposition).

The method according to the fifth aspect of this invention is further characterized in that the partial pressure of the oxidizing gas is smaller than the equilibrium partial pressure for oxidation of the conductive film in the process of heating. This method is further characterized in that the partial pressure of the oxidizing gas is in the range of from $1 \times 10^{-7}$ to $5 \times 10^{-5}$ Torr.

More specifically, in the method according to the fifth aspect of this invention, it is effective that a first conductive film of a substance whose oxide manifests electric conductivity is formed as an undercoating layer of the conductive film consisting mainly of at least one member selected from among Cu, Ag and Au, and the above conductive film is formed (deposited) thereon.

In the above method, the first conductive film is preferably formed (deposited) through the medium of a barrier layer formed (deposited) on the substrate. And, as the substance forming the first conductive film, a metal whose amount of change in the Gibbs free energy in the oxidation reaction by oxidation gas has a negative magnitude and whose absolute value is larger than the absolute value of the amount of change in the Gibbs free energy in the oxidation reaction of the barrier layer is selected, as in the case of the first and second aspects of this invention. Concretely, at least one metal selected from the group consisting of Nd, Ti, Nb, La, Sm, Re, V, Ru, Rh, Os, Ir and Pt is listed as the metal for forming the first conductive film. Particularly, Nd, La or Sm is desirable, because the absolute value of the change in the Gibbs free energy in the oxidation reaction thereof is greater than that of the change in the Gibbs free energy in the oxidation reaction of TiN which is typically used as a barrier layer, thereby the oxidation of the barrier layer being significantly repressed.

The sixth aspect of this invention concerns a method for the production of a semiconductor device having an electrode line formed on a semiconducting substrate, characterized by the steps of forming at least either of a trench and a contact hole in a region destined to form the electrode line on the semiconducting substrate, forming a film selected from the group consisting of a metal film containing oxygen and mainly containing at least one selected from the group consisting of Cu, Ag, and Au and an oxidized film of mainly containing at least one selected from the group consisting of Cu, Ag and Au on the surface of the semiconducting substrate having at least either of the trench and the contact hole formed thereon, heating the semiconducting substrate formed (deposited) and, at the same time, causing at least one member selected from the group consisting of Cu, Ag, and Au to flow into the trench and/or the contact hole thereby forming (depositing) a conductive film consisting mainly of at least one member selected from the group consisting of Cu, Ag, and Au, and removing by polishing the part of the conductive film falling outside the regions destined to form the electrode line thereby completing the electrode line.

The oxygen-containing metal film or the oxidized film mentioned above may be in a form having oxygen already incorporated therein or in a form having a metal film already oxidized before the formation of the film.

The method according to the sixth aspect of this invention is further characterized in that the conductive film is formed while an oxidizing gas and a reducing gas are supplied to the site of the film formation (deposition).

Now, this invention will be described more specifically below.

This invention primarily aims to establish a technique for forming an embedded interconnection at high efficiency by causing a conductive film formed as by ordinary sputtering to flow at a low temperature of not more than 600° C. while repressing the deterioration of the semiconductor characteristics due to the diffusion of such a metal as Cu for interconnection in a semiconducting substrate. As a result of experiments and simulations of diffusion, it has been found for the first time in the art that the flow of a conductive film proceeds mainly by surface diffusion and that the uniaxial stress in the conductive film accelerates the diffusion. Based on this knowledge, the present invention essentially consists in forming an electrode line of high reliability by causing a conductive film to flow easily while repressing or avoiding the diffusion such as of Cu into a semiconducting substrate.

Generally, the diffusion is a process of thermal activation and it is exponentially accelerated in proportion to the increase in temperature. On the surface of a semiconducting substrate having the aforementioned trenches formed therein, the phenomenon of mass transfer which occurs in the deposited conductive film has the speed of this transfer determined by temperature. Particularly, in the phenomenon of flow, the surface diffusion proceeds predominantly in all the forms of diffusion and this surface diffusion originates in a surface curvature difference (chemical potential difference). The direction of transfer of the surface diffusion hinges on the shape of the surface (curvature) and the speed of transfer thereof on the temperature. They are further affected largely by the uniaxial stress which is exerted on the conductive film.

In the case of the first aspect of this invention, in preparation for causing a Cu film, a Ag film, or a Au film to flow by surface diffusion, the surface of the Cu film, the Ag film, or the Au film is locally heated to a necessary flow temperature. In the case of the Cu film, for example, the heat of oxidation or reduction of Cu is utilized therefor.

In the case of the reaction of reduction, the Cu film is locally heated to the necessary flow temperature in accordance with the formula of heat generation (1) due to the reaction of reduction to incite the surface diffusion.

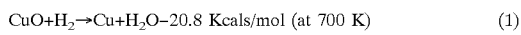

CuO+H$_2$→Cu+H$_2$O−20.8 Kcals/mol (at 700 K)    (1)

For this reaction of reduction of the Cu oxide, one or more of such reducing gases as H$_2$, CH$_4$, and CO are used. These reducing gases generally may be used as mixed with an inert gas. When the reaction of reduction occurs where the surface of the Cu film has been oxidized, the Cu atom which forms the oxide is rearranged in the crystal lattice of Cu on the open Cu surface. Further at this time, the heat of the reaction of reduction is supplied to the surface atoms and the atoms near the activated surface, owing to the heat of the reaction of reduction mentioned above, incur the same degree of surface diffusion as occurs at some hundreds of degrees higher than the actual temperature. When the surface atoms are deprived of the heat of reaction, the diffusion of the surface atoms returns to the diffusion which is proper for the temperature (environmental temperature) of the semiconducting substrate.

Then, in the case of the reaction of oxidation, when the surface oxidation of the Cu film is effected with O$_2$, the exothermic reaction proceeds as expressed by the following formula (2) and the diffusion in the interface between the Cu oxide and Cu is consequently accelerated. The oxidation with H$_2$O is an endothermic reaction and, therefore, acquires heat from the semiconducting substrate side.

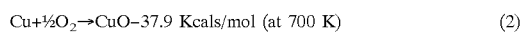

Cu+½O$_2$→CuO−37.9 Kcals/mol (at 700 K)    (2)

Owing to the combination of the oxidizing reaction and the reducing reaction which is attained as described above, the neighborhood of the Cu surface locally acquires an amply high flow temperature and the necessary flow easily and quickly proceeds even when the temperature of the semiconducting substrate is about 300° C., for example. As a result, the Cu film can be easily embedded in the trenches, with the diffusion of Cu in the semiconducting substrate repressed or precluded. In the case of the Ag film, since the surface oxidation is an exothermic reaction, the neighborhood of the surface of the Ag film locally acquires an amply high flow temperature, no matter whether the oxidation is effected with O$_2$ or H$_2$O.

In the independent introduction of the oxidizing gas, when the partial pressure of the oxidizing gas is set at lower pressure than the equilibrium partial pressure of oxidation of the conductive film (specifically in the approximate range of from $1 \times 10^{-7}$ to $5 \times 10^{-5}$ Torrs) at the temperature of the heat treatment, Cu is not oxidized, and it is possible to advance the reaction of chemi-sorption and de-sorption of the oxidizing gas on the Cu surface. By the energy due to the reaction, the surface diffusion is accelerated and the flow proceeds.

These phenomena are not limited to Cu. With such materials as Ag and Au which have strong catalytic actions, these phenomena proceed particularly prominently. The oxidizing gases which prove advantageous are O$_2$, N$_2$O, and H$_2$O, for example. Optionally, the heat treatment may be carried out in a mixture of two or more of these oxidizing gases. Even during the formation of a film, this reaction produces the same effect as mentioned above. After the treatment of this reaction, the surface consequently treated is desirable to expose to an ambience of such a reducing gas as H$_2$.

The flow temperature can be lowered by controlling the amount of the oxidizing gas to be incorporated as described above.

The Cu film under discussion is generally formed of pure Cu. It tolerates addition thereto of an element which cannot be reduced within the range of flow temperature mentioned above, on condition that the total content of this added element is not more than 10 atomic %, preferably not more than 5 atomic %. When the total content of the element incapable of being reduced within the range of flow temperature exceeds 10 atomic %, the film surface is covered with the oxide film of this element and the phenomenon of flow evidently tends to be repressed.

The Cu film can be formed by any of the well-known methods such as, for example, the ordinary sputtering method, anisotropic sputtering method (collimation sputtering method and long distance sputtering method), helicon wave sputtering method, vapor deposition, ICB deposition, or CVD. Further, the flow of the Cu film is accelerated when the Cu film being deposited is made to assume a small grain size and the grain boundary energy which vanishes in consequence of the growth of the grain size during the heat treatment is utilized. Specifically, the Cu film of a fine grain size can be formed and the flow effect can be further enhanced by cooling the semiconducting substrate with liquefied nitrogen in the process of film deposition or by exerting a bias on the semiconducting substrate during the course of film deposition. The bias voltage which is exerted on the semiconducting substrate ought to exceed −50 V. This effect is further exalted by causing the Cu film to incorporate therein suitably an element capable of promoting recrystallization. For the sake of heating the semiconducting substrate, heating means such as, for example, resistance furnace, plate heater, laser heating, or image furnace heating are available. Among other heating means cited above, the plate heating method proves particularly advantageous.

Further, in case that both oxidizing gas and the reducing gas are supplied, for the purpose of enabling the oxidizing reaction and the reducing reaction to occur reversibly, the heat treatment is implemented while the oxidizing gas and the reducing gas are supplied either simultaneously or alternately. The Cu film consequently formed, therefore, is exposed to the ambience of an oxidizing gas and the ambience of a reducing gas sequentially at least once or to the ambience of the mixture of an oxidizing gas and a reducing gas at least once. When the exposure is made alternately to the ambience of an oxidizing gas and the ambience of a reducing gas, the intervals of alternation ought to be shortened for the sake of lowering the flow temperature and shortening the duration of flow treatment. The ambiences to be used alternately in this case tolerate the invasion by a residue of inert gas or the gas emanating from evacuation.

When the exposure is made to the ambience of the mixture of an oxidizing gas and a reducing gas, this mixture constitutes a region approximating the equilibrium partial pressure of the oxidizing and the reducing reaction. To be specific, in this case, though the oxidizing and the reducing reaction proceed simultaneously at different parts of the surface of the Cu film owing to the switch between the oxidizing and the reducing gas, the two reactions both proceed as a whole. The partial pressures of oxidation and reduction ought to be varied artificially. In the present case, for the purpose of preventing the Cu film from the deterioration mentioned above and from the agglomeration as well and precluding the diffusion of Cu owing to the elevation of the temperature of the whole semiconducting substrate, the partial pressures of the gases ought to be set so as to keep the amount of oxidation from exceeding 20% of the amount of the Cu film. After the flow accomplished by the oxidizing and the reducing reaction as described above, the produced Cu film is finally exposed to a reducing ambience such as pure $H_2$ to be deprived of the Cu oxide film.

The ambience for the oxidizing reaction and that for the reducing reaction mentioned above may be in the form of a plasma. No matter whether the Cu film may be exposed severally or simultaneously to the plasma of oxidizing gas and that of reducing gas, the treatment of flow performed in accordance with the conditions remarked above produces the same result. The modes of plasma which are advantageously used herein include rf, DC, ECR, and helicon wave plasma, for example. The reaction on the semiconducting substrate is accelerated by exerting a bias on the substrate. In consideration of the phenomenon of sputtering for the formation of the Cu film, the bias so exerted ought to be not more than −50 V. The remarks made above hold good for Ag and Au.

Furthermore, in the method of the first aspect of this invention, a first conductive film of a substance whose oxide manifests electric conductivity is formed as an undercoating layer on the surface of the substrate having trenches and/or contact holes formed in advance therein and a film of Cu or a Cu alloy is superposed on the undercoating film. Thereby, when a interconnection of embedded Cu or Cu alloy is formed by the damascene process utilizing an oxidation and reduction reaction, it is enabled that the rise of contact resistance in the trenches or the contact holes can be precluded even when the undercoating film is oxidized owing to a heat treatment in the presence of an oxidizing gas.

For the purpose of forming a interconnection of embedded Cu or Cu alloy by the damascene process utilizing an oxidation and reduction reaction without entailing any deterioration of semiconductor characteristics, a technique for preventing the rise of resistance in the surface of a barrier layer or a substrate owing to oxidation is indispensably required. At this point, there are oxides having high conductivity. For example, $ReO_3$ and NbO manifest such low resistance as 10 $\mu\Omega$cm. Thus, by forming a conductor film of a substance whose oxide manifests electric conductivity as an undercoating layer for Cu or Cu alloy film, the rise of contact resistance in the trenches or the contact holes can be precluded even when the undercoating layer is oxidized owing to a heat treatment performed in the presence of an oxidizing gas.

That is, when the flow is implemented by virtue of an oxidation and reduction reaction, the reaction of oxidation possibly exerts an effect to bear on the surface of a barrier layer or a substrate underlying the Cu film, depending on the partial pressure of oxygen in the ambience enveloping the site of heat treatment. When a conductive film of a substance whose oxide manifests electric conductivity is formed as the undercoating film for the Cu film in this case, the possible rise of contact resistance can be precluded because this undercoating film retains highly satisfactory electric conductivity no matter whether it is oxidized or not. This effect of the conductive film remains unchanged when it is wholly oxidized and when it is oxidized only partly and allowed to persist as a conductive oxide. The conductive oxide which is produced by the oxidation of conductive film used as the undercoating film may deviate from a stoichiometric composition. The resistivity of this conductive oxide is desired to be not more than 100 $\mu\Omega$cm.

Incidently, when the conductive film mentioned above is independently formed as an undercoating film, it discharges the additional function as a barrier layer for the Cu film and, even when the other barrier layer is not interposed between the substrate and the Cu interconnection, prevents Cu from diffusing into the substrate and the oxygen contained in the Cu film from diffusing into the substrate.

When the chemical change and change of state mentioned above are to be treated from the thermodynamic point of view, the change $\Delta G$ of the Gibbs free energy due to the change of state of the system constitutes the criterion for determining whether or not the change can spontaneously occur. When the magnitude of the change $\Delta G$ due to the change of the system is 0, the change is reversible. When the magnitude is less than 0, the change in that direction spontaneously occurs. When the magnitude is coversely larger than 0, the change in that direction can never occur.

When the $\Delta G$ in the change of the oxidizing reaction of the substance forming the conductive film assumes a minus magnitude in the ranges of the partial pressure of oxygen and the temperature of the ambience to which the substrate is exposed during the film formation or during the flow and the absolute value thereof is larger than the $\Delta G$ of Cu, the conductive film mentioned above has an action of reducing Cu. Since the conductive film in this case discharges the role of absorbing the oxygen introduced into the Cu film, it exhibits a still higher barrier property during the flow cause by virtue of an oxidation and reduction reaction. Even when the Cu film is formed without supply of a reducing gas or when the amount of oxidation of the Cu film exceeds 20%, for example, the rise of resistance and of contact resistance can be precluded by virtue of the reduction action of the conductive film.

Further, when the conductive film is superposed on a barrier layer which is made of a different material from the substance of the conductive film, the possible increase of the electrical resistance of the barrier layer can be precluded by preventing the barrier layer from oxidation. Particularly when the $\Delta G$ in the oxidation reaction of the substance forming the conductive film assumes a minus magnitude in the ranges of the partial pressure of oxygen and the temperature of the ambience to which the substrate is exposed during the flow and the absolute value thereof is larger than the absolute value of the $\Delta G$ of the material forming the barrier layer, the effect manifested by the barrier layer in repressing the oxidation becomes conspicuous because the oxidation of the conductive film precedes that of the barrier layer.

Furthermore, so long as the conductive film mentioned above satisfies the condition, the superposed conductive film has an action of reducing the barrier layer even when the barrier layer has the surface thereof coated with a native oxide film. During the formation of the barrier layer and the conductive film, therefore, the barrier layer does not suffer rise of contact resistance when it is once exposed to the air.

The formation of the conductive film may be implemented by the sputtering method, vapor deposition method, or CVD method. The amount of oxygen which is incorporated in the Cu film during the course of film formation or flow is varied by the partial pressure of the ambiance to be used therein. The thickness of the conductive film ought to be enough to reduce the whole of the oxygen into the Cu film under the partial pressure of oxygen used during the course of film formation or flow.

It is necessary that the substance for forming the conductive film mentioned above includes at least one element selected from the group consisting of Ti, V, Cr, Ni, Nb, Mo, Ru, Rh, Pd, Sb, La, W, Re, Os, Ir, Pt, Tl, Pb, Bi, Nd, Sm and Er. Particularly, Nd, La or Sm is desirable, because the absolute value of the change of $\Delta G$ of the Gibbs free energy in the oxidation reaction thereof is larger than that of the change of $\Delta G$ of the Gibbs free energy in the oxidation reaction of TiN which is typically used as a barrier layer, thereby the oxidation of the barrier layer being significantly repressed.

Cu or a Cu alloy can be used for the conductive film to be formed. The remark holds good for Ag or Au.

It is possible to permit provision of a semiconductor device of high reliability by forming a conductive film of a substance whose oxide manifests electric conductivity as an undercoating film for the Cu, Ag or Au film thereby enabling the undercoating film, even when oxidized in a heat treatment performed in the presence of an oxidizing gas during the formation of an embedded interconnection by the damascene process utilizing an oxidation and reduction reaction, to avoid exalting contact resistance.

The second aspect of this invention pertains to the flow of the conductive film and specifically consists in utilizing the uniaxial stress exerted on the conductive film, i.e. a factor other than the surface diffusion which governs the phenomenon of flow. When the stress exerted on the conductive film held at a temperature raised to a certain extent is varied, there arises the phenomenon of high-temperature creep in the form of transfer of mass (metal atoms) from the high to the low stress side. When the uniaxial stress is imparted to the ridges of the surface of the conductive film assuming an undulating contour owing to the trenches formed in the semiconducting substrate, therefore, high stress is exerted on the ridge parts of the conductive film and low stress on the trench parts of the conductive film. Since a stress gradient is consequently generated in the conductive film, the diffusion of the conductive film from the ridges to the trench thereof proceeds infallibly and the lowering of the flow temperature is realized.

In this case, though the effectiveness of the acceleration grows in proportion as the magnitude of the uniaxial stress (pressure) to be imparted increases and the degree of advance of the diffusion varies with the shape of the film as deposited, the flow temperature can be actually lowered roughly by some hundreds of degrees Centigrade. The uniaxial stress imparted (exerted) herein is set at a level of not less than 1 kg/mm$^2$, preferably not less than 2 kg/mm$^2$. If the uniaxial stress exceeds the yield stress, it will induce the conductive film to undergo plastic deformation. Owing to this plastic deformation, the embedment of the metal in the trench is facilitated and the variation of texture and other phenomena accumulated in the conductive film during the treatment are moderated by a heat treatment and the energy consequently generated goes to promote the flow. The heat treatment just mentioned may be performed simultaneously with the impartation of the uniaxial stress or after the plastic deformation due to the impartation of the uniaxial stress. The heat treatment performed simultaneously, however, can contribute more to lower the flow temperature. The upper limit of the uniaxial stress ought to be not more than the yield stress of the material of semiconducting substrate, particularly a Si substrate. If such an all-directional stress as hydrostatic pressure is imparted instead of the uniaxial stress, the stress gradient generated in the conductive film will be small and the flow temperature will not be appreciably lowered.

As concrete examples of the material used advantageously for the conductive film contemplated by the second aspect of this invention, pure Al, Al alloys, pure Cu, Cu alloys (such as Cu—Ag alloy), and pure Ag may be cited. The conductive film can be formed by any of the well-known methods such as, for example, the ordinary sputtering method, anisotropic sputtering method (collimation sputtering method and long distance sputtering method), helicon wave sputtering method, vapor deposition, ICB deposition, or CVD. Further, the flow of the conductive film is accelerated when the conductive film being formed is made to assume a small grain size and the grain boundary energy which vanishes in consequence of the growth of the grain size during the heat treatment is utilized. To be specific, the conductive film of a fine grain size can be formed and the flow effect can be further enhanced by cooling the semiconducting substrate with liquefied nitrogen in the process of film formation or by exerting a bias on the semiconducting substrate during the course of film formation. The bias voltage which is exerted on the semiconducting substrate ought to be not less than −50 V. This effect is further exalted by causing the conductive film to incorporate therein suitably an element capable of promoting recrystallization.

As respects the ambience in which the heat treatment is carried out, the conductive film made of Al tends to have the flowing property thereof impaired when the surface thereof is oxidized. The conductive film as formed, therefore, ought to be heat-treated under pressure as maintained under a vacuum of not more than $1\times10^{-8}$ Torr. In the case of a metal film of Cu, Ag, or Au, since the oxide film formed on the surface is easily reduced, the film as formed may be exposed to the atmosphere. Even when the Cu, Ag, or Au film is oxidized, it is only required to be exposed, during the treatment with pressure and heat, to a reducing ambience or to a vacuum not higher than the dissociation pressure of the oxide. It is naturally permissible to carry out the heat treatment of the metal film while the oxidizing and the reducing gas are supplied simultaneously or alternately to the site of the heat treatment. When the conductive film is made of a Cu—Ag alloy, the flow temperature can be lowered because this is a simple eutectic alloy and has an electrical resistance of 1.9 $\mu\Omega$cm at most, and an eutectic temperature of 779° C., which is a fairly low melting point.

Since the uniaxial stress to be used in the second aspect of this invention is required to be exerted uniformly throughout the entire volume of the conductive film, the jig to be used for the transmission of the stress ought to have the surface thereof made of an extremely flat material. Specifically, an Si sheet of specular finish or a thermally oxidized Si film is advantageously used for the surface. The material thus chosen ought to be incapable of reacting with the conductive film. When the conductive film uses Cu as its material, for example, it reacts with Si and give rise to a silicide. $SiO_2$, therefore, is used advantageously for the surface material instead. For the sake of heating required for the flow mentioned above, heating means such as, for example, resistance furnace, plate heater, laser heating, or image furnace heating are available. To ensure effective diffusion of heat due to a temperature gradient, the transmission from a uniaxial stress exerting jig, a gas, or a liquid proves advantageous.

The third aspect of this invention contemplates forming a conductive film in the form of a laminate of Cu film and a Ag film and utilizes the fact that the energy of a interface formed between different metal species is released during the alloying of these metals and the released energy contributes to lower the flow temperature. In this case, the heat treatment of the laminated film may be carried out while an oxidizing gas and a reducing gas are both supplied or while a uniaxial stress is imparted to the conductive film on the surface of the semiconducting substrate.

This third aspect of the invention not only utilizes the energy originating in the interface between the different metal species but also makes proper use of the free energy on the surface of the conductive film and the grain boundary energy in the film. The grain boundary energy or other energies mentioned above are effectively utilized and the flow is promoted, for example, with increasing the surface area of the film by harnessing the anisotropy of impinging particles during the formation of the film or with decreasing the grain size thereof.

Since the flow in question demands perfect absence of the boundary, it dictates as a prerequisite the elimination of such an oxide as tends to pin the movement of the boundary to the fullest possible extent. When the film is deposited by sputtering, for example, it is necessary that the formation of this film be effected by the use of a target of high purity in an environment of very low ultimate pressure in an ambience of highly pure argon for the purpose of preventing the film from being invaded by impurities and protecting the film against adverse effects of $O_2$ in particular.

The Cu—Ag film mentioned above may properly incorporate therein an element capable of promoting recrystallization. To be specific, the Cu—Ag film of a fine grain size can be formed and the flow effect can be further enhanced by cooling the semiconducting substrate with liquefied nitrogen in the process of film formation or by exerting a bias on the semiconducting substrate during the course of film formation. The bias voltage which is exerted on the semiconducting substrate in this case ought to be not less than $-50$ V.

Secondly, this invention aims essentially to form an electrode line containing no void by repressing and preventing the occurrence of bridges in the conductive film during the heat treatment for flow and meanwhile preventing a deposited substance in the trenches and contact holes destined to form the electrode lines from being lifted toward the space surface.

Specifically, the fourth aspect of this invention repress and avoid the occurrence of bridges and the occurrence of voids mentioned above by forming a conductive film by ordinary physical vapor deposition, then preparatorily decreasing the thickness of a deposited film on a space prior to the heat treatment for flow, and suitably balancing the thickness of the deposited film on the space and that of the deposited film in the trenches or others thereby repressing the movement of such deposited films.

The deposited film on the space ought to be polished so as to assume a thickness approximating the thickness of the deposited film in the trenches or others. If the ratio of these film thicknesses is unduly small, the amount of the deposited substance to be moved into the trenches will be decreased. It is necessary that this ratio of film thicknesses be set in the range of $(\frac{2}{3})a<b<(\frac{3}{2})a$, wherein a stands for the thickness of the deposited film in the trench 6 and b for the thickness of the deposited film on the space between the adjacent trench 6 of the interconnection as shown in a schematic diagram of FIG. 1. In FIG. 1, 7 stands for an insulating film such as a $SiO_2$ film, 8 for a conductive film such as a Cu film, and 10 for an insulating film such as a $SiO_2$ or a SiN film.

After the film has been formed, the partial removal of the deposited film on the space for the sake of decreasing the thickness of the film is implemented by such means as the MP (mechanical polishing), the CMP mentioned above, or the ion etching, for example.

When a film of Al is deposited and then the formed film is partially removed by the MP or the CMP for the sake of decreasing the film thickness, the flow of the film during the heat treatment does not proceed smoothly unless the film is deprived of the surface oxide film thereof by ion etching.

When a film of Cu is deposited, it suffices to carry out the heat treatment in an environment capable of reducing a Cu oxide such as, for example, hydrogen or a CO-containing gas, perform ion etching during the course of the heat treatment, or implement the heat treatment in an environment of a high degree of vacuum.

When the deposited film is a Cu film, a Ag film, or a Au film, the temperature of the heat treatment can be lowered by selecting an ambience of the mixture of an oxidizing gas and a reducing gas or an ambient adapted to effect oxidation and reduction alternately. The temperature of the substrate (namely the temperature of the environment) ought to be not less than 200° C. at which the reducing reaction proceeds quickly. As concrete examples of the means of treating available in this case, the resistance furnace, plate heater, laser heating, or image furnace heating may be cited. Among other means of heating cited above, the plate heater which permits quick transfer of heat even at low temperatures proves particularly advantageous. As for the ambience for the heat treatment mentioned above, in order to avoid deterioration of the film and preclude rise of the temperature of the semiconducting substrate, it is necessary that the ratio of partial pressures of gases and the intervals of oxidation and reduction be such that the amount of oxidation is not more than 20% of the thickness of the film.

The ambience for the heat treatment mentioned above may be in the form of a plasma. The surface of the conductive film consequently deposited may be exposed either simultaneously or alternately to the reducing gas plasma and the oxidizing gas plasma. When the exposure is made simultaneously, the procedure to be followed is the same as when the oxidizing gas and the reducing gas are simultaneously supplied. In either case, the ambience tolerates the invasion by an inert gas as an extraneous substance. The modes of plasma which are advantageously used herein include rf, DC, ECR, and helicon wave plasma, for example. The reaction is accelerated by exerting a bias on the substrate. In consideration of the phenomenon of sputtering for the formation of the conductive film, the bias so exerted ought to be not more than −50 V.

The materials which are advantageously usable for the conductive film include not only Al, Cu, Ag, and Au mentioned above but also such Cu alloys as contain not more than 10 atomic %, preferably not more than 5 atomic %, of an additional alloy component. Further, for the sake of preventing the deposited in the trenches from being lifted onto the space between the adjacent trenches, the conductive film ought to be provided with an undercoating layer and enabled to lower the boundary energy. This undercoating film, to avoid exalting the electrical resistance of the conductive film superposed thereon, ought to be formed of a substance incapable of mingling with the material of the conductive film. Amorphous TaAl and amorphous NbAl are ideal substances for Al; Nb, amorphous TaCu, and amorphous WCo for Cu, for example.

Thirdly, this invention aims essentially to form an embedded interconnection including no voids and highly reliability at a high aspect ratio by implementing the supply of at least an oxidizing gas at the same time that the conductive film is formed or the polishing stopper film is removed after the CMP step.

Specifically, the fifth aspect of this invention attains the formation of an electrode line by heating a semiconductor substrate and meanwhile supplying at least an oxidizing gas and, at the same time, causing at least one member selected from among Cu, Ag and Au to flow into trenches and contact holes formed in advance in the semiconductor substrate, thereby forming a Cu film, a Ag film or a Au film and thereafter removing by polishing the excess part of the conductive film to form an electrode line. For example, in the case of the Cu film, the surface temperature of the Cu film locally rises by utilizing an oxidation and reduction reaction of Cu, as in the first aspect of this invention, thereby the surface diffusion being accelerated. As the result, the Cu film moves to embed the trenches and contact holes even when the temperature of the substrate is relatively low.

Here, in the independent introduction of the oxidizing gas, when the partial pressure of the oxidizing gas is set at lower pressure than the equilibrium partial pressure of oxidation of the conductive film, specifically in the range of from $1 \times 10^{-7}$ to $5 \times 10^{-5}$ Torr, at the heat temperature, Cu is not oxidized, and it is possible to advance the reaction of chemisorption and desorption of the oxidizing gas on the Cu surface, By the energy due to the reaction, the surface diffusion is accelerated and the flow of Cu proceeds. Further, in the fifth aspect of this invention, the effect of reaction is more improved by supplying both an oxidizing gas and a reducing gas in comparison with the independent supply of oxidizing gas, as in the first aspect of this invention.

Then, in the method of production contemplated by the fifth aspect of this invention, the formation of a highly satisfactory film is aided by controlling the amounts of an oxidizing gas and a reducing gas to be supplied during the film deposition so that the partial pressure of the oxidizing gas on the surface of the semiconducting substrate is greater than the equilibrium partial pressure between the oxidizing gas and the reducing gas in the former of the duration of the film formation and the partial pressure of the reducing gas is conversely greater than the equilibrium partial pressure between the oxidizing gas and the reducing gas in the latter of the period of the film formation. The same operation and effect as mentioned above are obtained by controlling the temperature of the semiconducting substrate during the period of the film deposition so that the temperature in the latter half of the duration is higher than that in the former half of the duration.

These phenomena are not limited to Cu. With such materials as Ag and Au which have string catalytic actions, these phenomena proceed particularly prominently. The oxidizing gas which prove advantageous are $O_2$, $N_2O$ and $H_2O$, for example. Optionally, the film forming may be carried out in a mixture of two or more of these oxidizing gases. After the film deposition, the surface consequently treated is desirable to expose to an ambience of such a reducing gas as $H_2$.

As mentioned above, in the fifth aspect of this invention, it become possible by controlling the amount of the oxidizing gas to satisfactorily embed at a lower temperature the conductive film into the trenches and contact holes having a high aspect ratio.

As concrete examples of the method advantageously used for the formation of the film mentioned above, the ordinary sputtering method, the long distance sputtering method which increases the proportion of sputtered particles perpendicularly impinging on the semiconducting substrate by widening the TS distance (the distance between the target and the substrate), such anisotropic sputtering methods as the collimation sputtering method which involves insertion of a collimator intended for accumulation thereto of the portion of sputtered particles other than those impinging perpendicularly on the semiconducting substrate between the TS, and the bias sputtering method which applies a DC voltage or a high frequency voltage to the semiconducting substrate may be cited. Particularly when the anisotropic sputtering method or the bias sputtering method is adopted where the trenches are expected to have a high aspect ratio, the efficiency of accumulation of sputtered particles to the interiors of trenches is exalted, the ease with which the inner surfaces of trenches are coated with a sparingly cohesive O atom-containing Cu film is improved, and the sputtered particles are allowed to be embedded effectively in trenches having an amply high aspect ratio.

When the bias sputtering method is used to form a sparingly cohesive Cu film and then the ordinary sputtering method having a highly deposition rate is used to embed the the Cu film in the contact holes, the operation combining these two methods enjoys highly improved productivity. Since this bias sputtering method forms a film while causing the $Ar^+$ ions resulting from ionization to be driven into the semiconducting substrate with high perpendicularity, these $Ar^+$ ions etch with the impact of sputtering the part of the Cu film thrust into the openings (in the shape of an overhang), avoid narrowing the openings of contact holes into which the Cu atoms impinge, and produce the effect of enabling the Cu removed by the etching to adhere again to the inner wall surfaces of the contact holes and vest the inner wall surfaces with a coating of improved quality. The bias sputtering manifests an expected effect even when it is carried out in an ambience of hydrogen or oxygen containing virtually or absolutely no Ar. The possibility that the wiring will incur a decline of reliability due to the admission of $Ar^+$ ions into the semiconducting substrate mentioned above is precluded by the formation of the Cu film by the ordinary sputtering method in addition to the application of heat to the semiconducting substrate.

Further, the formation of a primary Cu film and that of a secondary Cu film can be continuously carried out in one and the same chamber with a saving of the time spent for the formation of film by turning on and off the bias applied to the substrate or gradually decreasing the magnitude of the bias so applied. Otherwise, the long distance sputtering method may be used first to form a sparingly cohesive Cu film and continuously shifted to the sputting method using a narrowed TS distance and having a highly deposition rate. Alternatively, the collimation sputtering method is used first to form a sparingly cohesive Cu film and then, with the collimator removed from between the TS, shifted to the sputtering method having a highly deposition rate.

Further, in the method of the fifth aspect of this invention, a first conductive film of a substance whose oxide manifests electrical conductivity is also formed as undercoating film on the surface of the substrate having trenches and/or contact holes formed in advance therein and a film of Cu or a Cu alloy is superposed on the undercoating film, as in the method of the first aspect of this invention. Thereby, when a interconnection of embeded Cu or Cu alloy is formed by the heat utilizing an oxidation and reduction reaction, it is enabled that the rise of contact resistance in the trenches and contact holes can be precluded even if the undercoating film is oxidized when the semiconductor substrate is heated. Thus, the semiconductor device with high reliability is obtained.

Furthermore, Cu or a Cu alloy can be used for the conductive film. The remark holds good for Ag or Au.

That is, as in the method of the first aspect of this invention, an embedded interconnection utilizing the heat of an oxidation and reduction reaction is provided by forming a conductive film of a substance whose oxide manifests electrical conductivity as an undercoating film for the Cu, Ag or Au film, with high reliability and good conductivity without the rise of contact resistance regardless of oxidation of the undercoating film when the semiconductor substrate is heated in the presence of an oxidizing gas.

As the substance for forming the conductive film mentioned above, the same substances as the substance of undercoating film in the first aspect of this invention are exemplified.

The sixth aspect of this invention is based on the following knowledge acquired by the present inventors as a result of numerous studies.

Specifically, during the formation of a conductive film, the semiconducting substrate is heated and, at the same time, an ambience of the mixture of an oxidizing gas and a reducing gas is established. When the Cu film is formed under the conditions mentioned above by supplying an $O_2$-containing gas as an oxidizing gas, the Cu film to be formed during the initial stage of the film formation incorporates therein plentiful O atoms. The O atoms thus entrapped in the Cu film operate in the direction of suppressing the cohesion of the Cu film during the application of heat to the substrate and precluding the aggregation of Cu particles in the form of islands observed during the initial stage of film formation by the conventional heat sputtering method.

When the film is formed of Cu while supplying $H_2$ gas as a reducing gas into the sputtered Cu particles, the surface of the Cu film being formed or accumulated is constantly reduced and, therefore, allowed to maintain an active state. The Cu film, with the free surface diffusion thereof unrestrained, is allowed to produce a line of a prescribed pattern easily and move smoothly into the trenches.

In the deposition of a conductive film as by sputtering in an ambience of the mixture of an oxidizing gas and a reducing gas, since the oxidizing reaction and the reducing reaction of Cu are both exothermic reactions, the surface of the Cu film on which the oxidation and the reduction occur is locally heated to an elevated temperature. Since the surface diffusion can be consequently activated even when the substrate temperature is low, the Cu, Ag, or Au can be embedded into the trenches at a low temperature.

When a plasma is generated in an ambience of the mixture of an oxidizing gas and a reducing gas mentioned above to produce $O^+$ ions or radicals or $H^+$ ions or radicals by ionization or liberation, the operation enjoys improved productivity. As a result, the substrate temperature can be further lowered and the embedment such as of Cu in the trenches can be implemented fully satisfactory at temperatures in the neighborhood of 200° C. In consideration of the diffusion of Cu atoms in the semiconducting substrate, the substrate temperature ought to be in the approximate range of from 200° C. to 600° C.

The sixth aspect of this invention consist in forming an electrode line by depositing an oxygen-containing conductive film on the surface of an insulating film having trenches and contact holes formed in advance in a semiconducting substrate, continuously heating the semiconducting substrate and meanwhile forming the conductive film thereby embedding the conductive film in the trenches and the contact holes, and there-after polishing the formed conductive film. The deposition (formation) of the oxygen-containing conductive film mentioned above can be implemented, for example, by using a Cu, Ag, or Au target incorporating O atoms therein or controlling the amounts of the oxidizing gas to be supplied. The oxygen may be contained in the conductive film by the dispersion of oxygen throughout the entire volume of the conductive film or by the oxidization of the film. This invention can embed the conductive film in the trenches and the contact holes at a lower temperature by carrying out the formation of the conductive film while continuing the supply of the oxidizing gas and the reducing gas.

In the sixth aspect of this invention, the cohesion of the Cu film can be repressed, for example, by the oxygen which is contained in the Cu film. Further, the cohesion of the Cu film, Ag film, or Au film has an intimate bearing on the temperature of the substrate, the ambience in which the film is deposited, and the speed of film deposition. Particularly, in the deposition of the Cu film, the cohesion bears very intimately on the speed of film deposition. The Cu atoms hurled from the target diffuse on the substrate and then form stable embryo thereon and the Cu atoms subsequently impinge on the substrate similarly diffuse on the substrate and permeate the stable embryo. The surface diffusion mentioned above gains in activity in proportion as the substrate temperature rises. The growth of islands (cohesion) encountered in the heat sputtering method originates in the process of film deposition mentioned above.

When the speed of film deposition is high, the cohesion does not occur conspicuously because the Cu atoms in flight are bound with the successively hurled Cu atoms and allowed to form new embryo before they arrive at the existing stable embryo. When the speed of film formation is low, however, the Cu atoms acquire a longer time in diffusing themselves on the surface and the probability of these Cu atoms being absorbed by the existing stable embryo is heightened. This trend holds good for the sparingly cohesive O atom-containing Cu film. Particularly, since the speed of film deposition hinges on the aspect ratios of the trenches and the contact holes which constitute regions for the formation of an electrode line, it is difficult to equalize the speed of film deposition in the trenches and that on the flat surface.

When the sputtering is performed in an oxidizing ambience or a reducing ambience where the speed of film deposition is not equal in the trenches and on the flat surface as mentioned above, the Cu film is liable to undergo cohesion because the amount of cohesion-repressing O atoms to be incorporated in the conductive film cannot be easily uniformized throughout the entire volume of the film. When a Cu target incorporating O atoms therein is used, a Cu film which is free from such defect as lack of surface continuity can be easily formed because the content of O atoms can be controlled practically uniformly.

As concrete examples of the method advantageously used for the formation of the oxygen-containing film and the conductive film, the long distance sputtering method which increases the proportion of sputtered particles perpendicularly impinging on the semiconducting substrate by widening the TS distance (the distance between the target and the substrate), such anisotropic sputtering methods as the collimation sputtering method which involves insertion of a collimator intended for accumulation thereto of the portion of sputtered particles other than those impinging perpendicularly on the semiconducting substrate between the TS, and the bias sputtering method which applies a DC voltage or a high frequency voltage to the semiconducting substrate may be cited.

Particularly when the anisotropic sputtering method or the bias sputtering method is adopted where the trenches are expected to have a high aspect ratio, the efficiency of accumulation of sputtered particles to the interiors of trenches is exalted, the ease with which the inner surfaces of trenches are coated with a sparingly cohesive O atom-containing Cu film is improved, and the sputtered particles are allowed to be embedded effectively in trenches having an amply high aspect ratio.

When the bias sputtering method is used to form a sparingly cohesive Cu film, Ag film, or Au film and then the ordinary sputtering method having a highly deposition rate is used to embed the melt of the Cu film in the contact holes, the operation combining these two methods enjoys highly improved productivity. Further, when the supply of such an inert gas as Ar is continued during the process of the bias sputtering method mentioned above, this sputtering method forms a film while causing the $Ar^+$ ions resulting from ionization to be driven into the semiconducting substrate with high perpendicularity. These $Ar^+$ ions, therefore, etch with the impact of sputtering the part of the Cu film thrust into the openings (in the shape of an overhang), avoid narrowing the openings of contact holes into which the Cu atoms impinge, and produce the effect of enabling the Cu removed by the etching to adhere again to the inner wall surfaces of the contact holes and vest the inner wall surfaces with a coating of improved quality.

The bias sputtering performed in this case manifests an expected effect even when it is carried out in an ambience of hydrogen or oxygen containing virtually or absolutely no Ar. The possibility that the electrode line will incur a decline of reliability due to the admission of $Ar^+$ ions into the semiconducting substrate mentioned above can be fully precluded by the formation of the Cu film in addition to the application of heat to the semiconducting substrate.

Further, the formation of a an oxygen-containing Cu film and that of a conductive film can be continuously carried out in one and the same chamber with a saving of the time spent for the formation of film by turning on and off the bias applied to the substrate or gradually decreasing the magnitude of the bias so applied. Otherwise, the long distance sputtering method may be used first to deposit a sparingly cohesive Cu film and continuously shifted to the sputting method using a narrowed TS distance and having a highly deposition rate. Alternatively, the collimation sputtering method is used first to form a sparingly cohesive O atom-containing Cu film and then, with the collimator removed from between the TS, shifted to the ordinary sputtering method.

The first through sixth aspects of this invention may consist in easily forming an electrode line of high reliability by forming a C (carbon) film as an antireflection film concurrently serving as a polishing stopper film on the surface of an insulating film having trenches and contact holes formed in advance thereon thereby allowing formation of a trench part of high accuracy and meanwhile preventing and avoiding excessive polishing.

This aspect of the invention, virtually similarly to the first through sixth aspects of this invention described above, aims essentially to offer a measure to treat the C film which is used as an antireflection film for abating and repressing the disturbance of a patterning due to the random reflection of light during the formation of a groove part by the so-called photoetching and as a polishing stopper film for preventing an undercoating material from being excessively polished and removed when the conductive film which has been embedded in the trench part is polished and shaped.

The C film mentioned above possesses conductivity. If it is suffered to persist, it will exert adverse effects on not only the electrode line to be formed but also the whole of the semiconductor device to be manufactured from the electrical point of view. After the C film has fulfilled the function of preventing the light reflection and stopping the excessive polishing, therefore, it must be removed from the region in which no adverse effect is exerted on the substrate and the insulating property is required. This invention has been perfected on the basis of the knowledge that the C film is easily and infallibly removed in the plasma of the ambience of the mixture of an oxidizing gas and a reducing gas and that, during this removal of the C film, the conductive film made of Cu or other similar metal is not oxidized.

The electrode lines contemplated by the present invention tolerates the presence of an undercoating film which is made of TiN, Ta, Cr, TiW, Nb, amorphous TiSiN, amorphous Ti(O, N), amorphous WCo, amorphous NbCr, amorphous CrTa, amorphous CoV, amorphous CoMo, amorphous CoNb, amorphous CoTa, amorphous TaCu, amorphous WN, or amorphous WSiN, for example.

As concrete examples of the semiconducting substance for forming the electrode lines in various aspects of this invention mentioned above, a Si substrate or a compound semiconducting substrate optionally having an active region and an insulating film formed in advance therein may be cited. The trenches and/or the contact holes to be formed in the regions destined to form an electrode line in the semiconducting substrate are not particularly discriminated on account of their shapes.

DESCRIPTION OF THE PREFERRED EMBODIMENTS

Figure 1:
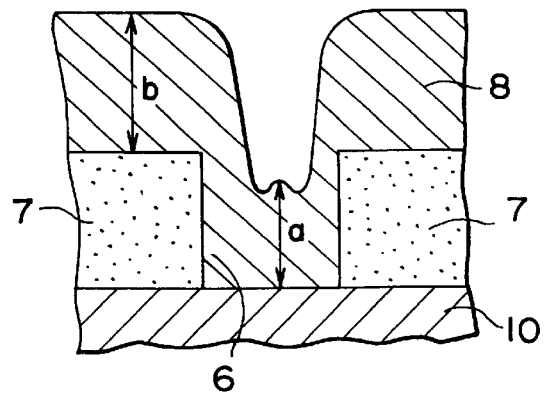
FIG. 1 is a schematic diagram for aiding in the illustrating the manner of forming an embedded interconnection by flow in a method for the production of a semiconductor device according to this invention.

Now, working examples of this invention will be described in detail below with reference to the accompanying drawings.

EXAMPLE 1

FIGS. 2A, 2B, 2C, and 2D and FIG. 3 schematically show the manner of implementing the present example. First, as shown in the cross section of FIG. 2A, a p-SiN insulating film 10 of a thickness of 100 nm was formed as an undercoating layer on a Si substrate (100) 9 provided in advance with a necessary active region. Further, a $SiO_2$ film 7 was formed in a thickness of 1 $\mu$m by the CVD technique as shown in the cross section of FIG. 2B. Then, a multiplicity of trenches 6 measuring 1 $\mu$m in width and 1 $\mu$m in depth were formed as spaced at an interval of 500 nm in the $SiO_2$ film 7 by the PEP and PIE techniques as shown in the cross section of FIG. 2C. On the surface of the $SiO_2$ film 7 having the trenches 6 formed therein, a barrier layer 11 of TiN was formed in a thickness of 30 nm and then a Cu film 8 was formed in a thickness of 600 nm by sputtering as shown in the cross section of FIG. 2D. In this case, prior to the formation of the barrier layer 11 and the Cu film 8, contact holes (via holes) were embedded preparatorily by the selective CVD method to establish a connection with the active region.

Figure 3:
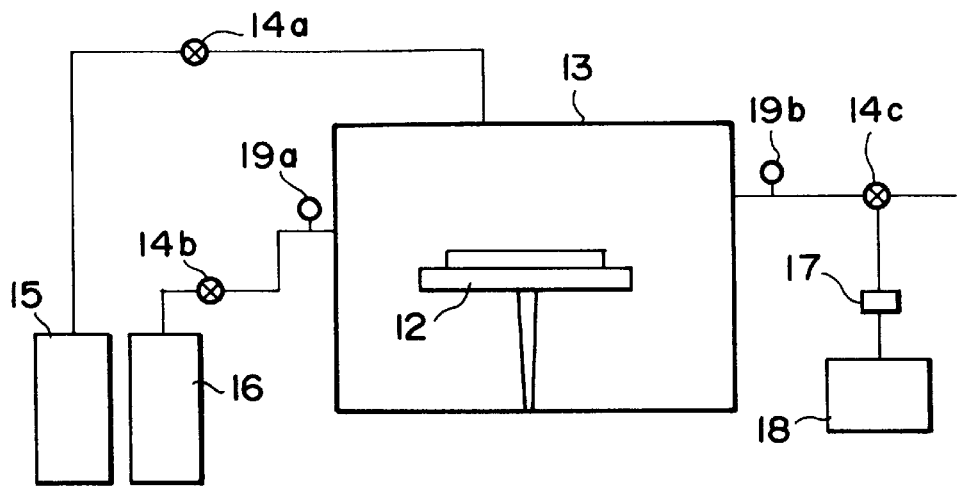
FIG. 3 is a diagram schematically showing the construction of a reduced-pressure heat-treating device to be used in the method for the production of a semiconductor device according to this invention.

The resultant laminate was subjected to a heat treatment accompanied by an oxidation-reduction reaction by the use of a reduced pressure heat-treating device constructed as shown schematically in FIG. 3. This reduced pressure heat-treating device comprised a reduced pressure heat-treating device proper 13 having built therein a base adapted to support thereon a sample and furnished with a heater (hot plate) 12, an oxidizing gas source 15 and a reducing gas source 16 connected to the reduced pressure heat-treating device proper 13 through the medium of valves 14a and 14b, a rotary pump 18 connected to the reduced pressure heat-treating device proper 13 through the medium of a valve 14c and a filter 17 and adapted to evacuate the interior of the reduced pressure heat-treating device proper 13, and vacuum gages 19a and 19b installed respectively on the gas supply side and the discharge side of the reduced pressure heat-treating device proper 13. This reduced pressure heat-treating device had an ultimate vacuum degree of $10^{-7}$ Torr in the discharge system of a turbo molecular pump and was constructed to introduce a varying gas through a gas supply (inlet) line.

Figure 4A:
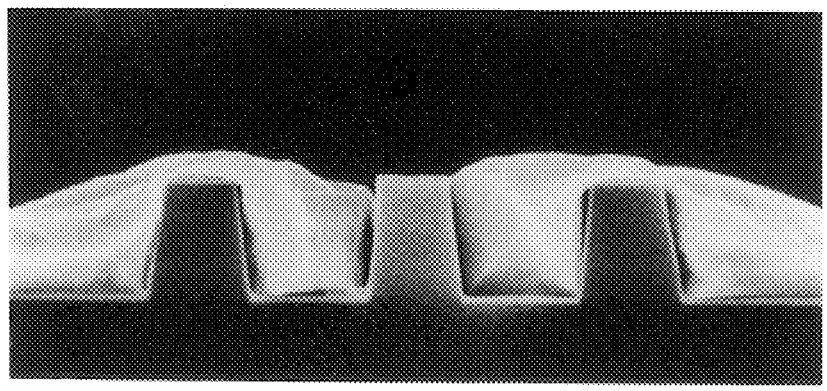
FIG. 4A is a photomicrograph showing the cross section of a Cu film after the step of flow in the method for the production of a semiconductor device according to this invention.

The Si substrate 9 having the Cu film 8 formed thereon was set in place on the hot plate 12 mentioned above and the device was evacuated with the turbo molecular pump 5 to $10^{-7}$ Torr. Then, the oxygen was supplied from the oxidizing gas ($O_2$ 21% and $N_2$ 79%) source 15 and, with the pressure in the chamber set at $4 \times 10^{-6}$ Torr, the Si substrate 9 was heat-treated at 600° C. for 10 minutes. As a result, the flow of the substrate into the trenches was confirmed as shown in FIG. 4A.

Figure 4B:
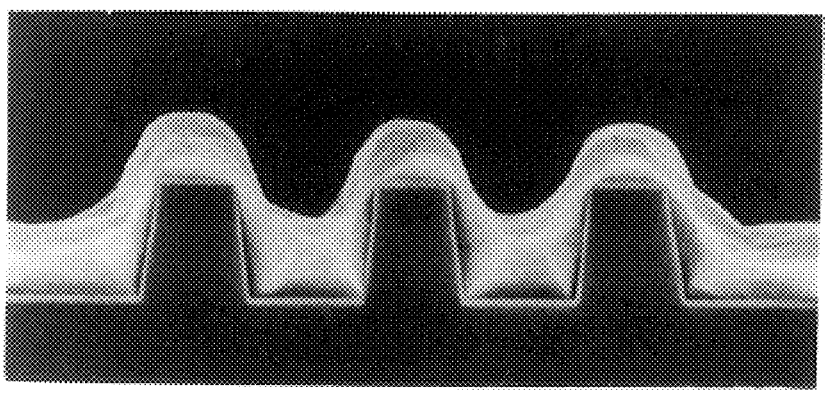
FIG. 4B is a photomicrograph showing the cross section of a Cu film of a comparative example in comparison with that of the example shown in FIG. 4A.

For a comparative example, the heat treatment was carried out in a vacuum of $1 \times 10^{-7}$ Torr at 650° C. for 10 minutes. The results were as shown in FIG. 4B.

The promotion of the flow mentioned above was confirmed to occur in the heat treatment performed at a temperature of not less than 400° C. under the partial pressure of oxygen of not more than $1 \times 10^{-5}$ Torr. When the partial pressure of oxygen exceeded the level just mentioned, the oxidation proceeded on the surface and the flow was repressed. A interconnection produced by the CMP method was found to have specific resistance of 2.0 $\mu\Omega$cm.

In this example, after the formation of the Cu film, the flow was promoted by the supply of the oxidizing gas. While the formation of the film was continued with the temperature of the substrate kept in the range of from 350° C. to 450° C., the effect of promoting the flow was recognized to occur when the oxidizing gas was introduced under the partial pressure of oxygen of not more than $5 \times 10^{-5}$ Torr.

EXAMPLE 2

Figure 2A:
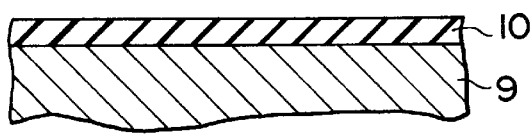
FIGS. 2A, 2B, 2C, and 2D are schematic cross sections showing the manner of forming an electrode line in the method for the production of a semiconductor device according to this invention.
Figure 2B:
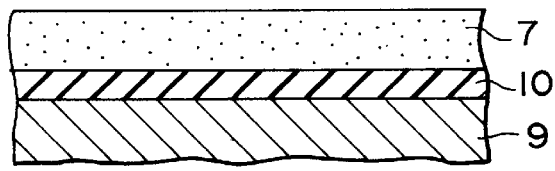

In the same manner as in Example 1, a p-SiN insulating film 10 was formed in a thickness of 100 nm as an undercoating layer on a Si substrate (100) 9 having a necessary active region formed in advance therein as shown in the cross section of FIG. 2A. A $SiO_2$ film 7 was formed in a thickness of 400 nm by the CVD technique as shown in the cross section of FIG. 2B. Then, a multiplicity of trenches 6 measuring 400 nm in width were formed as spaced at an interval of 800 nm in the $SiO_2$ film 7 by the PEP and PIE techniques as shown in the cross section of FIG. 2C. On the surface of the $SiO_2$ film 7 having the trenches 6 formed therein, a barrier layer 11 of TiN was formed in a thickness of 30 nm and then a Cu film 8 was formed in a thickness of 800 nm by sputtering as shown in the cross section of FIG. 2D. In this case, prior to the deposition of the barrier layer 11 and the Cu film 8, contact holes (via holes) were embedded preparatorily by the selective CVD method to establish a connection with the active region.

Subsequently, the resultant laminate was subjected to a heat treatment accompanied by an oxidation-reduction reaction by the use of a reduced pressure heat-treating device constructed as shown in FIG. 3 similarly to the preceding example.

The Si substrate 9 having the Cu film 8 deposited thereon was set in place on the hot plate 12 and the device was evacuated by a rotary pump 18 to a vacuum degree of about 0.01 Torr. After the evacuation, the Si substrate was heat-treated at 450° C. for 30 minutes under the environment of the conditions shown in Table 1 to flow the Cu film 8. In Table 1, only reducing gases of $H_2$ 100% and $H_2$ 10%-$N_2$ 90% are shown as feed gas. In all the test runs, an oxidizing gas composed of $O_2$ 20% and $N_2$ 80% was invariably supplied at a flow volume of 0.1 liter/min downward from above the reduced pressure heat-treating device proper 13 through the adjustment of the valve 24a.

TABLE 1

| Gas species | $H_2$ 100% | — | | $H_2$ 10%—$N_2$ 90% | | |
|---|---|---|---|---|---|---|
| Flow rate l/min | 0.3 | — | 0.4 | 0.5 | 1 | 1 |

TABLE 1-continued

| pressure | Reduced pressure | Reduced pressure | Reduced pressure | Reduced pressure | reduced pressure | Atmospheric pressure |
|---|---|---|---|---|---|---|
| Flow shape | ○ | x | Δ | ○ | ○ | Δ |

Figure 5:
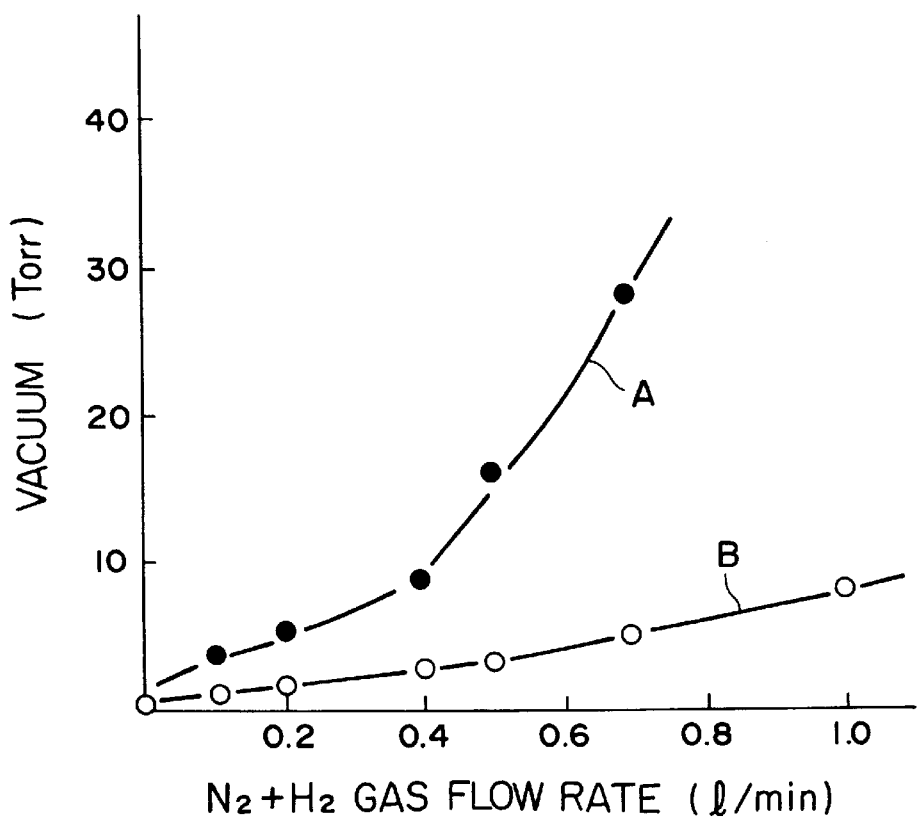
FIG. 5 is a diagram showing the relation between the flow volume of a reducing gas and the inner pressure of a heat-treating device during the flow in the method for the production of a semiconductor device according to this invention.

After the heat treatment, each sample was cooled and visually examined by SEM to determine the state of flow. The results are also shown in Table 1. The state of flow was rated on the three-point scale, wherein ○ stands for an amount of embedment of not less than 110% of the depth of groove, Δ for an amount of embedment in the range of from 100 to 110% of the depth of trench, and x for an amount of embedment of less than 100% of the depth of groove. In the heat treatment, the relations between the flow volumes of the reducing gas on the feed side (curve A) and the discharge side (curve B) and the inner pressure of the heat-treating device were as shown in FIG. 5.

The samples whose states of flow were rated as ○ were further fabricated by CMP to form a line and the produced lines were rated by SEM. The results were invariably satisfactory. They were tested for electrical resistance by the four terminal method. The electrical resistance was found to be 1.8 $\mu\Omega$cm. In the samples whose flow volumes of the reducing gas ($H_2$ 10%-$N_2$ 90%) were not more than 0.4 liters/min, their surfaces were coated with a Cu oxide film because their partial pressures of the oxidizing gas and the reducing gas were in the oxide region relative to the Cu film.

EXAMPLE 3

Electrode wirings were formed by following the procedure of Example 2 while using $O_2$, $H_2O$, or $O_2$-$H_2O$ as oxidizing gas and $H_2$ or $H_2$ 80%-CO 20% as reducing gas and repeating the supply of the oxidizing gas and the reducing gas at varying intervals (min) under the conditions shown in Table 2.

In alternately forwarding the oxidizing gas and the reducing gas, 10 seconds' intervals were interjected for the purpose of evacuation, the flow volume of gas was fixed at 0.1 liters/min, and the heat treatment was carried out under the conditions of 450° C. and 30 minutes. During the remainder of time after the repeated supply of the oxidizing gas and the reducing gas and during the cooling of the Cu film, $H_2$ 100% was supplied at a flow volume of 0.1 liters/min.

TABLE 2

|  | Reducing gas | | | | | |
|---|---|---|---|---|---|---|
|  | $H_2$ 100% | | | $H_2$ 80% - CO 20% | | |
| Interval (sec) | 5 | 0.5 | 0.5 | 0.5 | 0.5 | 0.5 |
| Oxidizing gas | $O_2$ | $O_2$ | $H_2O$ | $H_2O$ | $O_2$ | $O_2$—$H_2O$ |
| Interval (sec) | 5 | 0.5 | 0.5 | 0.5 | 0.5 | 0.5 |
| Number of times | 3 | 20 | 20 | 20 | 20 | 20 |
| Flow Shape | Δ | ○ | ○ | ○ | ○ | ○ |

After the heat treatment, each sample was cooled and visually examined by SEM to determine the state of flow. The results are also shown in Table 2. The state of flow was rated on the two-point scale, wherein ○ stands for an amount of embedment of not less than 110% of the depth of trench and Δ for an amount of embedment in the range of from 100 to 110% of the depth of groove.

The samples whose states of flow were rated as ○ invariably had amounts of oxidation of Cu film of not more than 20% of the thickness of film. They were further fabricated by CMP to form a line. When the produced lines were rated by SEM, the results were invariably satisfactory. The samples after the flow were tested by SIMS for the amount of Cu diffused in the Si substrate. No discernible diffusion was detected in any of the samples.

EXAMPLE 4

Electrode lines were formed by following the procedure of Example 2 while using $H_2$ as a reducing gas and $O_2$ as an oxidizing gas and performing the flow treatment under such conditions of partial pressure ratio ($PH_2/PO_2$), total gas pressure, heat treatment temperature, and time as respectively shown in Tables 3, 4, 5, and 6.

TABLE 3

| Total gas pressure (Torr) | 4 | 4 | 4 | 4 | 4 | 4 |
|---|---|---|---|---|---|---|
| Partial pressure ratio ($PH_2/PO_2$) | 2 | 3 | 5 | 10 | 15 | 20 |
| Temperature of heat treatment (° C.) | 450 | 450 | 450 | 450 | 450 | 450 |
| Duration of heat treatment (min) | 30 | 30 | 30 | 30 | 30 | 30 |
| Shape of flow | oxidizing | ○ | ○ | ○ | Δ | x |

TABLE 4

| Total gas pressure (Torr) | 10 | 10 | 10 | 10 | 10 | 10 |
|---|---|---|---|---|---|---|
| Partial pressure ratio ($PH_2/PO_2$) | 2 | 3 | 5 | 10 | 15 | 20 |
| Temperature of heat treatment (° C.) | 450 | 450 | 450 | 450 | 450 | 450 |
| Duration of heat treatment (min) | 30 | 30 | 30 | 30 | 30 | 30 |
| Shape of flow | oxidizing | ○ | ○ | ○ | ○ | Δ |

TABLE 5

| Total gas pressure (Torr) | 10 | 10 | 10 | 10 | 10 | 10 |
|---|---|---|---|---|---|---|
| Partial pressure ratio ($PH_2/PO_2$) | 2 | 3 | 5 | 10 | 15 | 20 |
| Temperature of heat treatment (° C.) | 350 | 350 | 350 | 350 | 350 | 350 |
| Duration of heat treatment (min) | 30 | 30 | 30 | 30 | 30 | 30 |
| Shape of flow | oxidizing | oxidizing | ○ | ○ | Δ | x |

TABLE 6

| Total gas pressure (Torr) | 10 | 10 | 10 | 10 | 10 | 10 |
|---|---|---|---|---|---|---|
| Partial pressure ratio ($PH_2/PO_2$) | 5 | 5 | 5 | 5 | 5 | 5 |
| Temperature of heat treatment (° C.) | 400 | 400 | 350 | 350 | 350 | 350 |
| Duration of heat treatment (min) | 2 | 5 | 2 | 5 | 10 | 15 |
| Shape of flow | x | ○ | x | x | Δ | ○ |

After the heat treatment, the samples were cooled in an ambience of pure hydrogen under a pressure of 20 Torr to avoid possible influence of oxidation. They were visually examined by SEM to determine their states of flow. The results are also shown in Tables 3, 4, 5, and 6. The results were rated on the three-point scale, wherein ○ stands for an amount of embedment of not less than 110% of the depth of trench, Δ for an amount of embedment in the range of from 100 to 110% of the depth of trench and x for an amount of embedment of less than 100% of the depth of trench owing to insufficiency of the oxidation-reduction reaction.

Incidentally, when the cooling was carried out by the use of a forming gas ($H_2$ 20% and $N_2$ 80%) instead of the ambience of pure hydrogen under the pressure of 20 Torr, the results were same. The same operation and effect were observed when the material for the barrier layer was switched from TiN to Ta, Cr, TiW, Nb, amorphous TiSiN, amorphous WCo, amorphous NBCr, amorphous CrTa, amorphous CoV, amorphous CoMo, amorphous NbCo, amorphous CoTa, amorphous TaCu, amorphous WN, or amorphous WSiN, for example.

EXAMPLE 5

On a Si substrate (100) having a necessary active region formed therein, a p-SiN film was first formed in a thickness of 100 nm as an undercoating layer, a $SiO_2$ film was then superposed thereon by the CVD method in a thickness of 400 nm, and a multiplicity of grooves 400 nm in width were thereafter formed as spaced at an interval of 800 nm in the $SiO_2$ film by the PEP and RIE.

Then, a barrier layer of TiN was formed in a thickness of 30 nm on the surface of the $SiO_2$ film having the grooves formed therein as described above and a Cu film was superposed thereon in a thickness of 250 nm by the CVD method. In this case, prior to the formation of the barrier layer and the Cu film, contact holes were formed by the selective CVD method to establish contact with the active region.

The $SiO_2$ film and the Cu film mentioned above were formed by the heat CVD method respectively using hexafluoroacetylacetonate trimethylvinylsilane copper, [($CF_3CO$)$_2CH$] $Cu(C_5H_{12}Si)$, as raw material.

The temperature of film formation and deposition was 200° C., the partial pressure of raw material gas was 0.25 Torr, the flow speed of raw material gas was 8 sccm, and the speed of film formation was 4 nm/sec. Thereafter, in the same manner as in Example 2, $O_2$ 20%-$N_2$ 80% was supplied downward at a flow volume of 0.1 liters/min from above the heat-treating device and meanwhile a reducing gas of $H_2$ 10%-$N_2$ 90% was simultaneously supplied at a flow volume of 0.5 liter/min for 30 minutes to flow the Cu film mentioned above at 300° C.

Figure 6A:
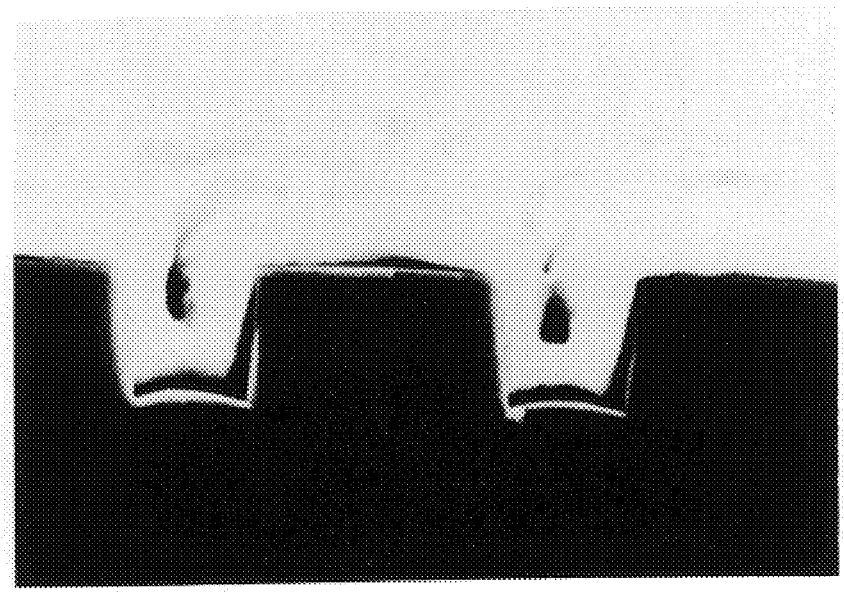
FIG. 6A is a photomicrograph showing the cross section of a Cu film before the step of flow in the method for the production of a semiconductor device according to this invention.
Figure 6B:
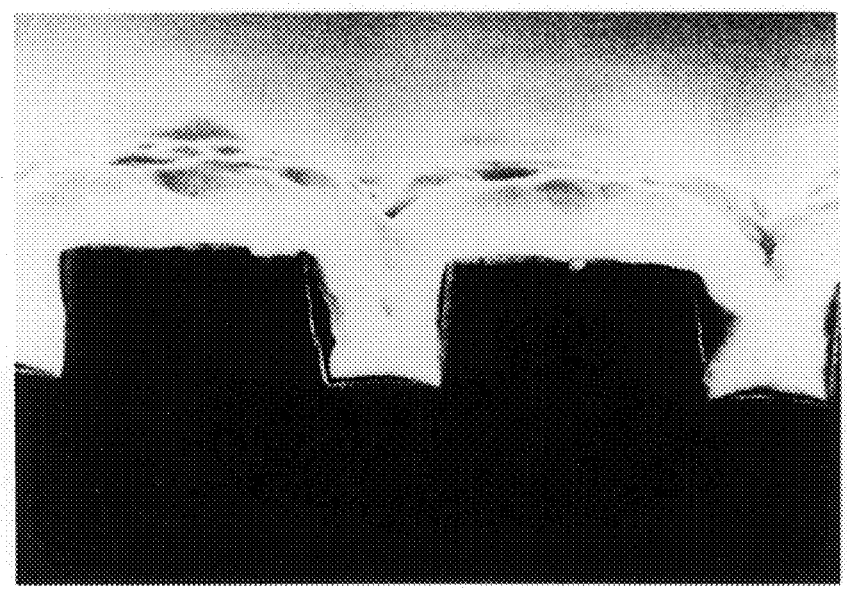
FIG. 6B is a photomicrograph showing the cross section of a Cu film after the step of flow in the method for the production of a semiconductor device according to this invention.

The sample was cooled and then visually examined by SEM to determine the state of flow. The results were satisfactory. The amount of embedment in trench was 127% of the depth of trench similarly to that obtained in the Cu film deposited by sputtering. During the cooling, $H_2$ 100% was supplied at a flow volume of 1 liter/min. FIG. 6A and FIG. 6B are photomicrographs showing the states of cross section obtained before and after the flow of the Cu film in the present example.

The sample was further fabricated by CMP to form a wiring and the produced line was rated by SEM. The results were satisfactory. It was tested for electrical resistance by the four terminal method. The electric resistance was found to be 1.9 $\mu\Omega$cm.

EXAMPLE 6

Figure 2C:
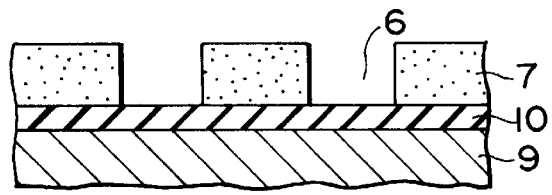
Figure 2D:
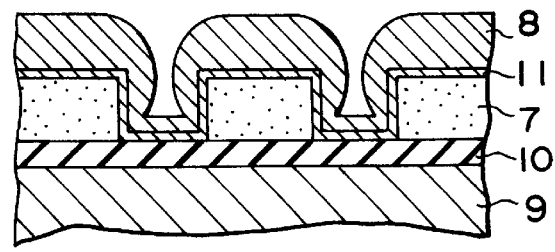

A p-SiN film was first formed in a thickness of 100 nm as an undercoating layer on a Si substrate (100) having a necessary active region formed therein, a $SiO_2$ film was then superposed thereon by the CVD method in a thickness of 400 nm, and a multiplicity of grooves 400 nm in width were thereafter formed as spaced at an interval of 800 nm in the $SiO_2$ film by the PEP and RIE as shown in the cross section of FIG. 2C.

Then, a barrier layer of TiN was formed in a thickness of 30 nm on the surface of the $SiO_2$ film having the grooves formed therein as described above and a Cu film was further superposed thereon in a thickness of 800 nm by the use of a high-vacuum sputtering device. In this case, prior to the formation of the barrier layer and the Cu film, contact holes were preparatorily formed by the selective CVD method to establish contact with the active region. The deposition of the Cu film by sputtering was carried out by using Cu of purity 7N as the sputter source under an ultimate vacuum degree of $1 \times 10^{-8}$ Torr, in an ambience of high-purity Ar gas (dew point not more than −90° C.), under a pressure of 5 mTorrs, at a deposition rate of 15 nm/sec.

Figure 7:
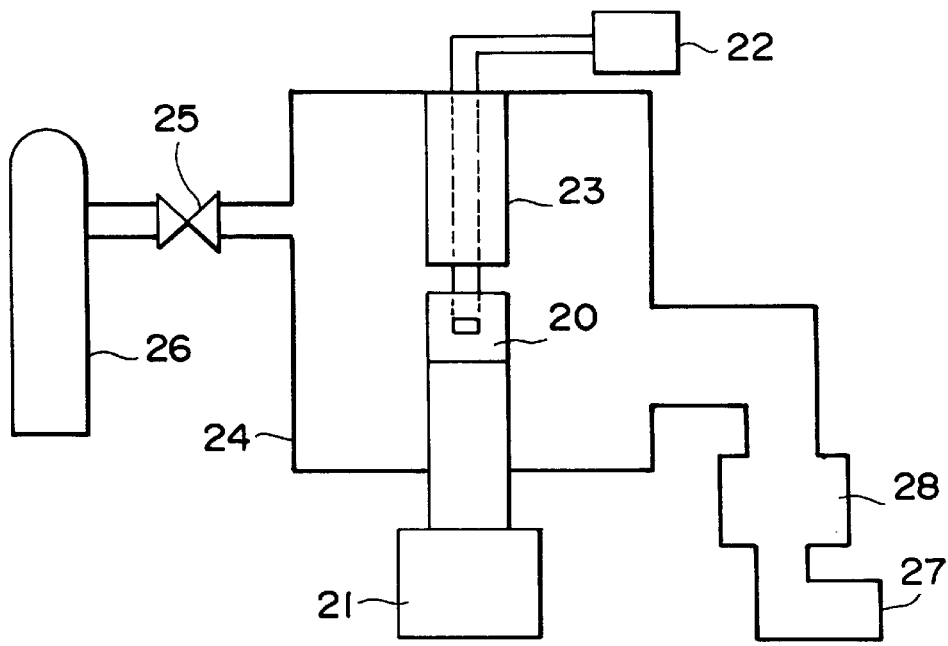
FIG. 7 is a schematic diagram showing the construction of a pressing and heat-treating device to be used in the method for the production of a semiconductor device according to this invention.

Then, the sample was subjected to a pressure heat treatment under application of uniaxial stress by the use of a pressing heat-treating device constructed as schematically shown in FIG. 7. This pressing heat-treating device comprised a stand 20 made of carbon and adapted to support a sample, a hydraulic mechanism 21 for moving the carbon stand 20 in the vertical direction, a pressing member 23 provided with a heater power source 22 adapted to depress the upper surface of the carbon stand 20 elevated by the hydraulic mechanism 21, a pressing heat-treating device proper 24 accommodating the pressing member 23, a reducing gas source 26 connected to the pressing heat-treating device proper 24 through the medium of a valve 25, and a rotary pump 27 and an oil diffusing pump 28 connected to the pressure heat-treating device proper 24 and adapted to evacuate the interior of the pressing heat-treating device proper 24.

Figure 8:
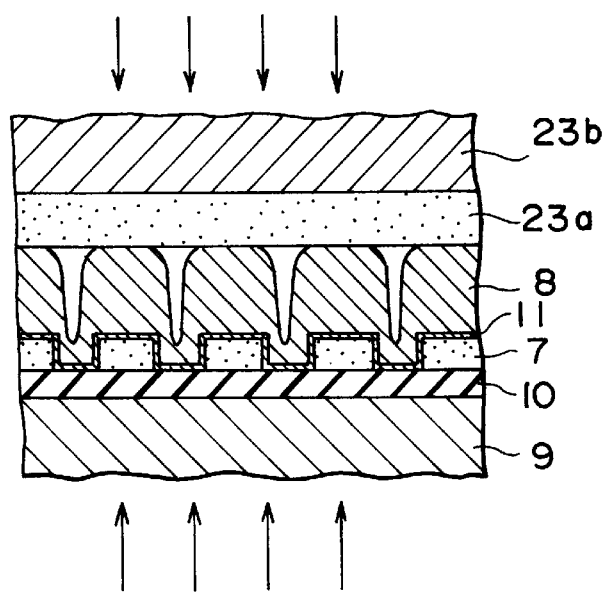
FIG. 8 is a schematic cross-sectional diagram showing the state of a uniaxial pressure heat treatment in the method for the production of a semiconductor device according to this invention.

This pressing heat-treating device has an ultimate vacuum degree of $10^{-7}$ Torr and is so constructed as to introduce a varying gas via a gas feed (inlet) line and is further provided at the leading end part of the pressing member 23 with a Si piece 23b furnished with a $SiO_2$ layer 23a as shown in FIG. 8.

The Si substrate having the Cu film formed thereon as described above was set in place on the carbon stand 20. Then, the pressing heat-treating device proper 24 was evacuated to a vacuum by the rotary pump 27 and the oil diffusing pump 28. The degree of vacuum attained at this time was about $1 \times 10^{-7}$ Torr. After this evacuation to the vacuum, a reducing gas (forming gas) of $N_2$ 90%-$H_2$ 10% was supplied under an atmospheric pressure at a flow volume of 0.1 liters/min and a pressure heat-treatment was carried out at 300° C. for 30 minutes or at 450° C. for 30 minutes, with the magnitude of pressure exerted by the pressing member 23 on the Cu film varied.

The results are shown in Table 7 and Table 8. FIG. 8 shows schematically the state of impartation of pressure (uniaxial stress) on the Cu film of the sample.

Table 7 shows the results obtained in the heat treatment using a temperature of 300° C. and Table 8 those in the treatment using a temperature of 450° C. The degree of flow (shape of line) was rated by the radio of the depth D of a trench to the minimum thickness $D_{min}$ of the Cu film ($D_{min}/D$).

TABLE 7

| | Stress exerted kgf/mm² | | | | | | |
|---|---|---|---|---|---|---|---|
| | 0.5 | 1 | 2 | 4 | 7 | 10 | 16 | 50 |
| Shape of line | x | ○ | ○ | ○ | ○ | ○ | ○ | — |
| Electrical resistance μΩcm | — | 1.9 | 1.9 | 1.9 | 1.9 | 1.9 | 1.9 | — |

TABLE 8

| | Stress exerted kgf/mm² | | | | | |
|---|---|---|---|---|---|---|
| | 2 | 4 | 7 | 10 | 16 | 50 |
| Shape of line | ○ | ○ | ○ | ○ | ○ | — |
| Electrical resistance μΩcm | 1.8 | 1.8 | 1.8 | 1.9 | 1.9 | — |

In Table 7 and Table 8, the mark ○ designates that the ratio, $D_{min}/D$, is not less than 1.2, the mark x designates that the ratio is less than 1, and the mark—designates that the ratio is not measurable. It is added for the sake of information that when the aforementioned heat treatment was carried out in the absence of the stress, the flow was not enough to permit formation of an electrode wiring.

Figure 9:
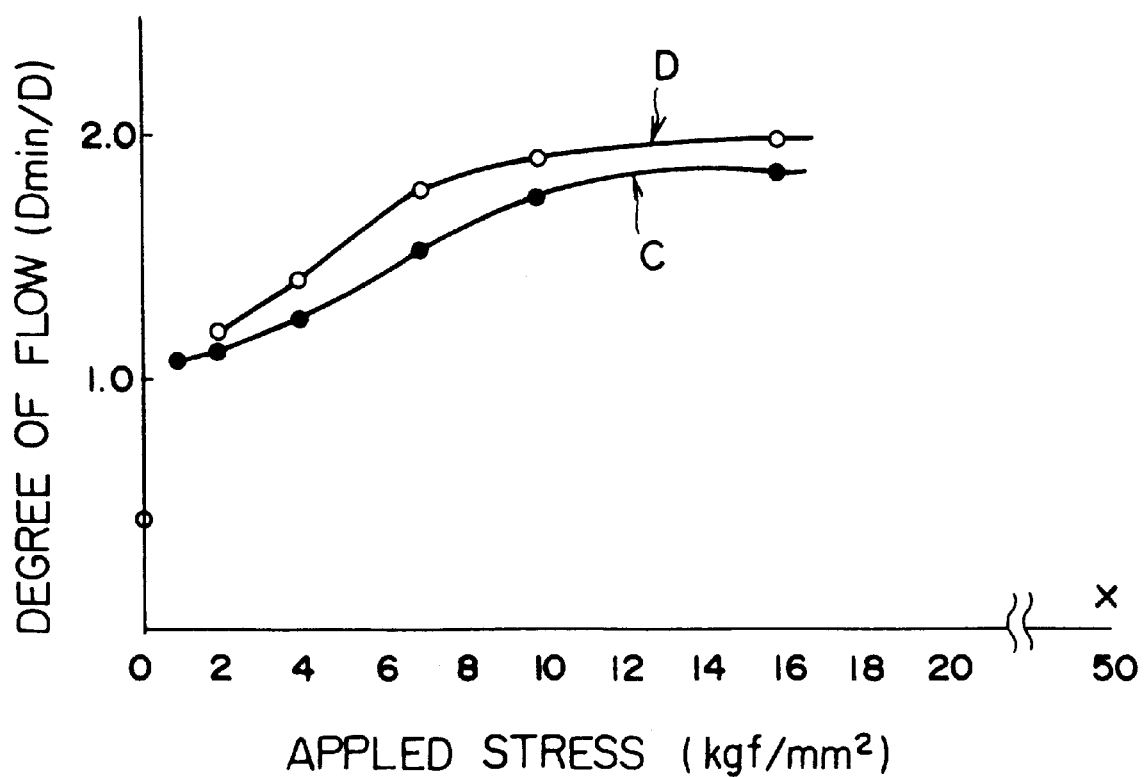
FIG. 9 is a diagram showing by curves the typical relation between uniaxial stress and flow degree in the method for the production of a semiconductor device according to this invention.

FIG. 9 illustrates the relation between the degree of flow ($D_{min}/D$) and the applied stress, kgf/mm², under the flow conditions mentioned above. The curve C represents the results obtained when the temperature of the heat treatment was 300° C. and the curve D those obtained when the temperature was 450° C.

It is noted from FIG. 9 that the degree with which the flow proceeded increased in proportion as the stress applied and the temperature of the treatment increased. The sample was found to incur plastic deformation when the applied stress was 16 kgf/mm² and the Si substrate of the sample sustained breakage when the applied stress was 50 kgf/mm².

Figure 10A:
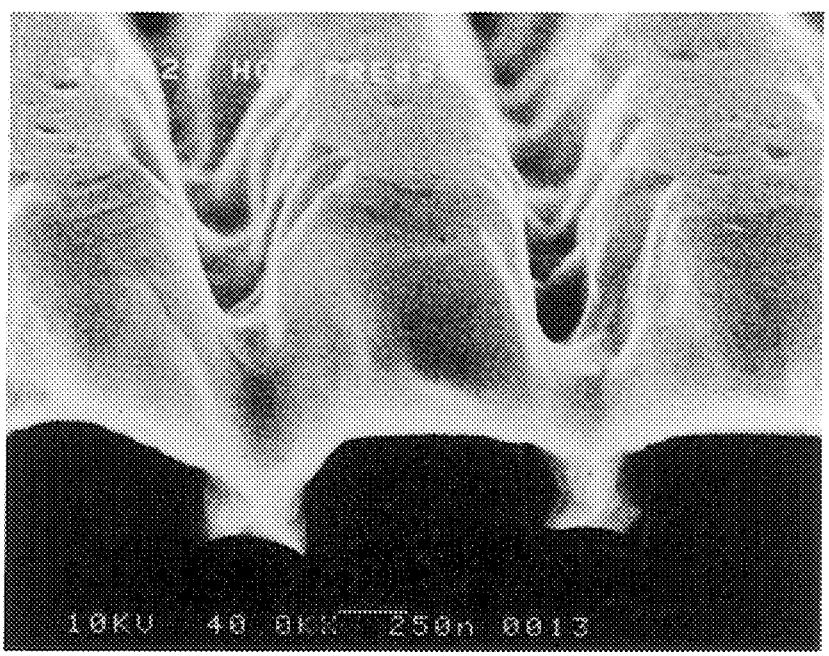
FIG. 10A is a photomicrograph showing the result of a flow effected by exertion of uniaxial stress in the method for the production of a semiconductor device according to this invention.
Figure 10B:
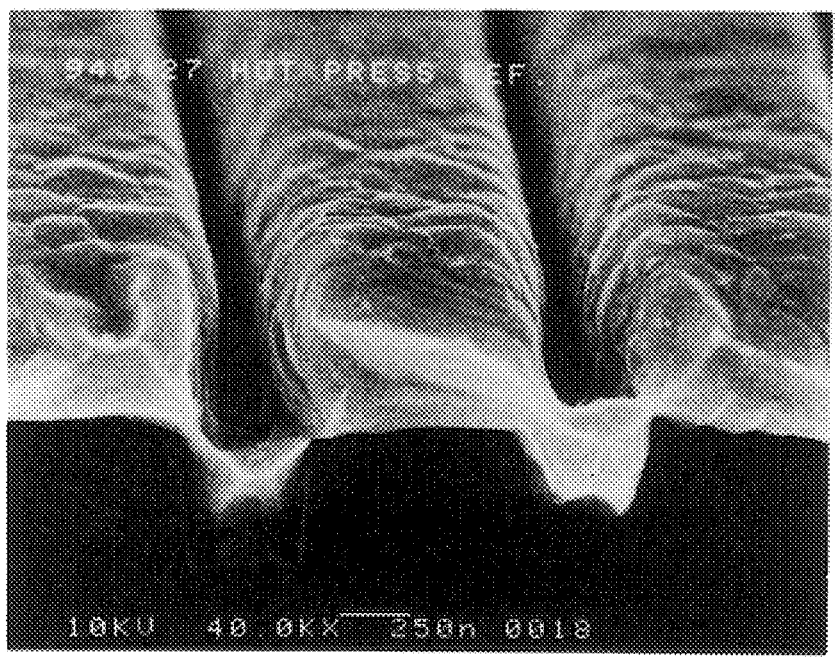
FIG. 10B is a photomicrograph showing the result of a flow effected without exertion of uniaxial stress in the method for the production of a semiconductor device of a comparative example.

The sample in which the flow was caused by the heat treatment at 300° C. for 30 minutes under a stress of 7 kgf/mm² and the sample in which the flow was caused by the heat treatment at 300° C. for 30 minutes without application of stress were photomicrographed. The photographs showing the states of flow were visually observed and compared. The results are shown in FIG. 10A and FIG. 10B. FIG. 10A showing the results of the sample in which the flow was effected under the application of stress clearly indicates that the removal of excess Cu by the CMP allowed formation of a highly satisfactory electrode line. FIG. 10B showing the results of the sample in which the flow was effected in the absence of applied stress indicates that a desired electrode line could not be formed on account of insufficiency of the flow.

Table 7 and Table 8 additionally show the test results (averages each of numerical values found for 50 test pieces) obtained by selecting 1-mm portions (test pieces) of the samples having an electrode line formed by flowing a Cu film by the heat treatment mentioned above and measuring the electrical resistance in the 1-mm portions by the four terminal method.

Here, the flow temperature of the Cu film could be lowered by exerting a stress of not less than 1 kgf/mm² on the Cu film. It was found that the flow temperature of the Cu film could be conspicuously lowered particularly when the stress applied was not less than 2 kgf/mm².

In the present example, when a plurality of Si substrates each having a Cu film formed thereon were superposed and subjected collectively to the pressure heat-treatment to flow the Cu films in the superposed Si substrates, the same results as mentioned above were obtained.

COMPARATIVE EXAMPLE 1

A Si substrate having a necessary Cu film formed thereon by following the procedure of Example 6 was subjected to a heat treatment under application of hydrostatic pressure instead of the exertion of uniaxial stress to flow the Cu film and form an electrode line. The electrode line thus obtained was rated. It was consequently found that a interconnection fit for practical use could not be obtained unless the temperature of the heat treatment exceeded 450° C. and the duration of the heat treatment exceeded 30 minutes. These conditions of the heat treatment, however, were at a disadvantage in complicating the process of work and impairing the mass-producibility.

EXAMPLE 7

A p-SiN film was first formed in a thickness of 100 nm as an undercoating layer on a Si substrate (100) having a necessary active region formed therein, a $SiO_2$ film was then superposed thereon by the CVD method in a thickness of 400 nm, and a multiplicity of grooves 400 nm in width were thereafter formed as spaced at an interval of 800 nm in the $SiO_2$ film by the PEP and RIE as shown in the cross section of FIG. 2C.

Then, a barrier layer of TiN was formed in a thickness of 30 nm on the surface of the $SiO_2$ film having the trenches formed therein as described above and an Al film was further superposed thereon in a thickness of 800 nm by the use of a high-vacuum sputtering device. In this case, prior to the deposition of the barrier layer and the Al film, contact holes were preparatorily formed by the selective CVD method to establish contact with the active region.

The deposition of the Al film by sputtering was carried out by using Al of purity 5N as the sputter source under an ultimate vacuum degree of $1 \times 10^{-8}$ Torr, in an ambience of high-purity Ar gas (dew point not more than −90° C.), under a pressure of 5 mTorrs, at deposition rate of 10 nm/sec.

Figure 11:
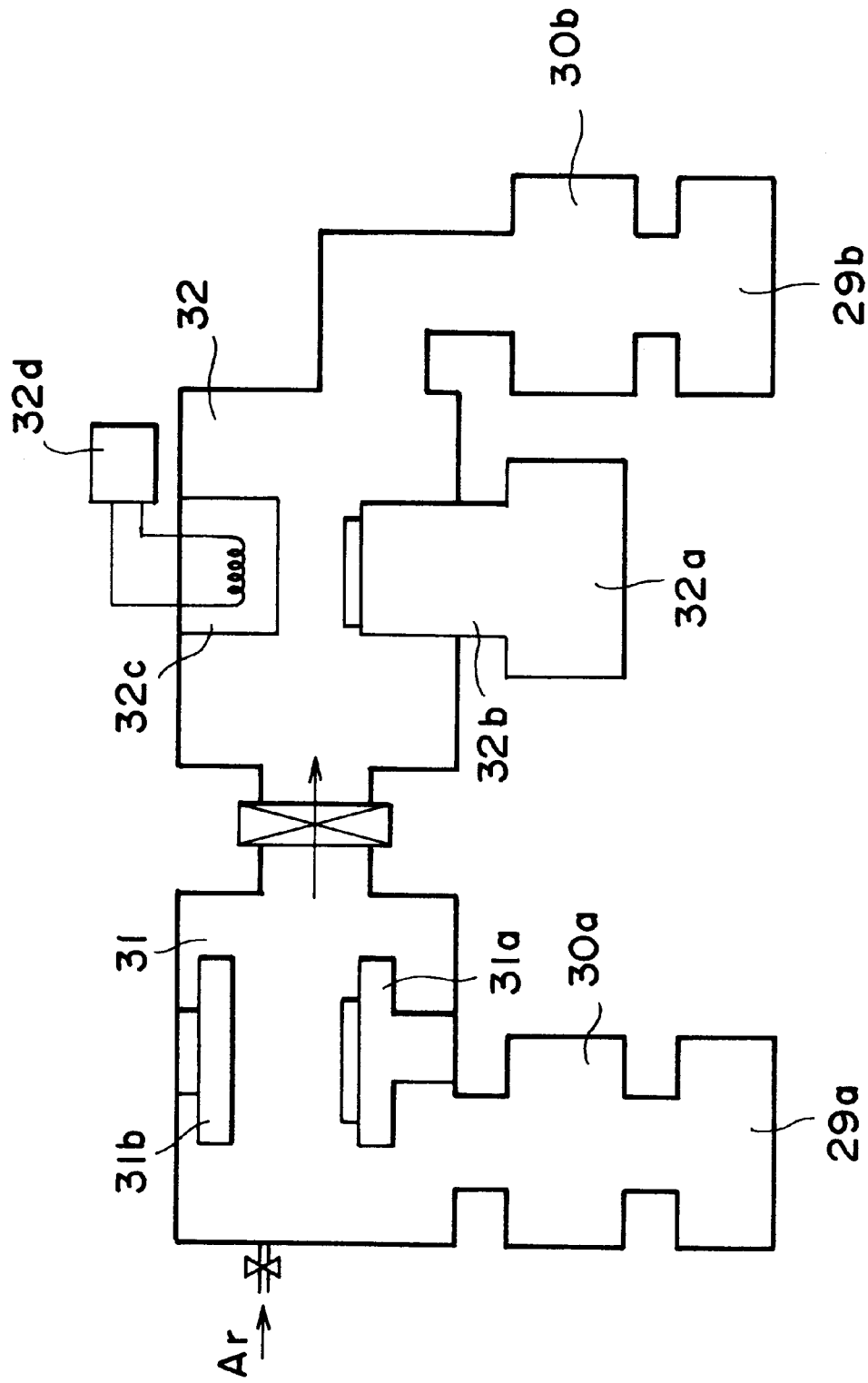
FIG. 11 is a schematic diagram showing the construction of a sputter•opressure•heat-treating device to be used in the method for the production of a semiconductor device according to this invention.

FIG. 11 schematically shows the construction of a sputter pressure heat-treating device in which the sputter region and a region for heat-treating the deposited Al film under application of uniaxial stress are installed in one same vacuum system. In FIG. 11, 29a and 29b stand for rotary pumps, 30a and 30b stand for turbo molecular pumps, 31 stands for a sputter region having a substrate supporting base 31a and an Al target retaining part 31b disposed therein, 32 stands for a heat-treating region (hot press chamber) provided with a load cell 32b moved in a vertical direction by a hydraulic mechanism 32a and adapted to support a sample and a pressing member 32c having built therein a heater opposed to the load cell 32b, and 32d stands for a heater power source for heating the pressing member 32c.

Then, the Al film was formed in the sputter region 31 of the sputter-pressure heat-treating device mentioned above, conveyed onto the load cell 32b of the heat-treating region 32, and subjected to a pressure heat-treatment under uniaxial stress of 1 kgf/mm² generated between the load cell 32b and the pressing member 32c by the operation of the hydraulic mechanism 32a at 250° C., 350° C., or 450° C. for 30 min to flow the Al film and form electrode lines.

The relation between the degree of flow expressed by the ratio of the thickness, $D_{min}$, of the Al film embedded in the trench by the flow and the depth, D, of the trench and the flow conditions mentioned above is shown by the curve E in FIG. 12. For the sake of comparison, the relation obtained of a sample produced without using the uniaxial stress in the flow treatment is shown by the curve F.

Figure 12:
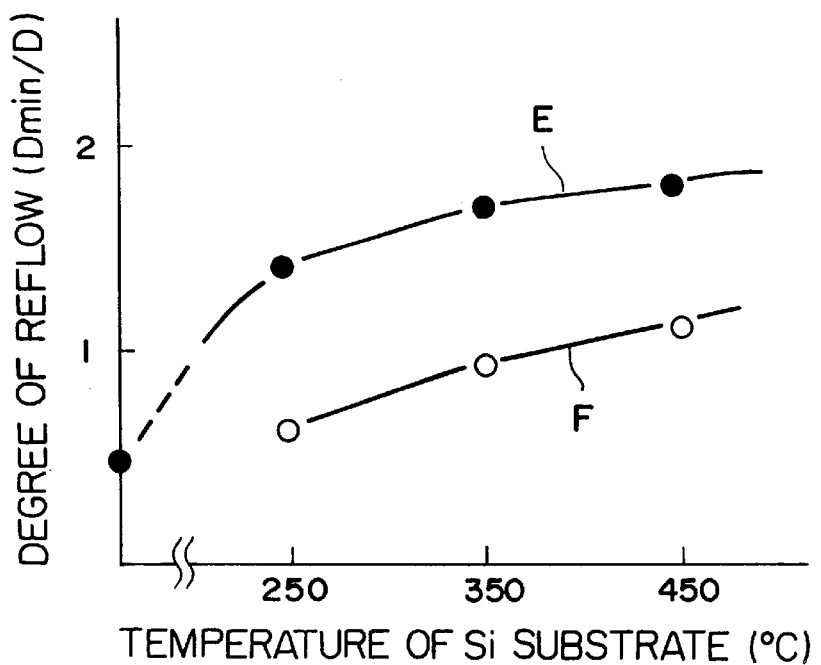
FIG. 12 is a diagram showing in curves the relation between the degree of flow and the Si substrate temperature obtained when the flow is effected by exertion of uniaxial stress in another method for the production of a semiconductor device according to this invention in comparison with that obtained when the flow is effected without exertion of uniaxial stress.

It is clearly noted from FIG. 12 that the flow temperature of the Al film could be markedly lowered by exerting a uniaxial stress of 1 kgf/mm² on the Al film. When the samples of the preceding examples were fabricated by CMP for the formation of a line and the produced lines were tested for electrical resistance by the four terminal method. The resistance was found to be 2.8 $\mu\Omega$cm.

EXAMPLE 8

Samples were prepared by following the procedure of Example 2 up to the step of formation of a barrier layer of TiN. Then, by means of a multi-sputtering device using 7N Cu and 6N Ag as target sources, single layer films and laminated films indicated in Table 9 and Table 10 were formed at an ultimate vacuum degree of 1×10⁻⁹ Torr in an ambience of high-uirity Ar gas (dew point not more than −90° C.) under a pressure of 5 mTorrs at a varying film-forming speed of 1 to 10 nm/sec.

TABLE 9

| Cu film (nm) | 600 | 500 | 400 | 300 | 200 | — |
|---|---|---|---|---|---|---|
| Ag film (nm) | — | 100 | 200 | 300 | 400 | — |
| Shape of line | x | Δ | ○ | ○ | ○ | x |
| Electrical resistance ($\mu\Omega$cm) | — | 2.2 | 2.0 | 2.0 | 2.1 | — |

TABLE 10

| Cu film (nm) | 500 | 100 | 50 | 25 |
|---|---|---|---|---|
| Ag film (nm) | 100 | 20 | 10 | 5 |
| Cycle of superposition | 1 | 5 | 10 | 20 |
| $D_{min}$/D | 1.0 | 1.2 | 1.4 | 1.5 |
| Shape of line | Δ | ○ | ○ | ○ |
| Electrical resistance ($\mu\Omega$cm) | 2.2 | 2.0 | 2.0 | 2.0 |

Then, the samples having the aforementioned single layer films and laminated films formed therein were heat-treated in the reduced pressure heat-treating device shown in FIG. 3 at 450° C. for 30 minutes, with a reducing gas of $N_2$ 90%-$H_2$ 10% supplied thereto at a flow volume of 1 liter/min, to flow a metal film and form an electrode wiring.

The degrees of flow expressed by the ratio of the thickness, $D_{min}$, of a metal film embedded by the flow in a trench and the depth, D, of the trench and the results of the test for electrical resistance performed by the four terminal method on samples having an electrode line formed by the CMP are shown additionally in Table 9 and Table 10. It is clearly noted from Table 10 that the degree of flow improved in proportion as the numbers of Cu films and Ag films superposed increased. This trend may be ascribed to an effect of decreasing interface energy and an effect of entropy of the mixture of Cu and Ag.

EXAMPLE 9

Cu films were formed by following the procedure of Example 2 while using 7N Cu as a target material, setting the deposition rate at 10 nm/sec, fixing the temperature of the Si substrate at the temperature of liquid nitrogen or at room temperature (23° C.), and applying a bias voltage to the Si substrate.

The samples consequently obtained were heat-treated at 300° C. for 30 minutes while supplying an oxidizing gas of $O_2$ 20%-$N_2$ 80% at a flow volume of 0.1 liters/min and a reducing gas of $N_2$ 90%-$H_2$ 10% at a flow volume of 1 liter/min, to flow the Cu film and form an electrode lines.

The degrees of flow expressed by the ratio of the thickness, $D_{min}$, of the Cu film embedded in the trench by flow and the depth, D, of the trench are additionally shown in Table 11. The samples prior to undergoing the flow treatment mentioned above were tested for the grain size of the Cu film by TEM and for the stress perpendicular to the direction of length of the trenches for line by the stress X-ray. The results are also shown in Table 11.

It is clearly noted from Table 11 that the grain size decreased, the absolute value of the stress in the film increased, and the degree of flow increased in proportion as the temperature of the Si substrate decreased or the bias voltage to the Si substrate increased.

TABLE 11

| Temperature of substrate ° C. | −196 | 23 | 23 | 23 | 23 | −196 | 23 |
|---|---|---|---|---|---|---|---|
| Substrate bias, V | 0 | −10 | −30 | −50 | −100 | −30 | 0 |

TABLE 11-continued

| Degree of flow | 1.5 | 0.9 | 1.0 | 1.2 | 1.5 | 1.5 | 0.9 |
|---|---|---|---|---|---|---|---|
| Grain size, μm | 0.08 | 0.3 | 0.3 | 0.15 | 0.1 | 0.07 | 0.4 |
| Film stress, kgf/mm² | 25 Compress | 10 Stretch | 20 Stretch | 30 Stretch | 35 Stretch | 25 Compress | 5 Stretch |

EXAMPLE 10

A p-SiN film was first formed in a thickness of 100 nm on a 6-inch Si substrate (100) having a necessary active region formed therein, a $SiO_2$ film was then superposed thereon by the CVD method in a thickness of 400 nm, and a multiplicity of trenches 400 nm in width were thereafter formed as spaced at an interval of 800 nm in the $SiO_2$ film by the PEP and RIE. Then, on the surface of the $SiO_2$ film having the trenches formed therein as described above, a barrier layer of TiN was deposited in a thickness of 30 nm and a Cu film was further superposed thereon.

The deposition of the Cu film mentioned above was effected by sputtering Cu of a purity of 7N as the supper source by means of a magnetron sputter device capable of varying the distance between the substrate and the target under an ultimate vacuum degree of $1 \times 10^{-8}$ Torr in an ambience of high-purity Ar gas (dew point not more than −90° C.) under a pressure of 5 mTorrs.

Figure 13A:
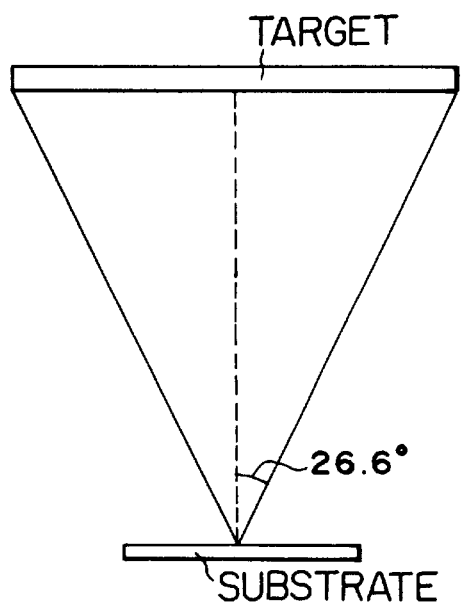
FIG. 13A shows the effect of the angle of incidence of particles during the formation of a Cu film by sputtering in the method for the production of a semiconductor device according to this invention.
Figure 14A:
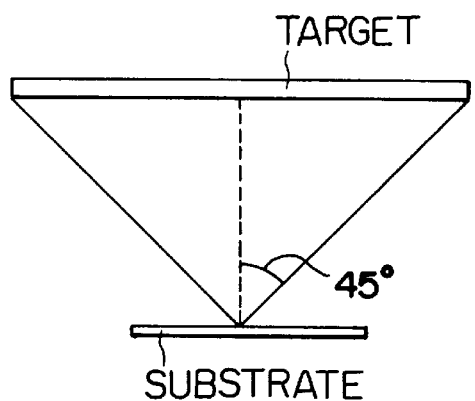
FIG. 14A shows the effect of the angle of incidence of particles during the formation of a Cu film by sputtering in the method for the production of a semiconductor device according to this invention.

The magnetron sputter device was characterized by being capable of varying the distance between the substrate and the target without inducing a decline (degradation) in the degree of vacuum. Thus, the formation of the Cu film in a thickness of 500 nm was carried out with the maximum angle of incidence of the hurled particles shown schematically in FIG. 13A and FIG. 14A set at 26.6° (LD: 2.0) or 45° (LD: 1.0) and the film-forming speed varied in the range of from 5 to 10 nm/sec.

Figure 13B:
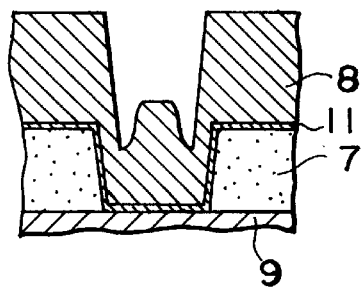
FIG. 13B is a schematic diagram showing the cross section of the Cu film immediately after the formation thereon with respect to the relation between the target and the substrate position shown in FIG. 13A.
Figure 14B:
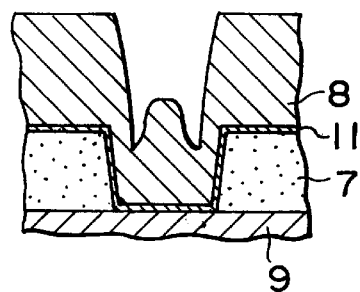
FIG. 14B is a schematic diagram showing the cross section of the Cu film immediately after the formation thereon with respect to the relation between the target and the substrate position shown in FIG. 14A.

FIG. 13B and FIG. 14B schematically show the states of cross section of the Cu films immediately after their deposition.

Thereafter, the samples consequently obtained were subjected to a heat treatment for 30 minutes under the conditions shown in Table 12, with an oxidizing gas of $O_2$ 20%-$N_2$ 80% supplied at a flow volume of 0.1 liters/min and a reducing gas of $N_2$ 90%-$H_2$ 10% at a flow volume of 1 liter/min, to flow the Cu film and form an electrode line. The samples were further fabricated by CMP to produce an electrode line and the produced lines were tested for electrical resistance by the four terminal method. The results are shown in Table 12.

It is clearly noted from Table 12 that thorough flow of the Cu film was obtained at such low temperatures as about 250° C.

TABLE 12

| | LD | | | | | |
|---|---|---|---|---|---|---|
| | 1.0 | | | 2.0 | | |
| | Temperature of heat treatment ° C. | | | | | |
| | 200 | 250 | 450 | 200 | 250 | 450 |
| Shape of wiring | x | ◯ | ◯ | x | ◯ | ◯ |
| Electrical resistance μΩcm | — | 2.0 | 1.8 | — | 2.0 | 1.8 |

EXAMPLE 11

A p-SiN film was first formed in a thickness of 100 nm on a 6-inch Si substrate (100) having a necessary active region formed therein, a $SiO_2$ film was then superposed thereon by the CVD method in a thickness of 400 nm, and a multiplicity of trenches 400 nm in width were thereafter formed as spaced at an interval of 800 nm in the $SiO_2$ film by the PEP and RIE.

Then, on the surface of the $SiO_2$ film having the grooves formed therein as described above, a barrier layer of TiN was deposited in a thickness of 30 nm and a Cu film was further superposed thereon by sputtering by means of a high-vacuum sputtering device. In this case, prior to the formation of the barrier layer and the Cu film, contact holes were preparatorily filled by embedding by the CVD method to establish contact with the active region.

The deposition of the Cu film by sputtering was carried out by using Cu of purity 7N as the sputter source under an ultimate vacuum degree of $1 \times 10^{-8}$ Torr in an ambience of high-purity Ar gas (dew point not more than −90° C.) under a pressure of 5 mTorrs at deposition rate of 15 nm/sec.

Figure 15:
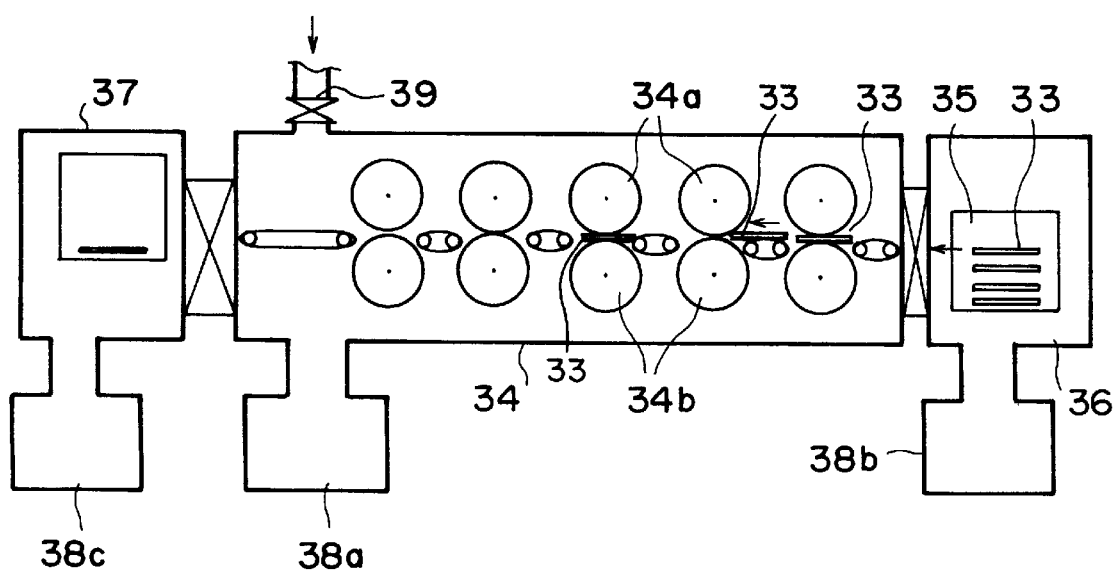
FIG. 15 is a diagram schematically showing the construction of another pressure•heat-treating device to be used in the method for the production of a semiconductor device according to this invention.

Then, a pressing heat-treating device whose construction is shown schematically in a cross section in FIG. 15 was used to effect a flow treatment. This pressing heat-treating device comprised a device proper 34 having disposed therein heating rollers 34a and cooling rollers 34b paired and collectively adapted to convey in one direction a sample 33 as nipped on the opposite surfaces thereof, a preparation chamber 36 disposed on one end side of the device proper 34 and housing a cartridge 35 having fixed therein a sample 33 under treatment, an extraction chamber 37 disposed on the other end side of the device proper 34 and adapted to extract the sample 33 undergone the treatment, evacuation systems 38a, 38b, and 38c for evacuating the device proper 34, the preparation chamber 36, and the extraction chamber 37 respectively, and a gas line 39 for supplying a forming gas to the interior of the device proper 34.

Here, the sample 33 having the Cu film deposited therein as described above was set in place in the cartridge 35 and the cartridge 35 was inserted and set in place in the preparation chamber 36 and the preparation chamber 36 was evacuated to a degree of vacuum of $1 \times 10^{-6}$ Torr and then filled with a forming gas (such as, for example, a mixed gas of $N_2$ 90%-$H_2$ 10%) to normal pressure. With the preparation chamber 36 held in the ensuant state, the device proper 34 evacuated in advance to a vacuum was supplied with a forming gas (such as, for example, a mixed gas of $N_2$ 90%-$H_2$ 10%) and the conveying rollers 34a and 34b were actuated to convey inside the sample 33 set in place in the cartridge 35 and subject the sample 33 to a pressing heat treatment. During this conveyance, the Cu film in the sample 33 was heated and pressed by the heating rollers 34a and enabled to flow. In this case, the heating rollers 34a were kept at about 400° C. with a built-in heater and the cooling rollers 34b were kept below room temperature. The pressure generated between the two rows of these rollers was 1 kgf/mm² and the rollers were operated at a speed of 10 cm/sec.

The degrees of flow expressed by the ratio of the thickness, $D_{min}$, of the thickness of the Cu film embedded by the flow in the trench to the depth, D, of the trench were highly satisfactory as evinced by their magnitudes invariably exceeding 1.2. When the samples were fabricated by CMP to form an electrode line and the lines were tested for electrical resistance by the four terminal method, the electrical resistance was found to be 1.9 $\mu\Omega$cm.

EXAMPLE 12

In the same manner as in Example 2, a p-SiN film was formed as an undercoating layer in a thickness of 100 nm on a Si substrate (100) having a necessary active region formed in advance therein. Then, a $SiO_2$ film was superposed thereon in a thickness of 400 nm by the CVD and a multiplicity of trenches 400 nm in width were formed as spaced at an interval of 800 nm in the $SiO_2$ film by PEP and RIE.

Thereafter, a barrier layer of TiN was deposited in a thickness of 30 nm on the surface of the $SiO_2$ film having the trenches formed as described above and a Cu film was deposited in a thickness of 800 nm by sputtering. In this case, prior to the deposition of the barrier layer and the Cu film, contact holes were filled preparatorily by embedding by the selective CVD method to establish contact with the active region.

Then, the Cu film deposited on the space was shaved by the CMP to a varying thickness indicated in Table 13 and then subjected to a heat treatment by the use of a reduced-pressure heat-treating device constructed as shown in FIG. 3. Part of the removal of the Cu film in the direction of thickness was carried out by ion etching. In this case, after the Cu film was deposited, the substrate of the sample was exposed to a bias voltage of −100 V in a Rf Ar plasma of 100 MHz to ion etch chiefly the part of the Cu film overlying the space to a prescribed thickness and then heat-treated by the use of the reduced-pressure heat-treating device shown in FIG. 3.

This heat treatment was carried out under the following conditions. The Si substrate having the Cu film deposited thereon was set in place on the hot plate 12 and the device proper 13 was evacuated to a vacuum by the rotary pump 18. The degree of vacuum attained in this case of about 0.01 Torr. The heat treatment was carried out in an ambience of a partial pressure ratio ($PH_2/PO_2$) of 30 and a total pressure of 20 Torrs at 400° C. for 30 minutes and in a forming gas of $H_2$ 10%-$N_2$ 90% at 650° C. for 30 minutes.

The samples which had undergone the heat treatment mentioned above were cooled and the cross sections of the samples were visually examined by the SEM. The samples had the Cu films on the spaces removed by the CMP and the shapes of surface (shapes of flow) of the exposed electrode lines were visually examined to determine the presence or absence of void. The results are also shown in Table 13.

Under the item "Shape of Cross section" included in Table 13, the mark ○ stands for an amount of embedment in a trench of not less than 110% of the depth of the trench and the mark x for an amount of embedment of less than 110% of the depth of the trench or the occurrence of voids in the trench line. In the item "Presence or absence of void after CMP" included in Table 13, the mark ○ stands for the number of voids of not more than 1 per 1 mm as an average of 100 mm of total line length and the mark x for the number of voids of two or more.

It is clearly noted from Table 13 that when the Cu film on the space was shaved to a small thickness of about 100 nm, the Cu was not moved from the part of the space sufficiently enough to fill the trench because the heat treatment for flow produced a fracture (break in continuity of film). When the thickness of the Cu film on the space was 600 nm or 800 nm, the melt of Cu was lifted from the bridges and the trenches and numerous voids were consequently formed.

The samples which were confirmed by the visual examination and the rating to have produced no void in their electrode lines were chosen and their lines were tested for electrical resistance. The specific resistance was invariably 1.8 $\mu\Omega$cm.

EXAMPLE 13

This example pertains to a method for the production of a semiconductor device including a step of forming an embedded line having an aspect ratio of not more than 1.5.

FIGS. 16A, 16B, 16C, 16D, and 16E and FIGS. 17A, 17B, and 17C schematically show the manner of implementing this example. First, a $SiO_2$ film 7 was formed in a thickness of 3500 nm by CVD on a Si substrate 9 of a diameter of 150 mm having a necessary active region or an undercoating wiring region formed in advance therein as shown in the cross section of FIG. 16A.

Then, a multiplicity of trenches 6 having a width of from 1500 nm to 5000 nm and a depth of 2000 nm were formed

TABLE 13

Figure 16A:
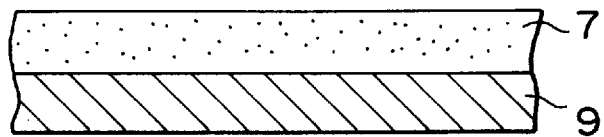
FIGS. 16A, 16B, 16C, 16D, and 16E are schematic cross sections showing another manner of forming an electrode line in the method for the production of a semiconductor device according to this invention.
Figure 16B:
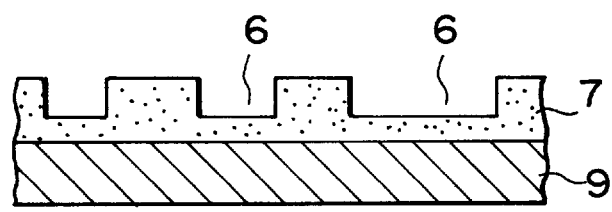

| Method for removal of Cu film | CMP | | | | | | Ion etching |
|---|---|---|---|---|---|---|---|
| Thickness of film on space (nm) | 8000 | 6000 | 4500 | 3000 | 2000 | 1000 | 4500 |
| Shape of cross section | x Bridging | x Lifting | ○ | ○ | ○ | x Fracture | ○ |
| Presence or absence of void after CMP | x | x | ○ | ○ | ○ | x | ○ | by PEP and RIE as shown by the cross section of FIG. 16B. Subsequently, contact holes for connecting the trenches 6 to the active region were formed by PEP and RIE and W plugs or Cu plugs were packed in the contact holes by the selective CVD method.

Figure 16C:
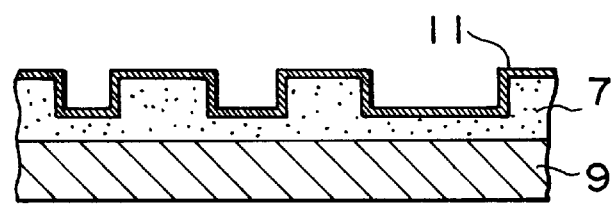

On the surface of the $SiO_2$ film having the trench 6 formed therein as described above, a barrier film 11 of TiN was deposited in a thickness of 30 nm, for example, for precluding diffusion of Cu as shown by the cross section of FIG. 16C.

Figure 16D:
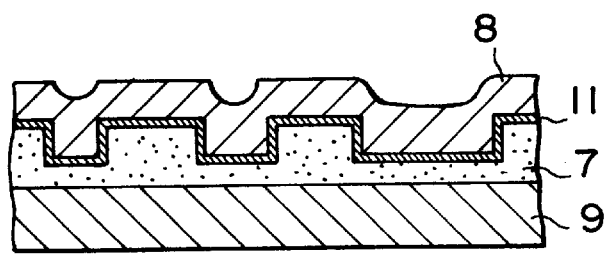
Figure 16E:
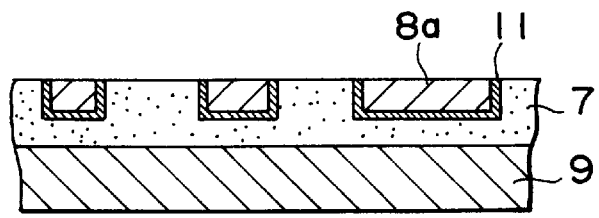

Thereafter, a Cu film 8 of a thickness of 3000 nm was embedded by the DC magnetron sputtering method with an electric power of 10 kW on the barrier layer 11 of Cu as shown by the cross section of FIG. 16D.

At this time, the interior of the chamber was filled with an ambience composed of $Ar/H_2/O_2$ at a mixing ratio of 11/20/2 to a total pressure of 0.85 Pa. The sputter target 300 mm in diameter used in this case was made of Cu of an assay of 99.9999% and the distance between the substrate and the target was set at 75 mm.

The substrate was fixed with an electrostatic chuck on a PBN heater controlled by PID and heated to 450° C., with Ar gas introduced under a pressure of 80 Pa to the rear side of the substrate to improve the thermal conductivity.

After the sputtering mentioned above was completed, the Cu film 8 was cooled with an ambience of Ar—$H_2$ mixture so as to be protected against oxidation. Then the Cu film 8 and the TiN film 11 outside the trenches were removed by chemical mechanical polishing (CMP). Consequently, a semiconductor device provided with a Cu line 8a as shown by the cross section of FIG. 16E was obtained.

When the shape of flow of the sample obtained as described above was visually examined by the SEM, it was found that the amount of embedment in the trench was not less than 110% of the depth of the trench and the electrode line was uniformly embedded with an aspect ratio of not more than 1.5 as designed. When the sample was fabricated by the CMP to form an electrode line and the shape of the line was rated by the SEM, the shape of line was highly satisfactory. When the line was tested for electrical resistance by the four terminal method, it was found to have an electrical resistance of not more than 1.8 $\mu\Omega$cm.

When the sample was subjected to an accelerated test, it was confirmed that the formed Cu interconnection 8a possessed highly endurance against electromigration and stress migration and warrantable reliability regarding high current density.

Figure 17A:
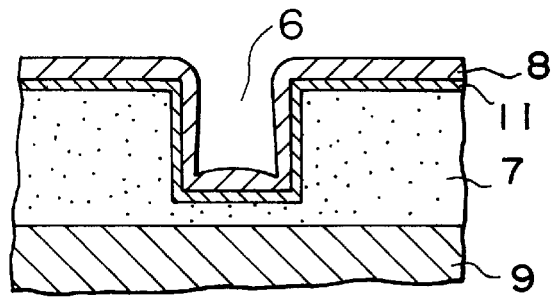
FIGS. 17A, 17B, and 17C are schematic diagrams for aiding in the explanation of the mode for the formation of an embedded interconnection by the film formation and flow of a conductive film in the method for the production of a semiconductor device according to this invention.
Figure 17B:
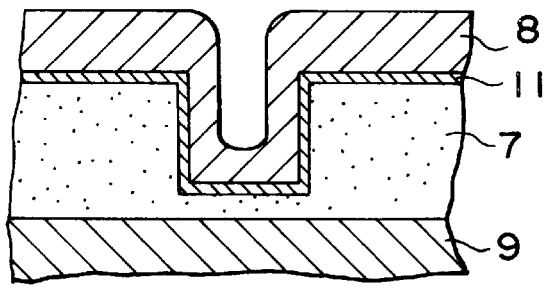
Figure 17C:
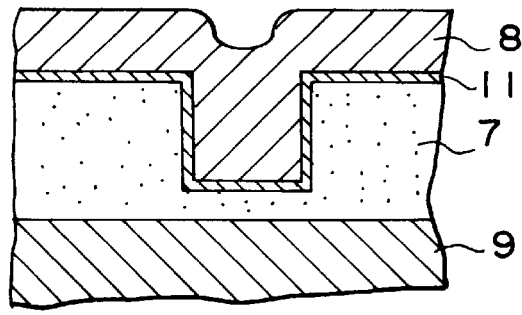

FIGS. 17A, 17B, and 17C schematically show the state in which the Cu film 8 was embedded in the trench 6 by the method of sputtering mentioned above. During the initial stage of the deposition of this Cu film 8, the Cu film was forced to admit O atoms because the ambience in which the Cu film was formed was the mixture of an oxidizing gas and a reducing gas and further because the substrate was kept in a heated state. Owing to this entrance of the O atoms, the possible cohesion of the Cu film due to the heating of the substrate is repressed and the Cu film is grown in a uniform continuous form during the initial stage of growth as shown by the cross section of FIG. 17A.

Further, since the supply of $H_2$ as a reducing gas is continued during the course of this sputtering, the surface of the Cu film being deposited is constantly reduced and allowed to keep an active state. Owing to this active state, free surface diffusion easily advances and the flow of Cu moves into and fills the interior of the trench 6 as shown by the cross section of FIG. 17B.

The Cu film intimately fills the interior of the trench 6 so as to decrease the surface free energy (FIG. 17C).

During the course of the sputtering mentioned above, the ambience to which $O_2$ as an oxidizing gas and $H_2$ as a reducing gas are supplied is generating a plasma. The $O^+$ ions or radicals and the $H^+$ ions (or radicals) which are ionized or liberated by this plasma have higher reactivity than $O_2$ and $H_2$. Therefore, the flow of the Cu film is easily advanced by the oxidizing and the reducing reaction of higher reaction velocity even when the temperature of the substrate is lowered more than when the heat treatment is carried out by mere supply of $O_2$ and $H_2$ after the formation of the Cu film. The oxidizing and the reducing gas under discussion do not need to be limited to the $O_2$ and the $H_2$ gas cited above. Other oxidizing and reducing gases may be used instead on the condition that the gases which they generate in consequence of decomposition in the plasma will not persist as impurities in the Cu film.

Though the formation of the film has been described above as having the temperature of the substrate set at 450° C., it can be effectively carried out while avoiding diffusion of Cu atoms in the Si substrate at a substrate temperature in the range of from 200° C. to 600° C.

Though the sputtering method used for the formation of the Cu film has been described above as having a target 300 mm in diameter set at a distance of 75 mm from a Si substrate 150 mm in diameter, the long distance sputtering method which increases the proportion of sputtered particles perpendicularly impinging on the semiconducting substrate, such anisotropic sputtering methods as the collimation sputtering method which involves insertion of a collimator intended for accumulation thereto of the portion of sputtered particles other than those impinging perpendicularly on the semiconducting substrate, and the bias sputtering method which applies a DC voltage or a high frequency voltage to the semiconducting substrate may be adopted instead. When the bias sputtering method for the long distance sputtering method is used, the sputtering operation continued until a necessary embedment is obtained ought to be switched to the ordinary film formation of high efficiency for the purpose of increasing the deposition rate.

The deposition of the film has been described above as aiming to grow a Cu film. The film to be grown thereby may be a conductive film made of such a low-resistance metal as Ag or Au. Particularly, since Ag undergoes an oxidizing reaction and a reducing reaction as easily as Cu, it is made to form an electrode line readily by suitably selecting the kinds of oxidizing gas and reducing gas and the mixing ratio of the two gases and properly setting the substrate temperature.

EXAMPLE 14

This example pertains to a method for the production of a semiconductor device including a step of forming contact holes having an aspect ratio of not more than 2.

FIGS. 18A, 18B, 18C, and 18D schematically show the manner of implementing the present example. First, a $SiO_2$ film 7 was formed in a thickness of 600 nm by the CVD method on a Si substrate 9 measuring 150 mm in diameter and having a necessary active region or an undercoating line region formed in advance therein. Then, contact holes 6a having a diameter in the range of from 300 to 700 nm were formed in the $SiO_2$ film 7 by the PEP and RIE.

Figure 18A:
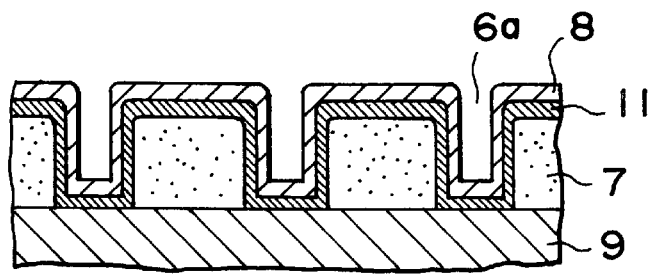
FIGS. 18A, 18B, 18C, and 18D are schematic cross sections showing the manner of forming another electrode line in the method for the production of a semiconductor device according to this invention.

On the surface of the $SiO_2$ film 7 having the contact holes 6a formed therein as described above, a barrier layer 11 of TiN for preventing diffusion of Cu was deposited in a thickness of 30 nm and a Cu film 8 was superposed as a primary film in a thickness of 100 nm by the anisotropic sputtering method as shown by the cross section of FIG. 18A.

At this time, the interior of the chamber was filled with an ambience composed of $Ar/H_2/O_2$ at a mixing ratio of 11/20/2 to a total pressure of 0.85 Pa. The sputter target 300 mm in diameter used in this case was made of Cu of an assay of 99.9999% and the distance between the substrate and the target (TS distance) was set at 200 mm. The electric power fed during the film formation was 15 kW.

The Si substrate 9 was fixed with an electrostatic chuck on a PBN heater controlled by PID, with Ar gas introduced under a pressure of 80 Pa to the rear side of the substrate to improve the thermal conductivity, and heated to a temperature not exceeding 350° C.

Figure 18B:
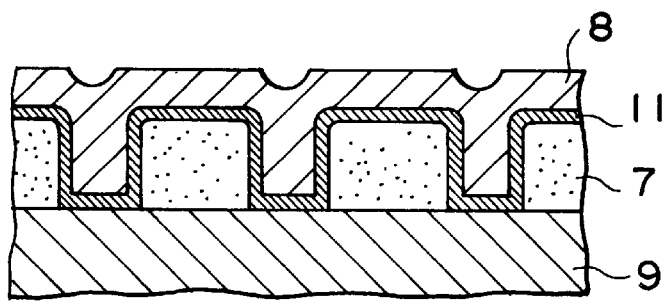

Then, with the substrate temperature elevated to 450° C., a Cu film 8 was deposited as a secondary film in a thickness of 300 nm so as to fill the contact holes 6a wholly as shown by the cross section of FIG. 18B. In this case, the ambience inside the chamber and the TS distance were the same as those used in the formation of the primary film.

Between the time the sputtering work for the formation of the secondary film was completed and the time the substrate was cooled, the laminate was cooled in an ambience of the mixture of Ar gas and $H_2$ gas, for example, for the purpose of preventing the Cu film from being oxidized. Incidentally, this cooling ambience was so set that the speed of reduction was always higher than that of oxidation.

Figure 18C:
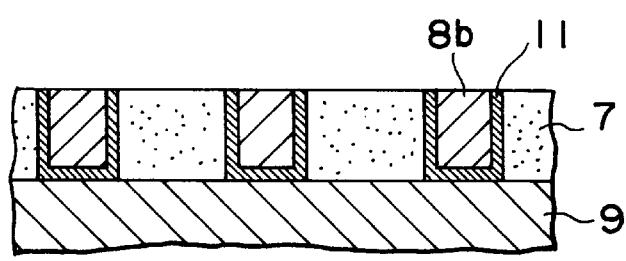
Figure 18D:
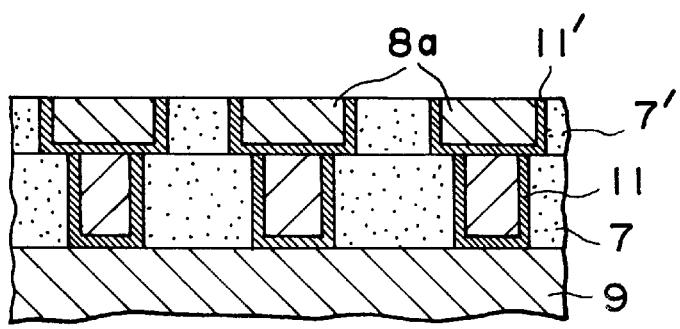

Then, the parts of the Cu film 8 and the TiN film falling outside the contact holes 6a were removed by the chemical mechanical polishing (CMP) method to give rise to Cu plugs 8b as shown by the cross section of FIG. 18C. Subsequently, in the same manner as in Example 13, a $SiO_2$ film 7' was formed by the CVD method on the surface of the Cu plugs 8b, grooves 6 were dug, a TiN film 11' was formed, a Cu film was formed (to fill the interior of the grooves 6), and the ultimate surface of the resultant laminate was subjected to chemical mechanical polishing to produce a semiconductor device provided with a Cu-embedded line 8a as shown by the cross section of FIG. 18D.

The electrode line was uniformly embedded in the contact holes 6a having an aspect ratio of 2 as designed. It was found to have specific resistance of not more than 1.8 $\mu\Omega$cm.

When the semiconductor device having the electrode line of a via chain construction formed therein was subjected to an accelerated test, it was confirmed that the formed electrode line possessed highly endurance against electromigration and stress migration and warrantable reliability regarding high current density and that neither void nor hillock occurred on the upper and the lower surface of the Cu plugs 8b.

In the formation of the Cu film described above, the substrate temperature was set at 350° C. during the former stage and at 450° C. during the latter stage. The substrate temperatures so set may be suitably selected, depending on such factors as the mixing ratio of an oxidizing gas and a reducing gas. Instead of separating the period of heat treatment into two stages as described above, the formation of the primary film may be carried out while the substrate temperature is in the process of rising to 450° C, the temperature for the formation of the secondary film. In this case, the time spent for the formation of film can be shortened and the operational efficiency of film production can be improved.

In the present example, such conditions as the method of film formation and the ambience used therefor can be variously altered and selected similarly to those used in Example 13.

EXAMPLE 15

This example pertains to a method for the production of a semiconductor device including a step of forming an embedded line having an aspect ratio of 1 and forming contact holes having an aspect ratio of 3.

FIGS. 19A, 19B, and 19C and FIGS. 20A, 20B, 20C, and 20D schematically show the manner of implementing the present example. First, a $SiO_2$ film 7 was formed in a thickness of 850 nm, a SiN film 41 in a thickness of 50 nm, and a $SiO_2$ film 7' in a thickness of 400 nm sequentially as superposed by the CVD as shown by the cross section of FIG. 19A on a Si substrate 9 measuring 150 mm in diameter and having a necessary active region or an undercoating line region.

Figure 19A:
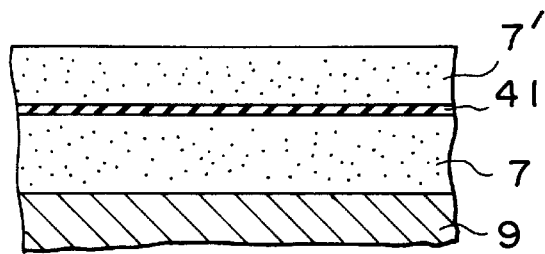
FIGS. 19A, 19B, and 19C are schematic cross sections showing the manner of patterning a line part containing a connecting part in the method for the production of a semiconductor device according to this invention.
Figure 19B:
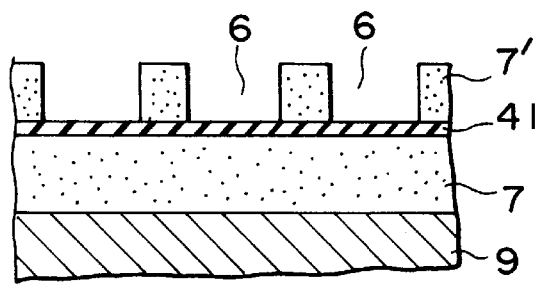

Thereafter, trenches 6 measuring 400 nm in width and 400 nm in depth were formed in the $SiO_2$ film 7' by the PEP and RIE, with the SiN film 41 mentioned above used as an etching stopper, as shown by the cross section of FIG. 19B.

Figure 19C:
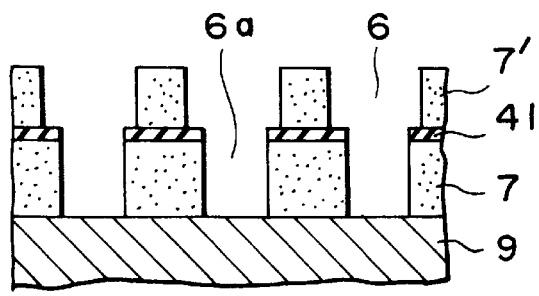

Then, the SiN film 41 and the $SiO_2$ film 7 were patterned by PEP and RIE to dig contact holes 6a measuring 300 nm in diameter and 900 nm in depth as shown by the cross section of FIG. 19C.

Figure 20A:
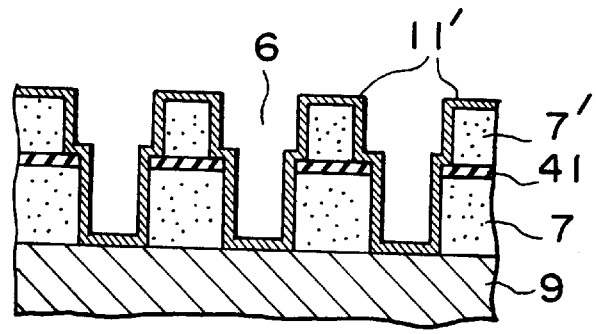
FIGS. 20A, 20B, 20C, and 20D are schematic cross sections showing the manner of forming a line containing a connecting part in the method for the production of a semiconductor device according to this invention.

Subsequently, on the surface having the contact holes 6a formed therein as described above, a TiN film 11' was deposited in a thickness of 30 nm as a barrier layer for preventing diffusion of Cu as shown by the cross section of FIG. 20A.

Figure 20B:
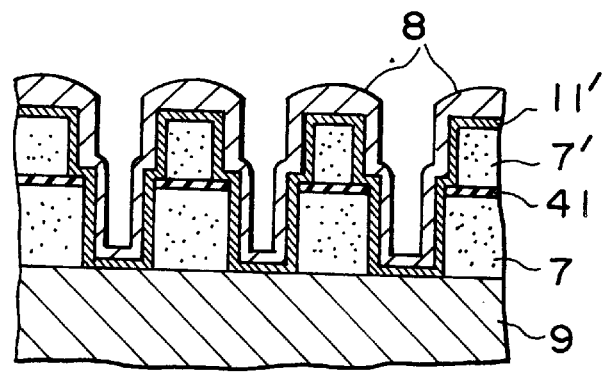

Then, a Cu film 8 was deposited as a primary film by the anisotropic sputtering method in a thickness of 300 nm with an electric power of 30 kW as shown by the cross section of FIG. 20B. At this time, the interior of the chamber was filled with an ambience composed of $Ar/H_2/O_2$ at a mixing ratio of 11/10/2 to a total pressure of 0.85 Pa. The sputter target 300 mm in diameter used in this case was made of Cu of an assay of 99.9999% and the distance between the substrate and the target (TS distance) was set at 300 mm.

The substrate was fixed with an electrostatic chuck on a PBN heater controlled by PID, with Ar gas introduced under a pressure of 80 Pa to the rear side of the substrate to improve the thermal conductivity, and heated to a temperature not exceeding 350° C.

Figure 20C:
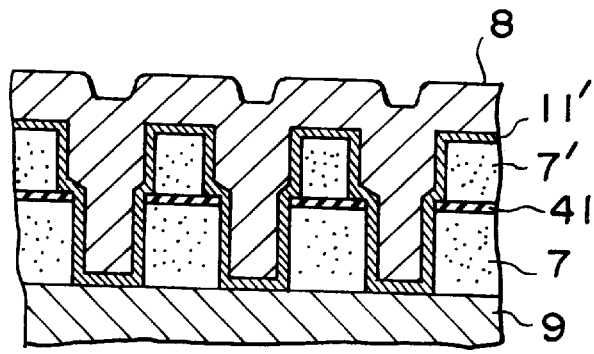

Then, with the substrate temperature elevated to 450° C., a Cu film 8 was deposited as a secondary film in a thickness of 300 nm to fill the contact holes 6a and the trenches 6 wholly as shown by the cross section of FIG. 20C. At this time, the mixing ratio of $Ar/H_2/O_2$ forming the ambience in the chamber was changed to 11/20/2. The TS distance used herein was the same as that used for the formation of the primary film.

Between the time the sputtering work for the deposition of the secondary film was completed and the time the substrate was cooled, the laminate was cooled in an ambience of the mixture of Ar gas and $H_2$ gas, for example, for the purpose of preventing the Cu film from being oxidized. Incidentally, this cooling ambience was so set as to retain a reducing ambience constantly.

Figure 20D:
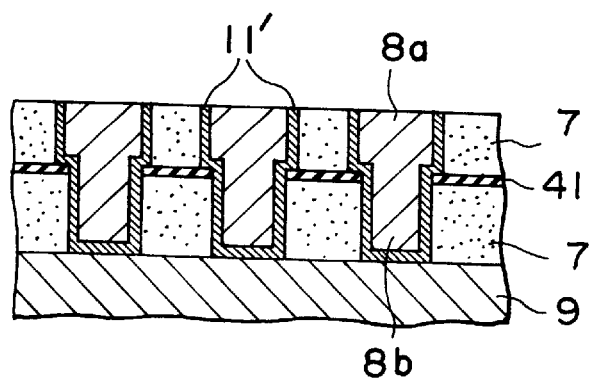

Then, the parts of the Cu film 8 and the TiN film 11' falling outside the contact holes 6a were removed by the chemical mechanical polishing (CMP) method to give rise to a semiconductor device provided with Cu plugs 8b and Cu embedded line 8a as shown by the cross section of FIG. 20D.

The Cu plugs 8b and the Cu embedded line 8a were found to be uniformly embedded at an aspect ratio as designed. They were both found to have specific electrical resistance of not more than 1.8 $\mu\Omega$cm.

When the semiconductor device having the electrode line of a via chain construction formed therein was subjected to an accelerated test, it was confirmed that the formed electrode line possessed highly endurance against electromigration and stress migration and warrantable reliability regarding high current density and that neither void nor hillock occurred on the upper and the lower surface of the Cu plugs 8b.

The deposition of the Cu film mentioned above can be attained by any of various methods such as, for example, the anisotropic sputtering method and the bias sputtering method. It may be effected with improved productivity, however, by using the bias sputtering method until the Cu film which is sparingly cohesive reaches the bottoms and lateral walls of the contact holes and then switching this method to the ordinary sputtering method which has a highly deposition rate.

Again, in the present example, such conditions as the method of film formation and the ambience used therefor can be variously altered and selected similarly to those used in Example 13 and Example 14.

EXAMPLE 16

This example pertains to a method for the production of a semiconductor device including a step of forming an embedded line having an aspect ratio of 1 and forming contact holes having an aspect ratio of 3.

This example will be described below with reference to FIGS. 19A, 19B, and 19C and FIGS. 20A, 20B, 20C, and 20D.

First, a $SiO_2$ film 7 of a thickness of 850 nm, a SiN film 41 of a thickness of 50 nm, and a $SiO_2$ film 7' of a thickness of 400 nm were sequentially superposed by the CVD on a Si substrate 9 measuring 150 mm in diameter and having an active region or an undercoating region formed in advance as required as shown by the cross section of FIG. 19A.

Thereafter, trenches 6 measuring 400 mm in width and 400 nm in depth were formed in the $SiO_2$ film 7' by the PEP and RIE, with the SiN film 41 mentioned above used as an etching stopper, as shown by the cross section of FIG. 19B.

Then, the SiN film 41 and the $SiO_2$ film 7 were patterned by PEP and RIE to dig contact holes 6a measuring 300 nm in diameter and 900 nm in depth as shown by the cross section of FIG. 19C.

Subsequently, on the surface having the contact holes 6a formed therein as described above, a TiN film 11' was deposited in a thickness of 30 nm as a barrier layer for preventing diffusion of Cu as shown by the cross section of FIG. 20A.

By the anisotropic sputtering method, a Cu film containing O atoms and measuring 300 mm in thickness was formed as shown by the cross section of FIG. 20B.

At this time, the interior of the chamber was filled with Ar supplied thereto at a flow volume of 55 sccm until a total pressure of 0.17 Pa. The sputter target 300 mm in diameter used in this case was made of Cu containing O atoms and the distance between the substrate and the target (TS distance) was set at 300 mm. The electric power supplied in this case was 30 kW.

The substrate was fixed with an electrostatic chuck on a PBN heater controlled by PID, with Ar gas introduced under a pressure of 80 Pa to the rear side of the substrate to improve the thermal conductivity, and heated to a temperature not exceeding 350° C.

Then, the substrate was set in place in a second film-forming chamber through the medium of a high-vacuum conveying chamber and a Cu film was formed in a thickness of 300 nm on the substrate by the anisotropic sputtering method as shown by the cross section of FIG. 20C. At this time, the interior of the chamber was filled with an ambience composed of $Ar/H_2/O_2$ at a mixing ratio of 11/20/2 to a total pressure of 0.85 Pa. The sputter target 300 mm in diameter used in this case was made of Cu of an assay of 99.9999% and the distance between the substrate and the target (TS distance) was set at 300 mm.

The substrate was fixed with an electrostatic chuck on a PBN heater controlled by PID, with Ar gas introduced under a pressure of 80 Pa to the rear side of the substrate to improve the thermal conductivity, and heated to a temperature not exceeding 450° C.

Between the time the sputtering work for the formation of the secondary film was completed and the time the substrate was cooled, the laminate was cooled in an ambience of the mixture of Ar gas and $H_2$ gas (composed of $Ar/H_2/O_2$ at a mixing ratio of 11/20/0), for example, for the purpose of preventing the Cu film from being oxidized. Incidentally, this cooling ambience was so set as to retain a reducing ambience constantly.

Then, the parts of the Cu film 8 and the TiN film 11' falling outside the contact holes 6 were removed by the chemical mechanical polishing (CMP) method to give rise to a semiconductor device provided with Cu plugs 8b and Cu embedded line 8a as shown by the cross section of FIG. 20D.

The Cu plugs 8b and the Cu embedded line 8a were found to be uniformly embedded at an aspect ratio as designed. They were both found to have specific electrical resistance of not more than 1.8 $\mu\Omega$cm.

When the semiconductor device having the electrode line of a via chain construction formed therein was subjected to an accelerated test, it was confirmed that the formed electrode line possessed high endurance against electromigration and stress migration and warrantable reliability regarding high current density and that neither void nor hillock occurred on the upper and the lower surface of the Cu plugs 8b.

The formation of the oxygen-containing Cu film and that of the Cu film mentioned above may be carried out in one and the same film-forming chamber and the Cu target containing O atoms may be continuously used in the two film-forming operations by properly selecting the amounts of an oxidizing gas and a reducing gas to be supplied. By this procedure, the process of production can be shortened and the operational efficiency of production can be improved. The formation of the Cu film containing O atoms can be attained as effectively by using a Cu target of high purity having the surface thereof oxidized in advance as by using the O atom-containing Cu target.

Again in the present example, the film can be formed of Ag or Au in the place of Cu and such conditions as the method of film formation and the ambience used therefor can be variously altered and selected similarly to those used in Examples 13 through 15.

EXAMPLE 17

First, a p-SiN film was formed as an undercoating layer in a thickness of 100 nm on a Si substrate (100) having a necessary active region formed in advance therein. Then, a $SiO_2$ film was superposed thereon in a thickness of 400 nm by the CVD and a multiplicity of grooves 400 nm in width were formed as spaced at an interval of 800 nm in the $SiO_2$ film by PEP and RIE.

Then, on the surface of the $SiO_2$ film having the trenches formed therein as described above, a barrier layer of amorphous WSiN was deposited in a thickness of 30 nm and a film of amorphous CuTa was superposed thereon in a thickness of 10 nm.

After the formation of the Cu film as the primary film, the substrate temperature was elevated to 350° C. and a Cu film was formed thereon in a thickness of 600 nm as a secondary film. At this time, the chamber was filled with an ambience composed of $Ar/H_2/O_2$ at a mixing ratio of 11/10/2 to a total pressure of 0.85 Pa.

When the shape of the film formed as described above was visually examined by the SEM, the film was found to be embedded to an amount of not less than 120% of the depth of the trench. When the film was tested by the X ray for degree of crystallization, it was found to be θ–2θ method. The peaks detected at all were those of Cu (111). When the film was tested for the locking curve of Cu (111), the full width at half maximum value was found to be 2.0°. These data indicate that the crystal orientation of the Cu film was extremely satisfactory.

When the film formed as described above was fabricated by the CMP to form a line, the line was found to contain no discernible void at all. When it was tested for electrical resistance by the four terminal method, it was found to have specific electrical resistance of not more than 1.8 $\mu\Omega$cm.

When the electrode line formed by the method described above was tested for electromigration and stress migration, it was found to possess highly endurance against electromigration and stress migration.

When an undercoating film excelling in wettability with Cu was formed first and, before the surface of this undercoating film was suffered to be covered with an oxide surface coat, the Cu film was formed as a primary film on the clean surface of the undercoating film, the Cu film subsequently formed as a secondary film at an elevated temperature sustained no agglomeration. During the formation of the secondary Cu film, the flow of Cu atoms proceeded quickly and the orientation was improved as well.

Specifically, a conductive film excelling in crystal orientation could be obtained by forming an undercoating film of a material selected on the criterion of highly satisfactory wettability manifested to such a metal as Cu and, with the surface of the undercoating film preferably kept in a clean state, superposing a Cu film on the undercoating film. The electrode line ultimately formed with the Cu film, therefore, enjoyed exalted reliability.

When Ta, W, Nb, Mo, amorphous WCo, amorphous NbCr, amorphous CrTa, amorphous CoV, amorphous CoNb, amorphous CoTa, etc. were used in the place of the amorphous CuTa mentioned above, the undercoating films consequently obtained showed similarly satisfactory results. Even when the undercoating film was once exposed to the atmosphere and consequently suffered to form an native oxide film on the surface thereof, the defiled surface of the undercoating film had only to be cleaned by such plasma etching as the bias cleaning performed on the substrate. As a result, the Cu film ultimately superposed on the undercoating film showed as satisfactory results as when the two films were continuously formed.

EXAMPLE 18

This example pertains to a method for the production of a semiconductor device including a step of forming an embedded electrode line provided with a carbon film as a combination antireflection film and polishing stopper film and contact holes.

FIGS. 21A, 21B, and 21C and FIGS. 22A, 22B, 22C, and 22D schematically show the manner of implementing this example.

Figure 21A:
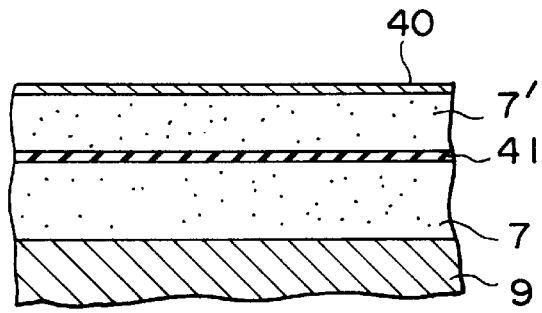
FIGS. 21A, 21B, and 21C are schematic cross sections showing another manner of patterning a line part containing a connecting part in the method for the production of a semiconductor device according to this invention.

First, a SiO$_2$ film 7 of a thickness of 850 nm, a SiN film 41 of a thickness of 50 nm, a SiO$_2$ film 7' of a thickness of 400 nm, and a C film 40 of a thickness of 100 nm were sequentially superposed by CVD on a Si substrate 9 measuring 150 mm in diameter and having a necessary active region or an undercoating wiring region formed in advance therein as shown by the cross section of FIG. 21A.

Figure 21B:
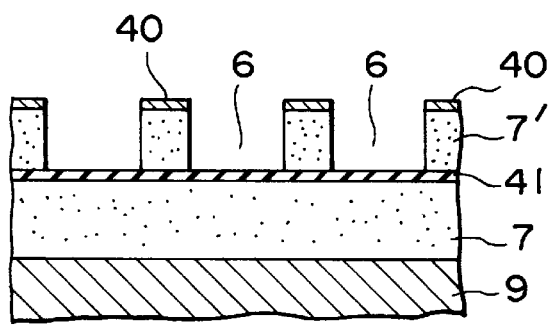

With the aforementioned SiN film 41 as an etching stopper, grooves 6 were formed in a width of 400 nm and a depth of 400 nim, for example, in the C film 40 and the SiO$_2$ film 7' by the PEP and RIE as shown by the cross section of FIG. 21B.

Figure 21C:
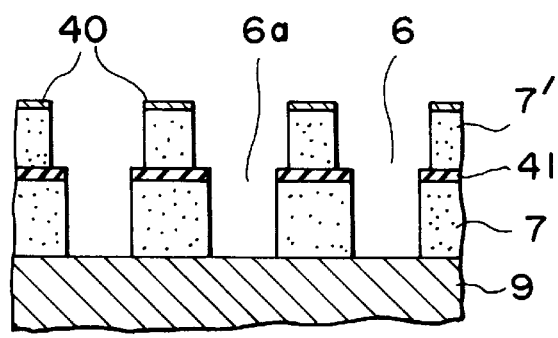

Then, the SiN film 41 and the SiO$_2$ film 7 were patterned by PEP and RIE to form contact holes 6*a* measuring 300 nm in diameter and 900 nm in depth as shown by the cross section of FIG. 21C.

Figure 22A:
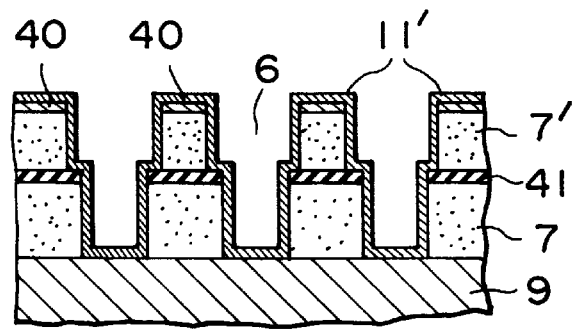
FIGS. 22A, 22B, 22C, and 22D are schematic cross sections showing yet another manner of forming a line containing a connecting part in the method for the production of a semiconductor device according to this invention.

On the surface having the contact holes 6*a* formed therein as described above, a TiN film 11 was formed in a thickness of 30 nm, for example, as a barrier layer for preventing diffusion of Cu as shown by the cross section of FIG. 22A.

Figure 22B:
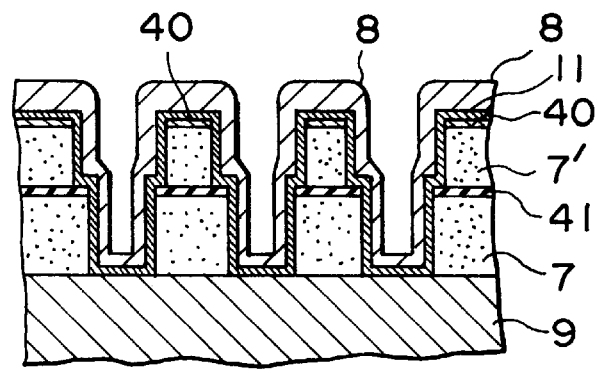
Figure 22C:
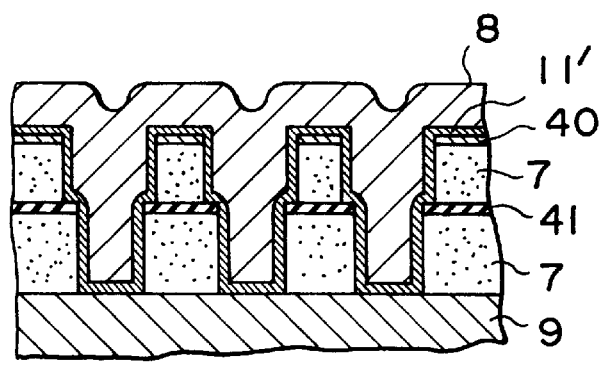

Then, a Cu film 8 was formed in a thickness of 300 nm as a primary film by the anisotropic sputtering method using an electric power of 30 kw as shown by the cross section of FIG. 22B. At this time, the chamber was filled with an ambience of the mixture composed of Ar/H$_2$/O$_2$ at a mixing ratio of 11/10/2 to a total pressure of 0.85 Pa. The sputter target 300 mm in diameter used in this case was made of Cu of an assay of 99.9999% and the distance between the substrate and the target (TS distance) was set at 300 mm.

The substrate was fixed with an electrostatic chuck on a PBN heater controlled by PID, with Ar gas introduced under a pressure of 80 Pa to the rear side of the substrate to improve the thermal conductivity, and heated to a temperature not exceeding 350° C.

Then, with the substrate temperature elevated to 450° C., a Cu film 8 was formed as a secondary film in a thickness of 300 nm to fill the contact holes 6*a* and the trenches 6 wholly as shown by the cross section of FIG. 20C. At this time, the mixing ratio of Ar/H$_2$/O$_2$ forming the ambience in the chamber was changed to 11/20/2. The TS distance used herein was the same as that used for the formation of the primary film.

Between the time the sputtering work for the deposition of the secondary film was completed and the time the substrate was cooled, the laminate was cooled in an ambience of the mixture of Ar gas and H$_2$ gas (composed of Ar/H$_2$/O$_2$ at a mixing ratio of 11/20/0), for example, for the purpose of preventing the Cu film from being oxidized. Incidentally, this cooling ambience was so set as to retain a reducing ambience constantly.

Then, the parts of the Cu film 8 and the TiN film 11' falling outside the contact holes 6 were removed by the chemical mechanical polishing (CMP) method using the C film 40 as a polishing stopper film as shown by the cross section of FIG. 20D.

Figure 22D:
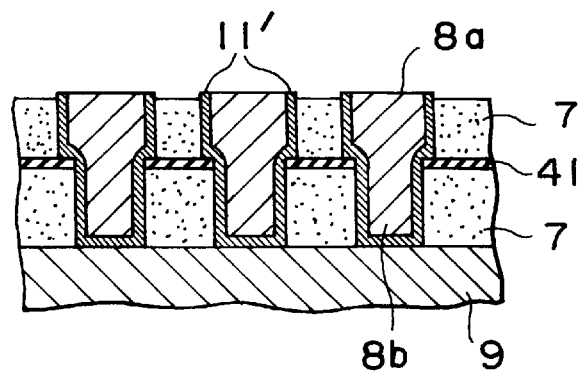

Thereafter, the laminate was set in place in a cylindrical chamber made of quartz and encircled with a circular electrode and, with the chamber filled with an ambience of the mixture consisting of H$_2$/O$_2$ at a mixing ratio of 100/1 and a high frequency (13.56 MHz) power of 800 W applied to the external electrode for 30 minutes, the C film 40 mentioned above was selectively removed in the plasma of the mixed ambience of H$_2$ and O$_2$ to give rise to a semiconductor device provided with Cu plugs 8*b* and Cu-embedded lines 8*a* as shown by the cross section of FIG. 22D.

The Cu plugs 8*b* and the Cu-embedded lines 8*a* were embedded uniformly at as highly accurate aspect ratios as designed and the Cu therein was not oxidized at all. Since the random reflection of light was precluded while the films were being patterned by photoetching, the problem of disfiguration of a resist by the action of light was eliminated and the excessive removal of an embedded line by polishing in the CMP treatment was repressed. Thus, the electrode line and others could be formed with high accuracy as required.

When the line part of the semiconductor device formed as described above was tested for electrical resistance, it was found to have specific electrical resistance of not more than 1.8 $\mu\Omega$cm. When the semiconductor device having the electrode line of a via chain construction formed therein was subjected to an accelerated test, it was confirmed that the formed electrode line possessed highly endurance against electromigration and stress migration and warrantable reliability regarding high current density and that neither void nor hillock occurred on the upper and the lower surface of the Cu plugs 8b.

Again in the present example, the film can be formed of Ag or Au in the place of Cu and such conditions as the method of film formation and the ambience used therefor can be variously altered and selected similarly to those used in Examples 12 through 16.

EXAMPLE 19

This example pertains to a method for the production of a semiconductor device which, owing to the formation of a conductive film capable of forming a conductive oxide by oxidation as an undercoating film for a Cu film, can avoid increasing contact resistance even when the undercoating film is oxidized by a heat treatment in the presence of an oxidizing gas during the formation of a Cu-embedded line by the damascene process utilizing an oxidation and reduction reaction.

Now, the example will be described with reference to FIGS. 23A, 23B, 23C, 23D, 23E, and 23F.

Figure 23A:
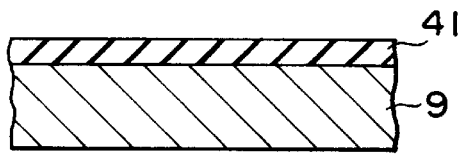
FIGS. 23A, 23B, 23C, 23D, 23E, and 23F are schematic cross sections showing still another manner of forming an electrode line in the method for the production of a semiconductor device according to this invention.
Figure 23B:
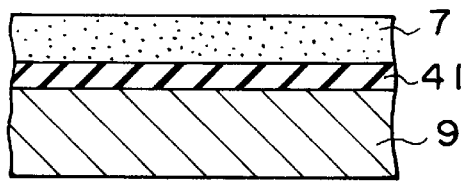
Figure 23C:
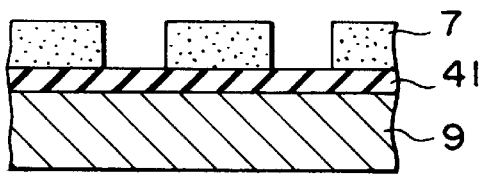

First, a p-SiN film 41 was formed in a thickness of 100 nm as an undercoating film on a Si substrate (100) 9 having a necessary active region formed in advance therein as shown in FIG. 23A. Then, a $SiO_2$ film 7 was formed in a thickness of 400 nm by CVD as shown in FIG. 23B. Thereafter, a multiplicity of trenches 6 measuring 400 nm in width and 800 nm in space width and contact holes were formed in the superposed films by the PEP and RIE (FIG. 23C). The contact holes had an aspect ratio of 0.5.

Figure 23D:
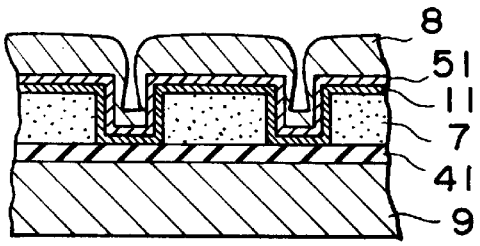

A sample was prepared by deposition a barrier layer 11 of TiN in a thickness of 30 nm on the undercoating film mentioned above and superposing a Cu film 8 thereon in a thickness of 600 nm by sputtering and another sample was prepared by deposition a barrier layer 11 of TiN in a thickness of 30 nm on the undercoating film and superposing thereof a Nd film 51 in a thickness of 30 nm and a Cu film 8 in a thickness of 600 nm by sputtering (FIG. 23D). The barrier layer 11, Nd film 51, and Cu film 8 were continuously formed.

Figure 23E:
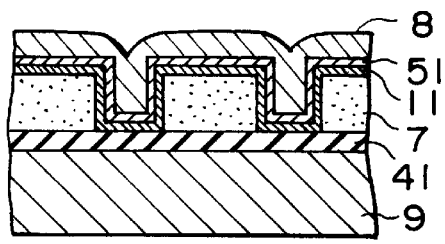
Figure 23F:
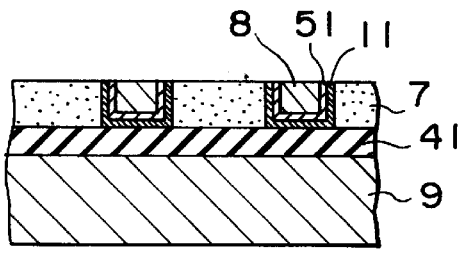

By the use of a reduced-pressure heat-treating device constructed as shown in FIG. 3, the samples were subjected to a heat treatment accompanied by an oxidation and reduction reaction to embed the Cu film in the trenches and the contact holes (FIG. 23E).

Specifically, each sample was set in place on a sample base 12 disposed inside a reduced-pressure heat-treating device proper 13 and the device proper 13 was evacuated to a vacuum by a rotary pump 18. The vacuum degree attained in this case was about 0.01 Torr. After this evacuation, the sample was heat-treated at 450° C. for 30 minutes in an environment of conditions shown in Table 14.

The samples thus heat-treated were cooled and the states of flow thereof were visually examined by SEM. In the samples, the amounts of embedment of the trenches were invariably not less than 110% of the depth of groove, indicating that the shapes of embedment were satisfactory.

The samples which had undergone the flowing treatment were tested for oxygen content by the SIMS. In the samples having a Nd film interposed between the barrier layer and the Cu film, oxygen was detected in the Nd film and the amounts of oxygen in the TiN film and the Cu film were below detectable limits. In the samples containing no Nd film, oxygen was detected in the TiN film.

When the samples were fabricated by the CMP to form a wiring, the wirings consequently produced were found by SEM to have invariably satisfactory shapes. Now, the steps of forming the via chain which was tested for electrical resistance by the four terminal method will be described with reference to FIGS. 24A, 24B, 24C, 24D and 24E.

Figure 24A:
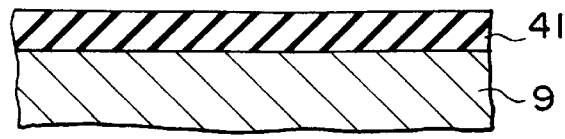
FIGS. 24A, 24B, 24C, 24D, 24E and 24F are schematic cross sections showing still another manner of forming an electrode line in the method for the production of a semiconductor device according to this invention.
Figure 24B:
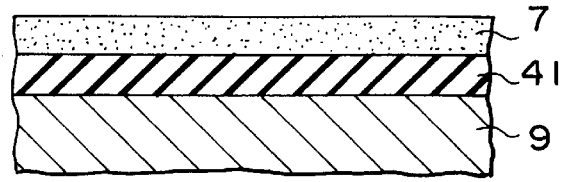
Figure 24C:
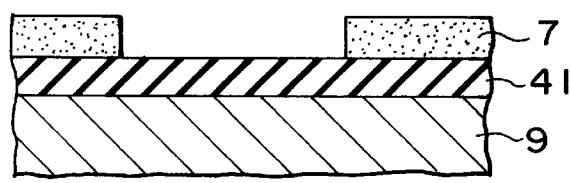

First, a p-SiN film 41 was formed in a thickness of 100 nm on a Si substrate (100) 9 as shown in FIG. 24A. Then, a $SiO_2$ film 7 was formed in a thickness of 400 nm by CVD method as shown in FIG. 24B. Thereafter, a multicity of trenches 6 measuring 400 nm in width and 15 m in length were formed, as shown in FIG. 24C.

A sample was prepared by deposition a barrier layer 11 of TiN in a thickness of 30 nm on the undercoating film mentioned above and superposing a Cu film 8 thereon in a thickness of 600 nm by sputtering and another sample was prepared by forming a barrier layer 11 of TiN in a thickness of 30 nm on the undercoating film and superposing a Nd film 41 in a thickness of 30 nm and a Cu film 8 in a thickness of 600 nm by sputtering. The barrier layer 11, Nd film 51 and Cu film 8 were continuously formed.

Figure 24D:
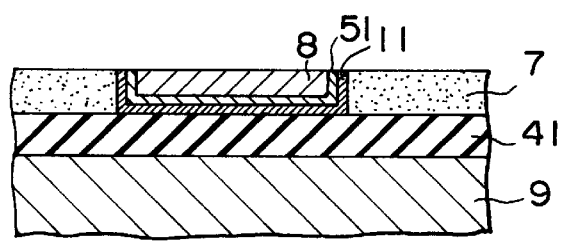
Figure 24E:
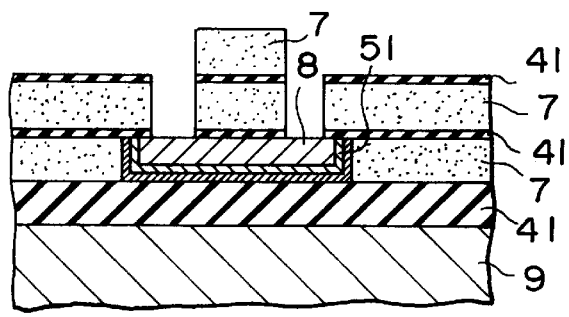

By the use of a reduced-pressure heat-treating device constructed as shown in FIG. 3, the samples were subjected to a heat treatment accompanied by an oxidation and reduction reaction as described in example 2 to embed the Cu film in the trenches. Thereafter, the samples were fabricated by the CMP to form a line, as shown in FIG. 24D.

Then, a p-SiN film 41 was formed in a thickness of 100 nm on the substrate forming the line mentioned above. Then, a $SiO_2$ film 7 in a thickness of 400 nm, a p-SiN film 41 in a thickness of 100 nm, and a $SiO_2$ film 7 in a thickness of 400 nm by the CVD method were successively formed thereon. Thereafter, via holes and trenches connecting the via holes were formed by using the PEP and RIE methods. The interval between the via holes was 10 $\mu$m and the number of via holes was 500.

Figure 24F:
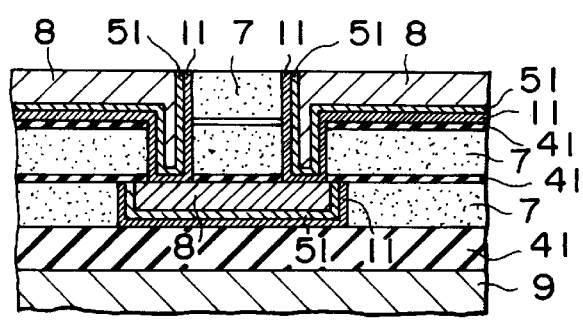
Figure 25A:
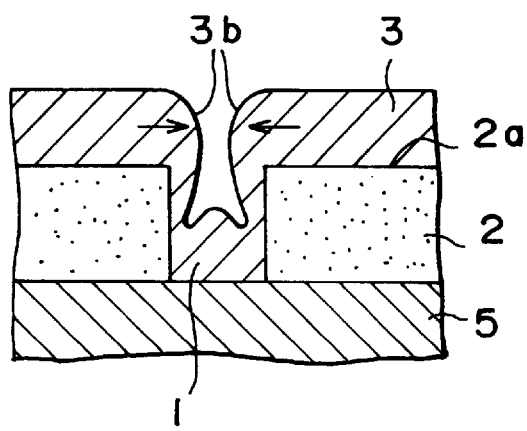
FIGS. 25A and 25B are schematic cross sections showing a manner of forming an embedded line by the flow of a conductive film in a conventional method for the production of a semiconductor device.
Figure 25B:
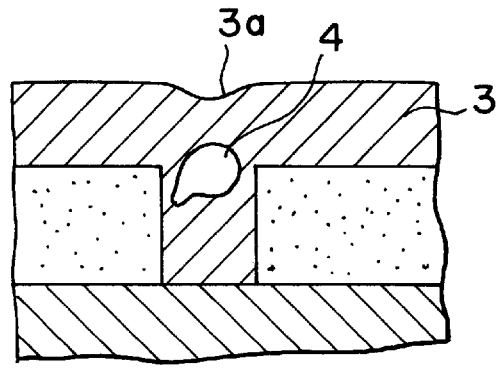
Figure 26A:
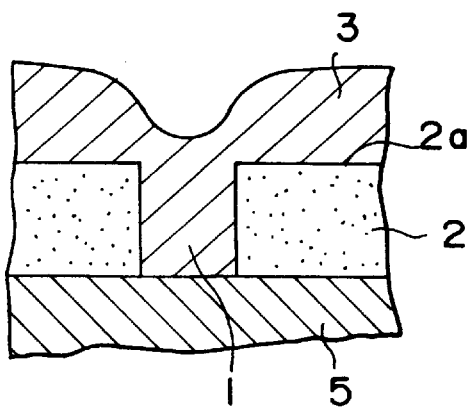
FIGS. 26A and 26B are schematic cross sections showing another manner of forming an embedded line by the flow of a conductive film in a conventional method for the production of a semiconductor device.
Figure 26B:
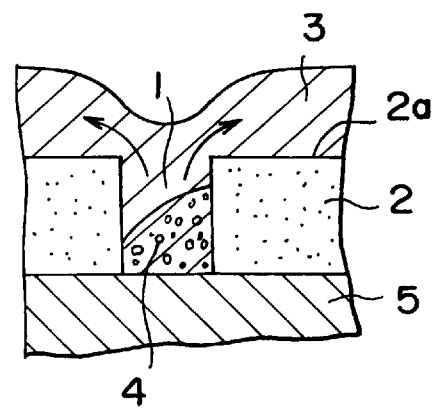
Figure 27A:
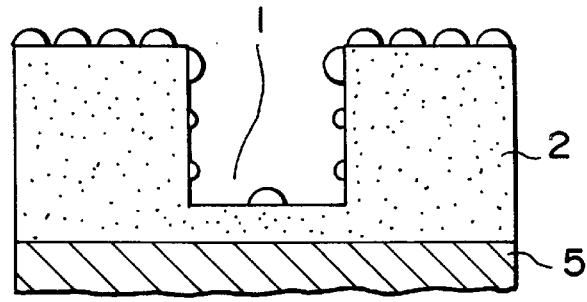
FIGS. 27A, 27B, and 27C are schematic cross sections showing the manner of deposition a conductive film by sputtering in a conventional method for the production of a semiconductor device.
Figure 27B:
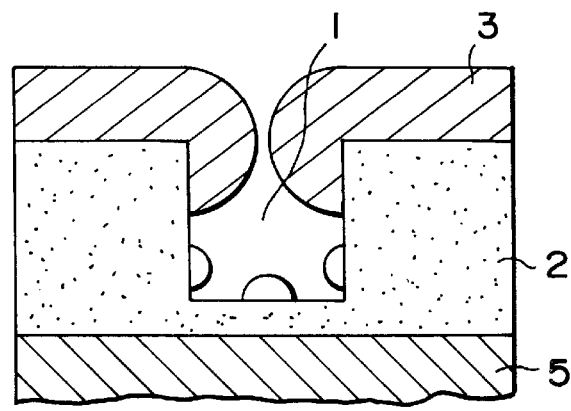
Figure 27C:
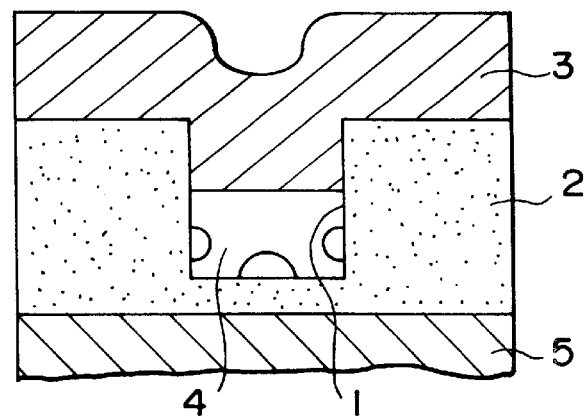

Then, a barrier layer 11 of TiN was deposited in a thickness of 30 nm on the substrate having the via holes and trenches mentioned above. Subsequently, a sample was prepared by deposition a Cu film 8 in a thickness of 600 nm on the above barrier layer 11 by sputtering, and another sample was prepared by deposition a Nb film 51 in a thickness of 30 nm and a Cu film 8 in a thickness of 600 nm by sputtering on the TiN barrier layer 11 mentioned above. The barrier layer 11,the Nb film 51 and the Cu film 8 were continuously formed. By the use of a reduced-pressure heat-treating device constructed as shown in FIG. 3, the samples were subjected to heat-treatment accompanied by an oxidation and reduction reaction, as described in example 2, to embed the Cu film into the trenches and the via holes. Thereafter, the samples were fabricated for line by the CMP to form a via chain, respectively, as shown in FIG. 24F.

The total electrical resistance of each via chain was measured by the four terminal method. The results are shown in Table 14.

TABLE 14

| Oxidizing gas | Kind of gas | O$_2$ 20% - N$_2$ 80% | | |
|---|---|---|---|---|
| | Flow rate (1/min) | 0.11 | | |
| Reducing gas | Kind of gas | H$_2$ 100% | H$_2$ 10% - N2 90% | |
| | Flow rate (1/min) | 0.3 | 0.5 | 1.0 |
| Via chain resistance | Nd contained | ○ | ○ | ○ |
| | Nd not contained | ○ | Δ | Δ |

Separately, samples were prepared by forming a barrier layer of TiN in a thickness of 30 nm on a substrate, superposing a Cu film in a thickness of 600 nm thereon by sputtering, and subjecting the resultant laminate to the same heat treatment in a reducing ambience. These samples were tested for total electrical resistance. The results were compared with those obtained of the aforementioned samples which had been heat-treated in an oxidation and reduction ambience.

In the samples which had undergone the heat treatment in the oxidation and reduction ambience, those containing a Nd film showed rises of line electrical resistance within 5% and some, if not all, of those containing no Nd film showed rises of line electrical resistance exceeding 10%.

In Table 14, the mark ○ stands for a rise of electrical resistance within 5% and the mark Δ for a rise of electrical resistance in the range of from 5 to 10%.

When Ti, Nb, La, Sm, Re, V, Ru, Rh, Os, Ir, and Pt were used in the place of Nd, the same results were obtained as above. Particularly, Nd, La or Sm is desirable, because the absolute value of the change of ΔG of the Gibbs free energy in the oxidation reaction thereof is larger than that of the change of ΔG of the Gibbs free energy in the oxidation reaction of TiN which is typically used as a barrier layer, thereby the oxidation of the barrier layer being significantly repressed.

EXAMPLE 20

Samples were prepared by deposition a barrier layer 11 of TiN in a thickness of 30 nm on the same undercoating film as used in Example 19 and superposing a Cu film 8 thereon in a thickness of 600 nm by sputtering and other samples were prepared by deposition a barrier layer 11 of TiN in a thickness of 30 nm on the same undercoating film and superposing a Nd film 51 in a thickness of 30 nm and a Cu film 8 in a thickness of 600 nm thereon by sputtering (FIG. 23D). In the preparation of these samples, the substrates having the barrier layer and the Nd layer formed thereon were exposed once to the atmosphere.

By the use of the same device as in Example 19, the samples were heat-treated in an ambience maintained by the supply of O$_2$ 20%-N$_2$ 80% at a flow volume of 0.11 liters/min and H$_2$ 10%-N$_2$ 90% at a flow volume of 0.5 liters/min. This heat treatment was carried out at 450° C. for 30 minutes. The heat-treated samples were cooled and visually examined by SEM to determine the shapes of flow.

In the samples, the amounts of embedment in a trench were invariably not less than 110% of the depth of the trench, indicating that the shapes of embedment were satisfactory.

The samples which had undergone the flowing treatment were tested for oxygen content by the SIMS. In the samples having a Nd film interposed between the barrier layer and the Cu film, oxygen was detected in the Nd film and the amounts of oxygen in the TiN film and the Cu film were below detectable limits. In the samples containing no Nd film, oxygen was detected in the TiN film.

When the samples were fabricated by the CMP to form a line, the line consequently produced were found by SEM to have invariably satisfactory shapes. The via chains in the samples were tested for total electrical resistance by the four terminal method.

Samples were prepared by forming a barrier layer of TiN in a thickness of 30 nm on the same substrate as used above and, with the substrate not exposed to the open air, superposing a Cu film thereon in a thickness of 600 nm by sputtering. The samples were subjected to the same heat treatment in the reducing ambience and then tested for total electrical resistance.

The samples which had undergone the heat treatment in the reducing ambience and the samples which had undergone the heat treatment in the oxidation and reduction ambience were tested for total electrical resistance. It was consequently found that rises of electrical resistance were within 5% in the samples containing a Nd film and rises of electrical resistance exceeded 10% in the samples containing no Nd film.

EXAMPLE 21

Samples were prepared by deposition a barrier layer of TiN in a thickness of 30 nm on the same undercoating film as used in Example 19 and a Cu film was superposed thereon in a thickness of 600 nm by sputtering and other samples were prepared by deposition a barrier layer of TiN in a thickness of 30 nm on the same undercoating film and superposing a film of an alloy of Mn with W in a thickness of 30 nm and a Cu film in a thickness of 600 nm thereon by sputtering. The barrier layer, Mn—W alloy film, and Cu film were continuously formed in a vacuum.

By the use of the same device as in Example 19, the samples were heat-treated in an ambience maintained by the supply of O$_2$ 20%-N$_2$ 80% at a flow volume of 0.11 liters/min and H$_2$ 10%-N$_2$ 90% at a flow volume of 0.5 liters/min. This heat treatment was carried out at 450° C. for 30 minutes. The heat-treated samples were cooled and visually examined by SEM to determine the shapes of flow.

In the samples, the amounts of embedment in a trench was invariably not less than 110% of the depth of the trench, indicating that the shapes of embedment were satisfactory.

The samples which had undergone the flowing treatment were tested for oxygen content by the SIMS. In the samples having a Mn—W alloy film interposed between the barrier layer and the Cu film, oxygen was detected in the Mn—W alloy film and the amounts of oxygen in the TiN film and the Cu film were below detectable limits. In the samples containing no Mn—W alloy film, oxygen was detected in the TiN film.

When the samples were fabricated by the CMP to form a line, the lines consequently produced were found by SEM to have invariably satisfactory shapes. The via chains in the samples were tested for total electrical resistance by the four terminal method.

Samples were prepared by deposition a barrier layer of TiN in a thickness of 30 nm on the same substrate as used above and, with the substrate not exposed to the atmosphere, superposing a Cu film thereon in a thickness of 600 nm by sputtering. The samples were subjected to the same heat treatment in the reducing ambience and then tested for total electrical resistance.

The samples which had undergone the heat treatment in the reducing ambience and the samples which had undergone the heat treatment in the oxidation and reduction ambience were tested for total electrical resistance. It was consequently found that rises of electrical resistance were within 5% in the samples containing a Mn—W alloy film and rises of electrical resistance exceeded 10% in the samples containing no Mn—W alloy film.

When a La—Ni alloy, a Pb—Ru alloy, a Bi—Ru alloy, a Tl—Rh alloy, a Ti—Os alloy, a Pb—Os alloy, and a Pb—Ir alloy were used in the place of the Mn—W alloy, the same effects were observed as above.

EXAMPLE 22

Samples were prepared by deposition a barrier layer of TiN in a thickness of 30 nm on the same undercoating film as used in Example 19 and a Cu film was superposed thereon in a thickness of 600 nm by sputtering and other samples were prepared by deposition of a barrier layer of TiN in a thickness of 30 nm on the same undercoating film and superposing a V film in a thickness of 30 nm and a Cu film in a thickness of 600 nm thereon by sputtering. The barrier layer, V film, and Cu film were continuously formed in a vacuum.

By the use of the same device as in Example 19, the samples were heat-treated in an ambience maintained by the supply of $O_2$ 20%-$H_2$ 80% at a flow volume of 0.11 liters/min and $H_2$ 10%-$N_2$ 90% at a flow volume of 0.5 liters/min. This heat treatment was carried out at 450° C. for 30 minutes. The heat-treated samples were cooled and visually examined by SEM to determine the shapes of flow.

In the samples, the amounts of embedment in a trench was invariably not less than 110% of the depth of the trench, indicating that the shapes of embedment were satisfactory.

The samples which had undergone the flowing treatment were tested for oxygen content by the SIMS. In the samples having a V film interposed between the barrier layer and the Cu film, oxygen was detected in the V film and the amounts of oxygen in the TiN film and the Cu film were below detectable limits. In the samples containing no V film, oxygen was detected in the TiN film. In the samples containing the V film, the formation of a compound of $Cu_xVO_y$ in the neighborhood of the boundary between the Cu film and the V film was confirmed.

When the samples were fabricated by the CMP to form a line, the lines consequently produced were found by SEM to have invariably satisfactory shapes. The via chains in the samples were tested for total electrical resistance by the four terminal method.

Samples were prepared by deposition of a barrier layer of TiN in a thickness of 30 nm on the same substrate as used above and, with the substrate not exposed to the atmosphere, superposing a Cu film thereon in a thickness of 600 nm by sputtering. The samples were subjected to the same heat treatment in the reducing ambience and then tested for total electrical resistance.

The samples which had undergone the heat treatment in the reducing ambience and the samples which had undergone the heat treatment in the oxidation and reduction ambience were tested for total electrical resistance. It was consequently found that rises of electrical resistance were within 5% in the samples containing a V film and rises of electrical resistance in the range of from 5 to 10% were found in the samples containing no V film.

It is clearly noted from Examples 19 through 22 that by forming a conductive film of a substance whose oxide constitutes a conductor as an undercoating film for a Cu film, there can be provided a semiconductor device which avoids raising contact resistance and retains high reliability even when the undercoating film is oxidized in a heat treatment carried out in the presence of an oxidizing gas during the formation of a Cu-embedded line by the damascene process utilizing oxidation and reduction.

As described in detail above, the methods for the production of a semiconductor device according to the first through third aspects of this invention substantially permit a marked decrease in the flow temperature and repress the diffusion of Cu, for example, on a semiconducting substrate side and, therefore, allow provision of a semiconductor device which easily and infallibly avoids deterioration of semiconductor characteristics and enjoys high reliability of the embedding line method.

Then, the methods for the production of a semiconductor device according to the fourth aspect of this invention remove part of superposed metal films to preclude persistence of voids as in trenches prior to the formation of an embedded line by the flow of a conductive metal and, therefore, allow production of a highly reliable semiconductor device possessing lines including no voids and hillocks and satisfactory and uniform characteristics.

The methods for the production of a semiconductor device according to the fifth through sixth aspects of this invention can exalt productivity and improve process margin because they allow the formation of films of metals and the embedment of their melts in trenches at relatively low temperatures. Moreover, they permit easy formation of including no voids and hillocks accurately even when the trenches destined to form embedded lines have a high aspect ratio.

What is claimed is:

1. A method for manufacturing a semiconductor device having an electrode line formed on a semiconductor substrate, comprising the steps of:

forming an insulating layer on said semiconductor substrate;

forming at least one of a trench and a contact hole for use in forming a buried electrode line in said insulating layer provided on said semiconductor substrate;

depositing a conductive material comprising Cu on said at least one of said trench and said contact hole to form a conductive film;

heat-treating said conductive film in an atmosphere with a reduced pressure, the atmosphere including at least an oxygen gas as an oxidizing gas to cause an exothermic reaction so that said conductive film flows and fills said at least one of said trench and said contact hole, a partial pressure of the oxygen gas in said atmosphere being in a range of $1\times10^{-7}$ to $5\times10^{-5}$ Torr, which is smaller than an equilibrium partial pressure for oxidation of the conductive film in the process of the heat-treatment; and removing by polishing the part of said conductive film falling outside said at least one of said trench and contact hole to form said buried electrode line, thereby completing the formation of the electrode line.

2. The method according to claim 1, wherein the method further comprises a step of forming a barrier layer on the surface of said at least one of said trench and said contact hole and said insulating layer.

3. The method according to claim 2, wherein the step of depositing the conductive material comprising Cu comprises a substep of depositing a first conductive film of a substance whose oxide manifests electrical conductivity as an undercoating layer on the barrier layer.

4. The method according to claim 3, wherein said first conductive film comprises a substance such that an amount of change in a Gibbs free energy in an oxidation reaction thereof with said oxidizing gas has a negative magnitude and an absolute value thereof is greater than an absolute value of the amount of change in the Gibbs free energy in the oxidation reaction of said barrier layer.

5. The method according to claim 4, wherein said substance forming said first conductive film is at least one member selected from the group consisting of La, Nd, and Sm.

6. A method for manufacturing a semiconductor device having an electrode line formed on a semiconductor substrate, comprising the steps of:

forming an insulating layer on said semiconductor substrate;

forming at least one of a trench and a contact hole for use in forming a buried electrode line in said insulating layer provided on said semiconductor substrate;

depositing a conductive material comprising Cu on said at least one of said trench and said contact hole to form a conductive film;

heat-treating said conductive film in an atmosphere with a reduced pressure, the atmosphere including at least an oxygen gas as an oxidizing gas and a hydrogen gas as a reducing gas to cause an exothermic region so that said conductive film flows and fills said at least one of said trench and said contact hole, wherein a partial pressure ratio $PH_2/PO_2$ is in range of 3 to 15, where $PH_2$ is a partial pressure of $H_2$ and $PO_2$ is a partial pressure of $O_2$ in the atmosphere; and removing by polishing the part of said conductive film falling outside said at least one of said trench and contact hole to form said buried electrode line, thereby completing the formation of the electrode line.

7. The method according to claim 6, wherein the method further comprises a step of forming a barrier layer on the surface of said at least one of said trench and said contact hole and said insulating layer.

8. The method according to claim 7, wherein the step of depositing the conductive material comprising Cu comprises a substep of depositing a first conductive film of a substance whose oxide manifests electrical conductivity as an undercoating layer on the barrier layer.

9. The method according to claim 8, wherein said first conductive film comprises a substance such that an amount of change in a Gibbs free energy in an oxidation reaction thereof with said oxidizing gas has a negative magnitude and an absolute value thereof is greater than an absolute value of the amount of change in the Gibbs free energy in the oxidation reaction of said barrier layer.

10. The method according to claim 9, wherein said substance forming said first conductive film is at least one member selected from the group consisting of La, Nd, and Sm.

11. A method for manufacturing a semiconductor device having an electrode line formed on a semiconductor substrate, comprising the steps of:

forming an insulating layer on said semiconductor substrate;

forming at least one of a trench and a contact hole for use in forming a buried electrode line in said insulating layer provided on said semiconductor substrate;

depositing a conductive material comprising Cu on said at least one of said trench and said contact hole to form a conductive film;

flowing the conductive film to fill said at least one of said trench and said contact hole by heat-treating said conductive film in an atmosphere with a reduced pressure, the atmosphere including at least an oxygen gas as an oxidizing gas and a hydrogen gas as a reducing gas to cause an exothermic reaction, a partial pressure of the oxidizing gas in said atmosphere being smaller than an equilibrium partial pressure for oxidation of the conductive film in the process of the heat-treatment so as to suppress formation of oxide of the conductive film, wherein a partial pressure ratio $PH_2/PO_2$ is in a range of 3 to 15, where $PH_2$ is a partial pressure of $H_2$, and $PO_2$ is a partial pressure of $O_2$ in the atmosphere; and removing by polishing the part of said conductive film falling outside said at least one of said trench and contact hole to form said buried electrode line, thereby completing the formation of the electrode line.

* * * * *

UNITED STATES PATENT AND TRADEMARK OFFICE
CERTIFICATE OF CORRECTION

PATENT NO.   : 6,090,701
DATED        : July 18, 2000
INVENTOR(S)  : Hasunuma et al.

It is certified that error appears in the above-identified patent and that said Letters Patent is hereby corrected as shown below:

Column 53, claim 6,
Line 29, change "exothermic region" to -- exothermic reaction --;
Line 32, change "in range" to -- in a range --; and
Line 33, after "pressure of $H_2$" insert -- , --.

Signed and Sealed this

First Day of January, 2002

Attest:

Attesting Officer

JAMES E. ROGAN
Director of the United States Patent and Trademark Office